United States Patent [19]

Luciani et al.

[11] Patent Number: 5,182,717
[45] Date of Patent: Jan. 26, 1993

[54] DEVICE FOR TESTING A NETWORK OF COMPONENTS, IN PARTICULAR AN ELECTRONIC CIRCUIT

[75] Inventors: Pierre Luciani, Garches; Philippe Deves, Plaisir; Patrick Tallibert, Marly-le-Roi, all of France

[73] Assignee: Dassault Electronique, Saint Cloud, France

[21] Appl. No.: 548,381

[22] Filed: Jul. 5, 1990

[30] Foreign Application Priority Data

Jul. 13, 1989 [FR] France ................. 89 09523
Mar. 2, 1990 [FR] France ................. 90 02677

[51] Int. Cl.⁵ .................. G06F 15/20; G01R 27/00
[52] U.S. Cl. .................. 364/481; 364/482; 324/615
[58] Field of Search .......... 364/481, 482, 483; 324/77 R, 77 A, 77 B, 615, 629, 649, 608, 650

[56] References Cited

U.S. PATENT DOCUMENTS

| | | | |
|---|---|---|---|
| 4,196,475 | 4/1980 | Hall | 364/482 |
| 4,342,089 | 7/1982 | Hall | 364/481 |
| 4,408,157 | 10/1983 | Beaubin | 364/482 |
| 4,647,846 | 3/1987 | Malkin | 324/73 R |
| 4,652,814 | 3/1987 | Groves et al. | 324/73 R |
| 4,672,555 | 6/1987 | Hart et al. | 364/483 |
| 4,796,259 | 1/1989 | Troy | 371/25.1 |
| 4,815,077 | 3/1989 | Boenning | 371/25.1 |

FOREIGN PATENT DOCUMENTS

WO84/02015 5/1984 PCT Int'l Appl.
2088569 12/1981 United Kingdom.

OTHER PUBLICATIONS

"Integration of Test with Design and Manufacturing"; International Test Conference 1987 Proceedings; 1987 IEEE, pp. 586–594 French Search Report.

Primary Examiner—Parshotam S. Lall
Assistant Examiner—Ellis B. Ramirez
Attorney, Agent, or Firm—Christie, Parker & Half

[57] ABSTRACT

Device for testing a network of components, in particular an electronic circuit.

The respective potential differences between the terminals of the circuit to be tested are acquired during a chosen time interval and stored in a values memory. A memory contains predetermined functional models of electronic components. The processing means, connected to these memories, are capable of effecting a processing comprising the estimation, during said time interval, of physical values, notably of current-expressions, taking account of expressions contained in said acquired models and values, and storing them in the values memory as well as tests on the values contained in the values memory.

57 Claims, 44 Drawing Sheets

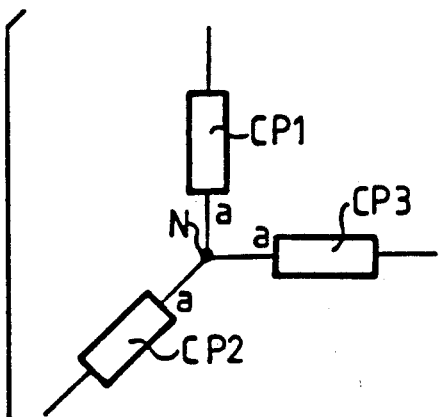
$$I(CP1,a) = -I(CP2,a) - I(CP3,a)$$
$$I(CP2,a) = -I(CP1,a) - I(CP3,a)$$
$$I(CP3,a) = -I(CP1,a) - I(CP2,a)$$
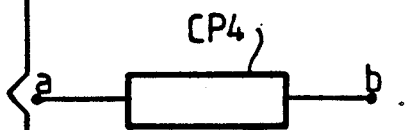
$$V(CP4,a,b) = -V(CP4,b,a)$$
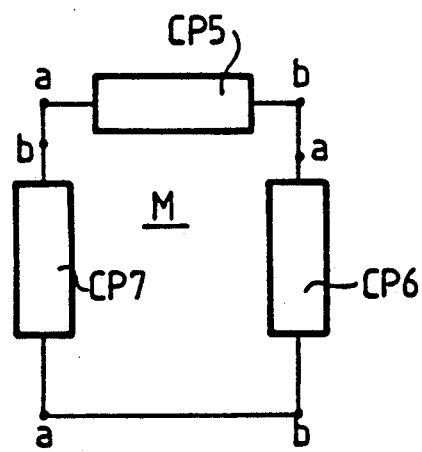
$$V(CP5,a,b) = -V(CP6,a,b) - V(CP7,a,b)$$
$$V(CP6,a,b) = -V(CP5,a,b) - V(CP7,a,b)$$
$$V(CP7,a,b) = -V(CP5,a,b) - V(CP6,a,b)$$
FIG.7

MODQ1

1) model of rank 1 : Ib ≥ 0 ; Ic > 0

MODQ2

2) model of rank 2 :

- if $0{,}6\ Volt \leq Vbe < 1{,}5\ Volt$ and $Vce \leq 0{,}1\ Volt$ then  Q saturated and $0 < \beta < 30$

- if $0{,}6\ Volt \leq Vbc < 1{,}5\ Volt$ and $Vce > 0{,}1\ Volt$ then  Q is conductive $30 < \beta < 300$
    and

- if $Vbc < 0{,}6\ Volt$ and $Vce > 0{,}1\ Volt$ then  Q blocked and Ib = 0

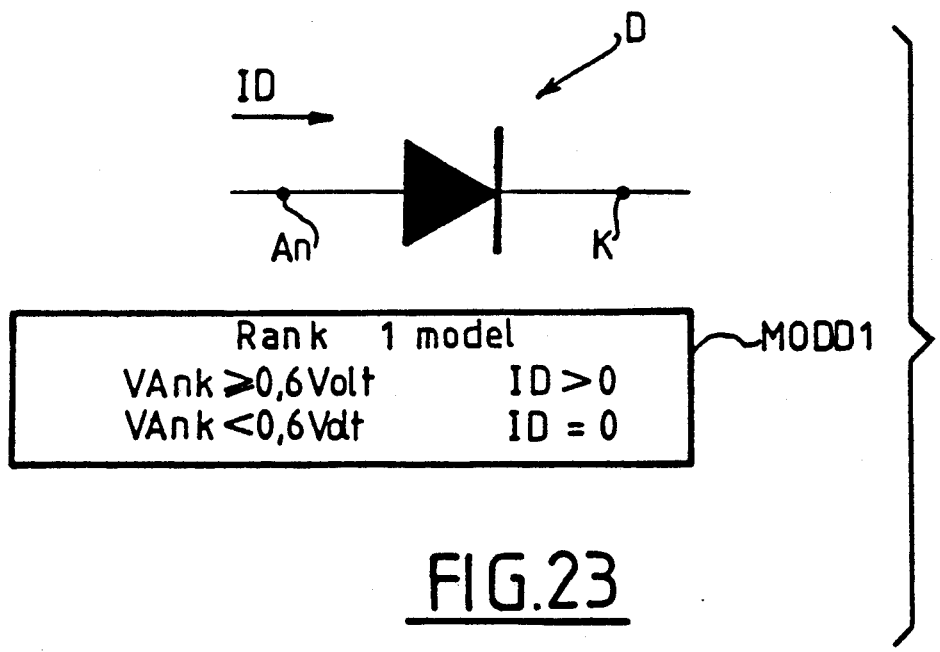
FIG.23
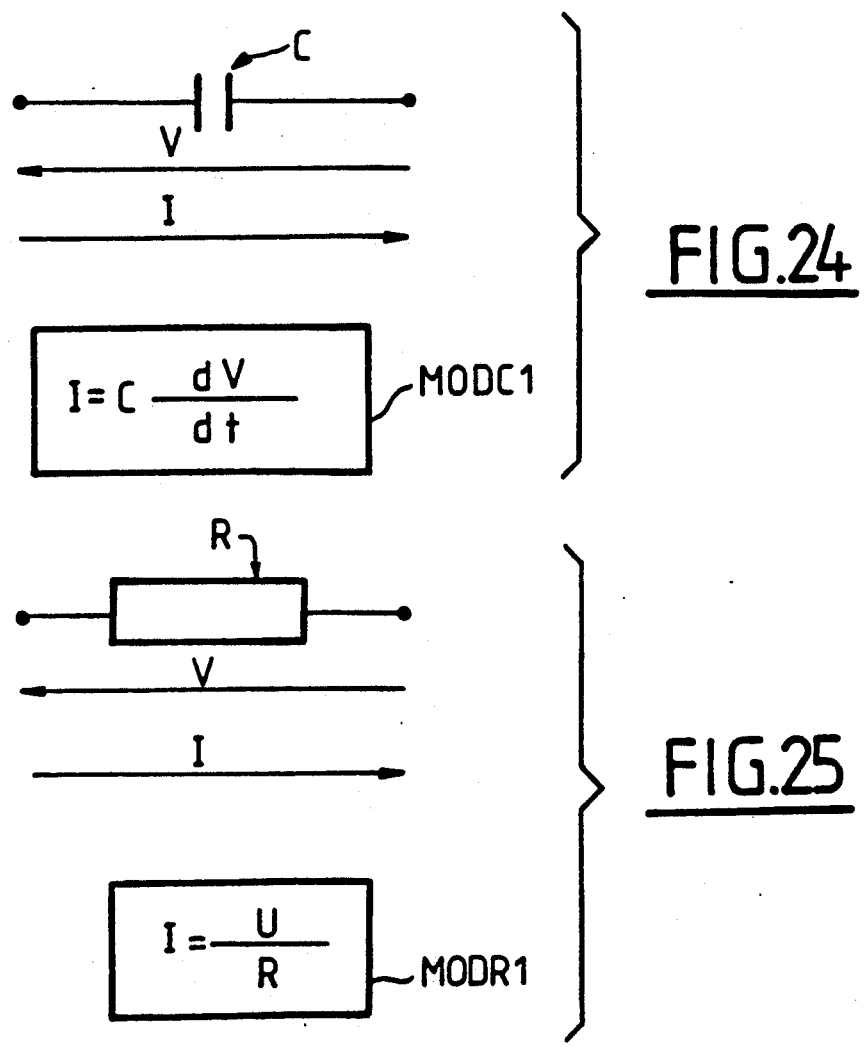
FIG.24
FIG.25

DEVICE FOR TESTING A NETWORK OF COMPONENTS, IN PARTICULAR AN ELECTRONIC CIRCUIT

FIELD OF THE INVENTION

The invention concerns the testing of a network of components, in particular but not exclusively, of an electronic circuit.

Although the invention finds a particularly advantageous application as a diagnostic aid for locating the origin of a malfunction of an electronic circuit, the term "test" is here not restrictively associated with the notion of repairing faults, but it encompasses in particular any control operation effected in a network supposed to be functioning correctly.

PRIOR ART

Diagnosing the origin of a malfunction, and hence locating the faulty component or components of an incorrectly functioning electronic circuit, is an operation that is generally difficult and usually requires qualified operators.

The maintenance staff, faced with the diversity of electronic circuits whereof neither the purpose nor the mode of functioning is always known to them, frequently have only electric circuit diagrams at their disposal, although sometimes may have a maintenance manual with which to carry out this work.

These operators can then execute the measurement operations and calculations "by hand" and can formulate by themselves hypotheses regarding the correct or faulty functioning of certain components with a view to establishing a diagnosis. However, all these operations are generally irksome, delicate, and require considerable time, with a risk of error that may prove to be industrially unacceptable.

One alternative is to use software programs of the type existing in "expert systems". However, such a method presupposes that the investigated malfunction has been foreseen or already noted and has been previously indexed, which is not necessarily the case with all malfunctions. Moreover, some of these software programs require a prior description of the nominal correct functioning of the circuit and this may in certain cases prove to be a constraint. Moreover, such software programs are not always available for all types of circuits, and they are generally difficult to set up and use.

In general, irrespective of the method used, the maintenance operators are always confronted with major problems of interpretation, analysis and relevant use of the measurements and observations that can be carried out.

The article by DEVES et al, "DEDALE: an expert system for troubleshooting analogue circuits" International Test Conference 1987, IEEE Catalogue No. 87CH2437-2, pp. 586-594 describes an expert system capable of testing an electronic circuit. However, such a system does not meet the problem to be solved by the present invention, namely to obtain a test apparatus which is, at one and the same time, simple to operate at an industrially reasonable price and able to provide an effective aid for the maintenance operators in their task of locating a presumed malfunction as quickly and reliably as possible.

OBJECTS OF THE INVENTION

It is an object of the present invention to provide a solution for this problem.

It is a further object of the invention to provide a device automating the calculations and the handling of the hypotheses to assist the maintenance operators in their investigations of malfunctions.

Another object of the invention is to provide a device whose use does not necessarily require a complete description of the network to be tested, nor the description of the nominal functioning of this network.

Another object of the invention is to provide a device whose use does not require any particular knowledge of the modes of functioning of the network to be repaired, or of the symptoms of the malfunction.

Another object of the invention is to allow a diagnosis of analogue malfunctions of a network of components working in a static or dynamic mode.

Still another object of the invention is to offer a high degree of diagnostic reliability without necessitating specific predetermined procedures for locating the malfunction.

The invention also aims at a device which to a large extent, uses commercially available items.

Yet another object of the invention is to propose an electronic test device comprising processing means capable of proposing to the user of the device an effective strategy for acquiring physical values and for estimating other physical values, to arrive with a minimum number of acquisitions at the diagnosis of one or several faulty components.

SUMMARY OF THE INVENTION

According to a general characteristic of the invention, the electronic device for testing a network of components comprises in combination:
  interface means comprising
    means for defining sampling instants in a chosen time interval,
    means for identifying at least one component of the network,
    a probe for the acquisition of a physical value, for example a potential difference, relating to the state of functioning of this component and
    means cooperating with the probe for providing a series of samples of this physical value within the chosen time interval,
  a functional model memory comprising component expressions relating to physical values concerning at least one particular kind of component,
  a values memory capable of storing several sample series of physical values corresponding to the same time interval but relating to different components of the network, and
  processing means connected to these memories and to the interface means capable of effecting a processing procedure comprising an estimation over the said time interval of the physical values, for example the values of the current, taking into account the expressions contained in the said models and the acquired samples and their storage in the values memory, as well as tests on the values contained in the values memory.

It is particularly advantageous for such a test device to allow the details of the acquisition of the various physical values within the network to be taken into account, as well as the uncertainties relating in particular to the functional characteristics of the components.

Thus, in one embodiment of the invention, provision is made for
- the functional models to comprise, moreover, the law-expressions representing general relationships between physical values,
- at least some of the samples acquired to be stored in memory with precision brackets,
- the functional models to be provided at least in part with uncertainty brackets,
- any estimation to be stored in memory with its estimated uncertainty bracket deriving from at least some of the said uncertainty brackets and the said precision brackets,
- when the memory contains over at least some of the sampling instants, a first and a second bracket of different origins for the same physical value established on the basis of the contribution of a primary set of components, so these two brackets can be compared, in order to deduce therefrom first information regarding the functioning of the components of this primary set.

As detailed below, a principle of the test according to the invention lies in the fact that when the said first and second brackets are disjoint for at least a significant fraction of the time interval, this first information represents an incorrect functioning of at least one component of the said primary set of components which have contributed to the establishment of these two brackets.

The two compared brackets can be a precision bracket and an estimated uncertainty bracket or two estimated uncertainty brackets or a precision bracket and a reference bracket taken from a component model, or yet again, an estimated uncertainty bracket and a reference bracket.

Thus, to achieve a fast identification of a faulty component, the processing advantageously comprises the operation of a decision making mechanism connected to the structure of the network and comprising:
- a first mechanism relating to the determination of the choice and order of the components, in respect of which the various physical values will be acquired and,
- a second mechanism relating to the estimations of the physical values.

In another embodiment, wherein the network of components is an electronic circuit, the probe is capable of acquiring a potential difference between two chosen terminals of the circuit, the identification means identifying at least one component connected between the said terminals; the values memory is then capable of storing several potential differences corresponding to the same time interval taken between a first common terminal and different terminals adjoining it; the processing comprises, as regards each potential difference, the estimation of an expression for the current taken from the functional model of the component concerned over said time interval. The processing means are then capable of testing a condition over the set of expressions for the current and at each instant of said time interval, which condition takes into account the presumed zero value of the total current at the said first common terminal, this test giving a first indication of the functioning of the components connected to the said first common terminal.

BRIEF DESCRIPTION OF THE DRAWINGS

Other advantages and characteristics of the invention will emerge on examining the detailed description given below and also the attached drawings, in which:

FIGS. 3 to 7 illustrate different functional models;

FIGS. 22 to 25 illustrate functional models of the components of the circuit of FIG. 20;

DETAILED DESCRIPTION OF THE PREFERRED EMBODIMENT

The drawings mainly comprise elements of a definite nature. On this basis, they form an integral part of the description and may be used, not only to render the detailed description given below more readily understood, but also to contribute to the definition of the invention, if required.

Figure 1:
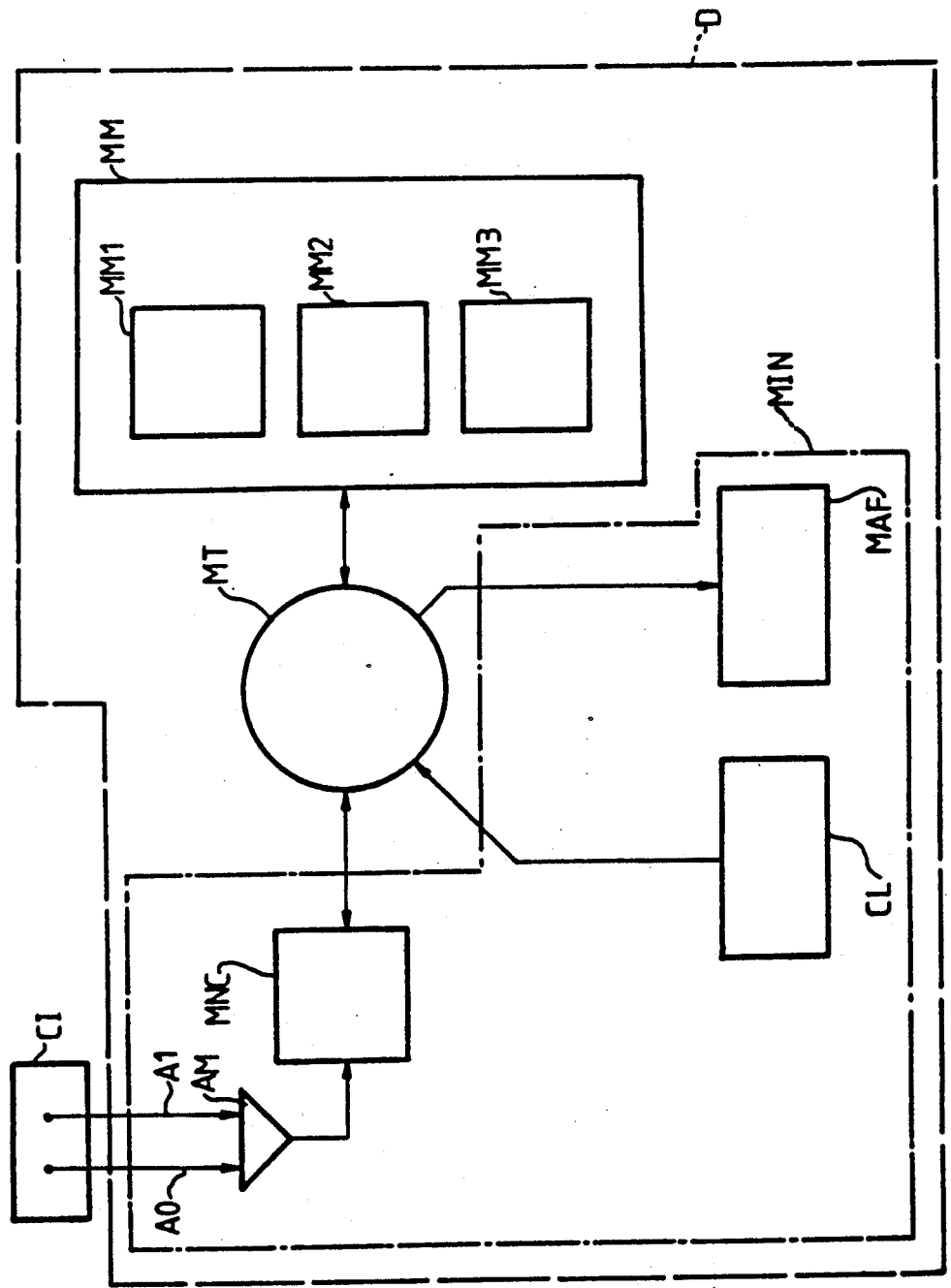
FIG. 1 is a block diagram of a device according to the invention.

The device illustrated in FIG. 1 comprises processing means MT connected to a memory MM as well as to interface means MIN for liaison with on the one hand the network of components CI to be repaired and on the other hand with the user.

The interface for the user is formed by means of a keyboard CL and display means such as a screen MAF. In particular the keyboard makes it possible, unless the structure of the network has already been memorized, to identify at least one component of the network and also to determine the sampling instants in a chosen time interval.

In particular, the screen makes it possible to display the faulty component or components revealed by the device during the test.

The interface with the network of components is provided by probe means (more simply a probe) capable of acquiring a physical value of a chosen type relating to the functional condition of a component, as well by means AM, MNC cooperating with this probe for providing a series of samples of this physical value within the chosen time interval. When the acquired physical value is a potential difference, this probe also generally comprises separate probes A0 and A1 connected to the actuable means MNC for digitizing the measurements effected via the analogue amplifier AM.

The memory of the device can be functionally broken down into:
- a functional models memory MM2, comprising component expressions referring to physical values relating to at least one particular kind of component, as well as law expressions representing the general relations between physical values,
- a values memory MM1 capable of storing several series of samples corresponding to the same time interval but relating to different components of the network,
- if required, a memory capable of storing the configuration of the network of components, and
- a memory MM3 storing in particular the working algorithm of the device as well as various other data or instructions relating to its use.

As for the hardware, a single memory may combine the set of these functional memories or separate memories may be assigned to at least some of them.

Figure 2:
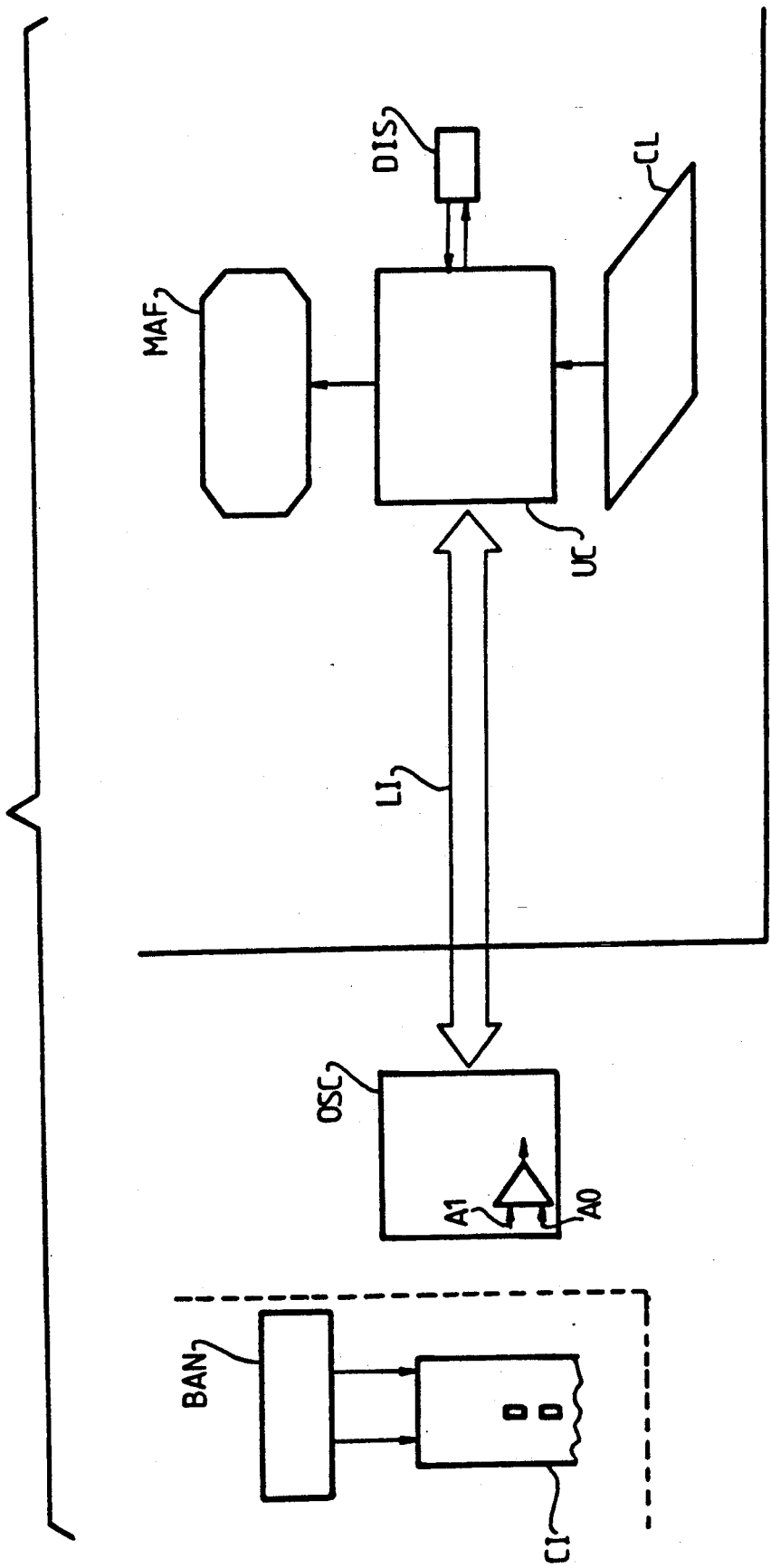
FIG. 2 schematically represents one particular embodiment of a device according to the invention.
Figure 3:
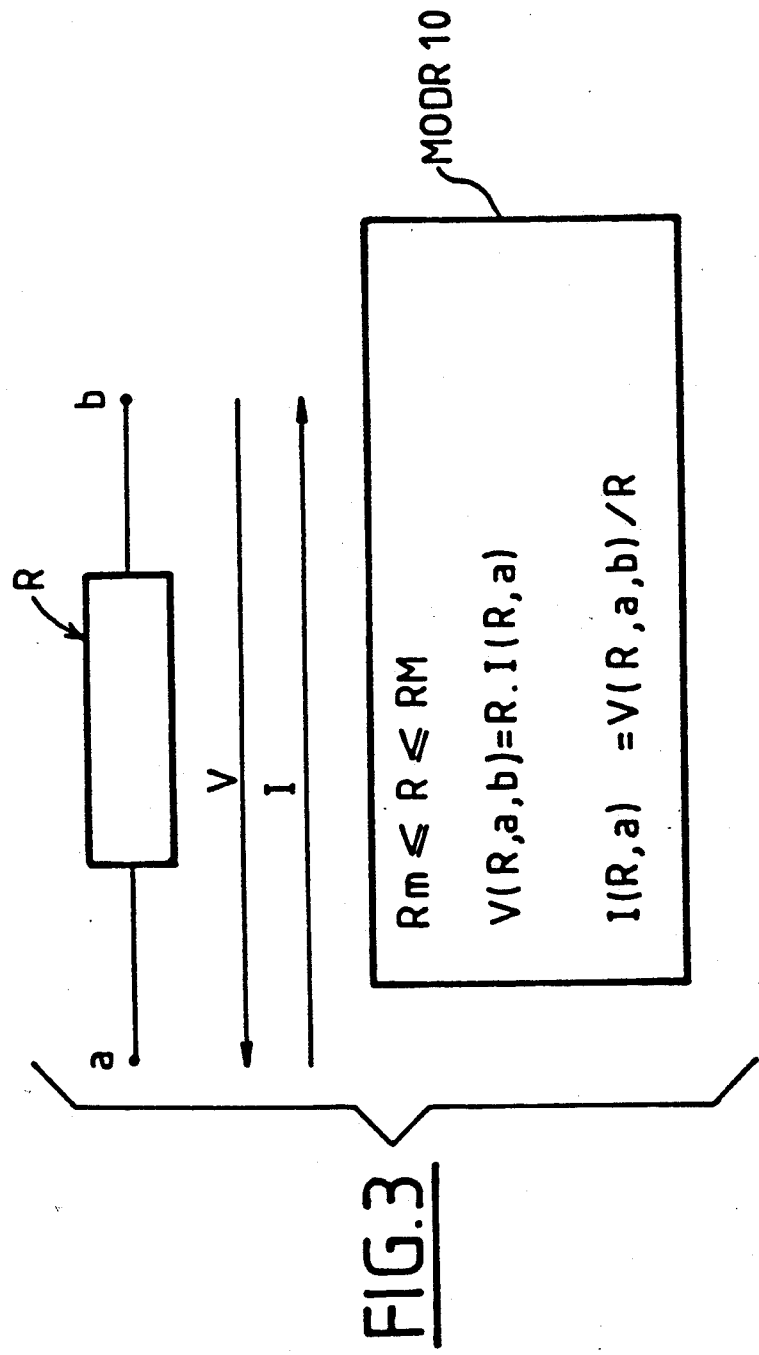
Figure 4:
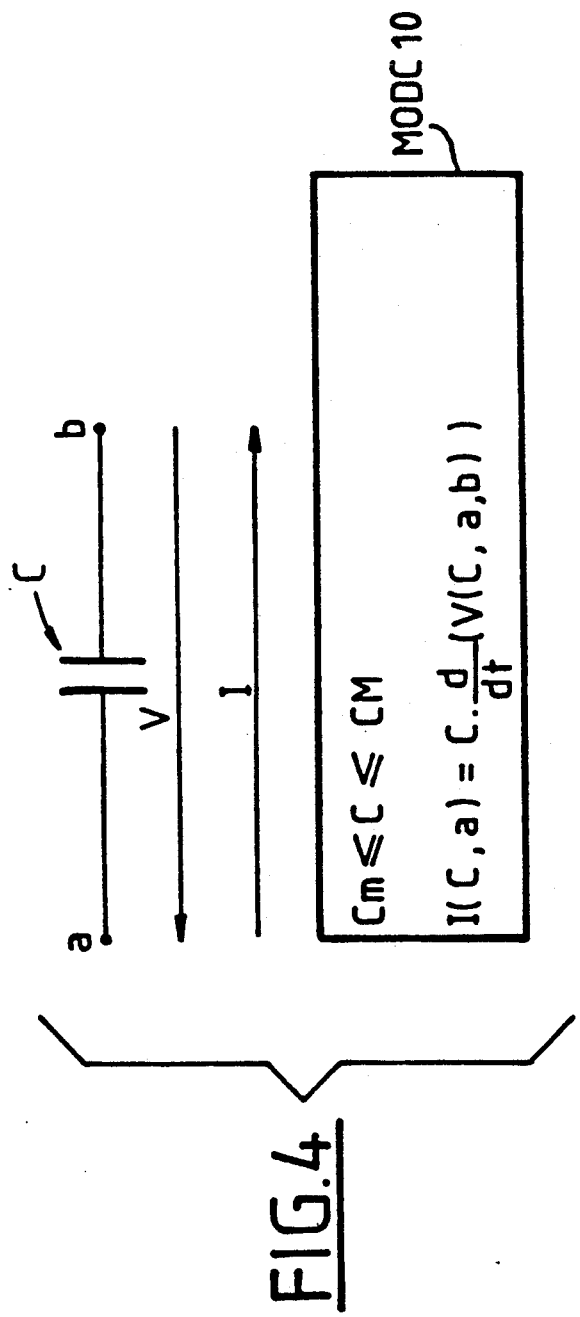
Figure 5:
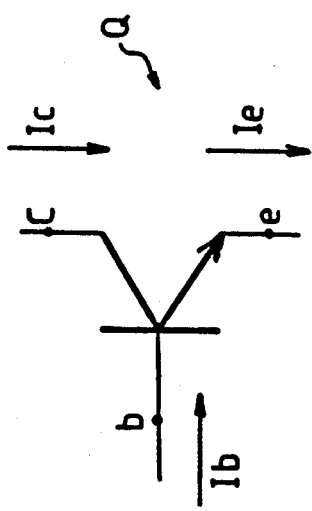
Figure 6:
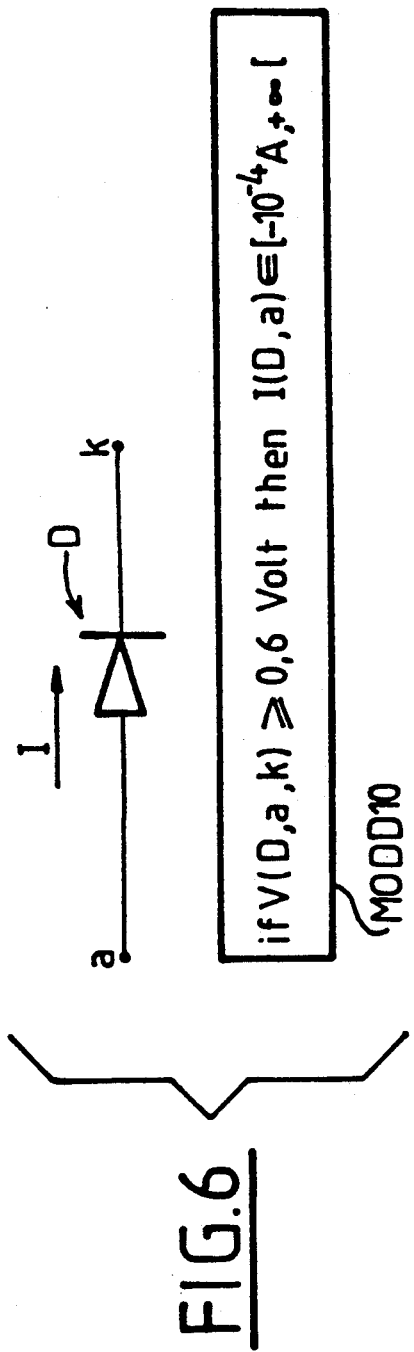

In practice, as illustrated in FIG. 2, in the case of an electronic application scheduled for approximately a hundred electronic components, the processing means of the device may be accommodated within a conventional UC microcomputer associated with a keyboard and an alphanumeric screen. It is then advantageous for this microcomputer to have a mass memory such as a DIS disc, with a capacity of 1.44 Megaoctets containing in particular the working algorithm of the device as well as the various models and a central working memory of approximately 4 Megaoctets.

A separate numerical oscilloscope OSC may incorporate the probe used in this case for acquiring a potential difference between two terminals of the network, and it may be used to define the chosen time interval and the sampling instants and to supply the series of samples of the acquired physical value to the central unit of the device, for example via a digital bus LI.

In this configuration, the circuit CI to be repaired is joined to a test stand BAN capable of activating its primary inputs so as to cause it to operate in a particular situation wherein the malfunction becomes apparent. However, it may be envisaged for the activation of this circuit to be provided directly by the device in accordance with the invention.

In general, the processing means connected to these memories and to the interface means are capable of effecting a processing action comprising:
- the estimation of the physical values over the chosen time interval, taking account of the expressions contained in the memory of the models and of the acquired samples, and
- their storage in the values memory as well as tests on the values contained in this values memory.

In the practical example set out, the central working memory incorporates this values memory.

In one embodiment of the invention, the device allows the precision of the probe to be taken into account, as well as the uncertainties regarding the characteristics of the various components.

Thus at least some, and in practice all, of the acquired samples are stored in the memory with precision brackets. This information may be inputted to the device by the user or it may be directly and automatically incorporated, taking into account the probe characteristics. In concrete terms, if the chosen time interval ranges from 0 to 40 microseconds, by being sampled in 400 sampling instants interspaced by 0.1 microseconds, and if from the instant 0 to the instant of 0.2 microseconds, the probe picks up a potential difference V of 4 volts, then the first two acquired samples relating to this potential difference will be assigned the precision bracket (Vm; VM)=(3.99; 4.01). Similarly, the functional models are, at least partly, assigned uncertainty brackets.

Thus, FIGS. 3 to 6 illustrate models relating to four particular kinds of component. These models include component-expressions referring to physical values relating to the particular and corresponding kind of component and preferably relating to a correct functioning of these components.

Thus for a resistor (FIG. 3), the model MODR10 takes into account an uncertainty bracket (Rm; RM) relating to the value R of this resistor. This model also defines the relation existing between the potential difference V(R, a,b) picked up between the terminals a and b of this resistor and the current I(R,a) entering the terminal a of this resistor (Ohm's law). The functional model also defines the inverse relation, making it possible to obtain the current at the terminal a on the basis of the potential difference picked up between the terminals a and b.

To the extent that the potential difference is an acquired physical value, the measurement of the current I here appears as a physical value estimated on the basis of the model of this resistor. Of course, one could have stipulated a direct collection of the current at the terminal a, which would have led to an estimated potential difference V.

Given that the potential difference V is stored in the memory with a precision bracket and that the value of the resistance is assigned an uncertainty bracket (Rm; RM), there follows therefrom an estimated uncertainty bracket (Im; IM) for the current I.

In general, for any estimated value, the corresponding estimated uncertainty bracket is determined for the most unfavourable case. In other words, an attempt will be made to obtain the greatest estimated uncertainty bracket from the brackets associated with the physical values used in the formulation allowing the estimated value to be determined.

In concrete terms, in the present case the value Im is obtained by the ratio of Vm/RM and the value of IN is obtained by the ratio of VM/Rm.

However, in general, in order to avoid an undue expansion of the estimated uncertainty brackets for an estimated physical value obtained from a formulation relying on a plurality of different physical values, said formulation is arranged so as to mention each different physical value only once.

As regards the model MODC10 of a capacitor C (FIG. 4), the value of the latter is assigned an uncertainty bracket (Cm; CM) and the current I at its terminal a is estimated on the basis of the value C and of the time derivative of the potential difference picked up between the terminals a and b.

Some component models may include reference brackets referring to particular physical values relating to these components. This applies for example to diodes and transistors.

As regards a transistor Q (FIG. 5), it is possible to provide functional models of different complexities. Thus a first simple model MODQ10 termed rank 1, provides for the collector current to be positive whilst the emitted current should be negative, with the sign conventions of this Figure, subject to the comment that one is here concerned with an NPN transistor. The positivity condition of these currents is reflected in their belonging respectively to reference brackets defined by the interval $[-10^{-4}A, +\infty[$ where the symbol designates $+$infinity whilst the reference bracket relating to the negativity of the current is $]-\infty, +10^{-4}A]$.

The sub-intervals $[-10^{-4}A, 0]$ and $[0, 10^{-4}A]$ of the respective intervals $[-10^{-4}A, +\infty$ [and] $-\infty, +10^{-4}A]$ have the function of taking the stray capacitances of the transistor into account without necessitating more complex functional models.

Another simple model may make provision for the base-emitter voltage V(T,b,e) of the transistor to be less than a chosen limit, for example 3 volts. Such a model is particularly advantageous since it makes it possible if required, as explained in greater detail below, to compare this uncertainty bracket with the precision bracket of the acquired potential difference V(T,b,e) to deduce directly therefrom information relating to the transistor.

It is also possible to make provision for a model MODQ20 of greater complexity, termed rank 2. Such a model can for example interpret that a transistor "is only a current amplifier with a known beta gain when it is conducting". This is then reflected by the mathematical conditions defined in FIG. 5 in an uncertainty bracket (BETAm, BETAM) regarding the value BETA of the current gain.

As regards a diode D, (FIG. 6), a simple functional model MODD10 also shows that when the potential difference between the anode a and the cathode k of the diode is greater than or equal to 0.6 volts, while the current I in the anode should be comprised within the reference bracket $[-10^{-4}A; +\infty[$, again conveying that this current must be positive.

Apart from the component-expressions, the models memory also comprises law-expressions representing the general relationships between physical values.

Thus, as illustrated in FIG. 7 in the case of an electronic application, these expressions make it possible by using a rule which takes into account the zero value of the total current at a nodal point N of an electronic circuit, to estimate the value I(CP1,a) of the current at the terminal a of a component CP1 connected to this nodal point on the basis of the known values I(CP2,a) and I(CP3,a) of the currents at other terminals a of other components CP2 and CP3, connected to this nodal point.

Similarly, another law-expression uses a rule reflecting the fact that the potential difference V(CP4,a,b) taken between the terminals a and b of a component CP4 is equal to the opposite V(CP4,b,a) of the potential difference taken between the terminals b and a of this same component.

Finally, the rule stating that the sum of the long potential differences of a grid M is zero makes it possible to estimate the potential difference V(CP5,a,b) at the terminals of a component CP5 of this grid by knowing the other potential differences V(CP6,a,b) and V(CP7a,b) at the terminals of the other components CP6 and CP7 of this same grid.

At this stage of the description, an important notion of an invention should be set out in detail, which lies in the definition of the time interval IT chosen for the acquisition of the various physical values, here the potential differences.

It is necessary for the acquisitions of the various physical values to be effected during the same time interval within which the malfunction of the circuit becomes apparent.

The definition of this time interval IT involves in particular the definition of a starting time of the acquisition as well as of the duration of this acquisition.

For circuits having a static operating mode, the potential differences for example, are steady with respect to time. The various acquisitions can therefore be obtained at any instant and the notion of the duration of the acquisition is preponderant before that of the starting date (time) of the acquisition.

The same applies to circuits with a dynamic operating mode that are examined in the frequency field. Indeed, the amplitudes and phases of the various signals are then steady with respect to time for a given frequency. The various acquisitions of the potential differences can then also be obtained at any instant.

On the other hand, as for circuits with a dynamic operating mode that are examined in the temporal field, it is necessary for the waveforms of the potential differences at the terminals of the components to be reproducible with respect to time. Thus for example, if one of the components has a transient period (in particular when a voltage is applied), it is necessary for the acquisitions of the various potential differences of the other components to be obtained when this component has its transient period. Thus in this particular case, the circuit to be repaired will be placed out of operation between each acquisition. The starting time of the time interval will then be the starting time when the voltage is applied. The expert will therefore note that in this case, the notion of the starting time is preponderant on the same basis as the notion of duration.

It should also be observed that the acquisition over a chosen time interval, and not only at a precise instant allows analogue malfunctions of electronic circuits to be detected both in the static and dynamic operating modes, which could not be done "by hand" by a user because of the number of operations and the diversity of the signal shapes over the whole chosen time interval.

It is also necessary to define the notion of an observable terminal, particularly in the case of an electronic circuit. Such a terminal is presented as being the one in respect of which all components connected thereto are accessible for the acquisition of the physical values, for example, potential differences. For example, in the case of a single layer printed circuit all the terminals of the circuit are observable. On the other hand, in the case of multilayer circuits, it will be readily appreciated that the interlayer connections cannot be physically accessible to the probes. Such probes, therefore, are not observable. This consideration therefore leads to the following observation. Within the meaning of the present description, the notion of a component is not restricted to that usually attributed to for example a resistor or a transistor, but can also designate a nodal point or a circuit connection inaccessible to the probes.

Figure 8:
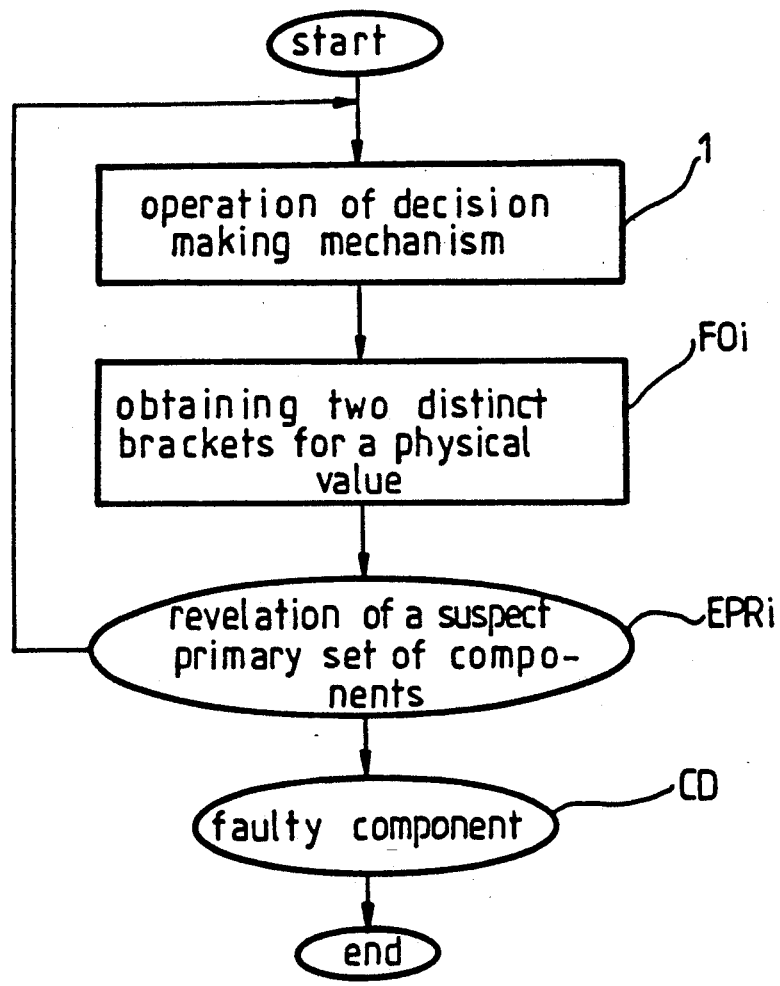
FIG. 8 is a schematic flowchart of a device according to the invention.
Figure 9:
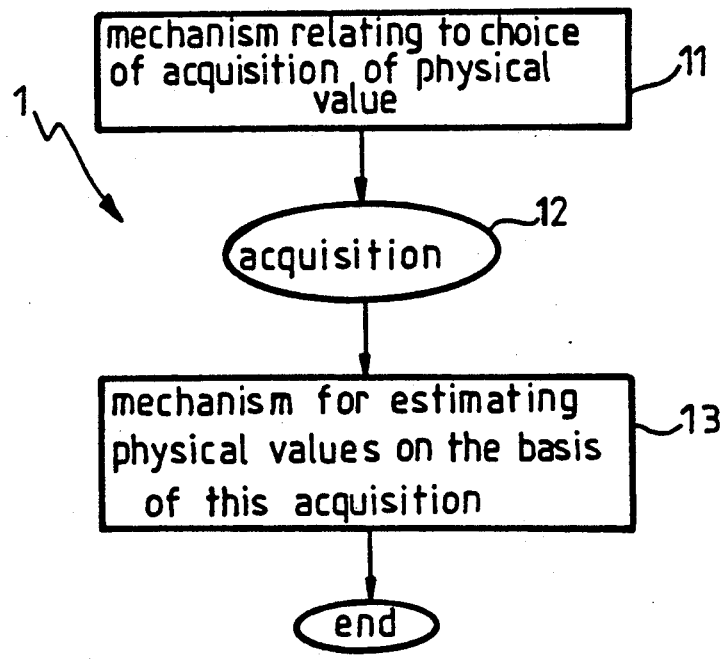
FIG. 9 is a schematic working flowchart of a part of the flowchart of FIG. 8.

Although, as will be seen below, the user can use the device in accordance with the invention manually in that he can decide himself the component level at which the physical values should be obtained, the invention provides assistance for the user as regards the acquisition strategy of the various physical values with a view to arriving as quickly as possible at the localization of the faulty component. This assistance takes the form of operating an automatic decision making mechanism 1 comprising a first mechanism 11 referring to the determination of the choice and order of the components in respect of which the various physical values will be acquired, as well as a second mechanism 12 referring to the estimations of the physical values (FIGS. 8 and 9). The operation of this automatic decision making mechanism connected to the structure of the network makes it necessary for the knowledge of the configuration of the latter to be available in the configuration memory.

In general, after the acquisition of a physical value relating to an indicated component, for example the screen, by the first mechanism 12 of the automated system, the estimating mechanism 13 allows a physical value to be estimated which may be:

either a physical value of a kind different from that already acquired for the corresponding component, or the physical value already acquired for this component, for example from other physical values acquired for other components and/or from other estimated physical values.

To effect this estimation, the processing means use the data contained in the values memory. Thus an estimated value of a kind different from that of an acquired value may be determined on the basis of the acquired sample and a functional model, or by means of estimated uncertainty brackets already present in the values memory and relating to other estimated values. The estimation of a physical value which has incidentally been already acquired may also be derived from a combination of other estimated physical values themselves resulting at the origin of another acquired physical value.

More particularly, when the network of components comprises a plurality of grids, as may be the case, for example, in an electronic circuit, the estimating mechanism comprises:

* for a component of a grid having given rise to the acquisition of a physical value of a chosen kind, for example a potential difference, an estimation of at least one physical value of a kind different from that of the chosen kind, for example a current value obtained from a functional model of said component and from samples of said acquired physical value, and

* for a component that has not given rise to an acquired physical value of a chosen kind and belonging to said grid or directly connected to a component of said grid, an estimation of at least one physical value of the same kind as the kind chosen, for example a potential difference, or of a different kind, for example a current value obtained on the basis of the values already stored in the values memory and associated with at least one component of said grid.

In concrete terms, and still in the case of an electronic circuit, the estimation processing comprises:

* for at least some of the components of the circuit, on the basis of the acquisition of a potential difference between a first and a second terminal of one of these components, the estimations of the current at each of the two terminals and, moreover (if required) the estimation of the potential difference between the second and first terminals of this component,

* for a component appertaining to a grid whose potential differences at the terminals of the other components of this grid are known, and have not given rise to an acquisition of the potential difference at its terminals, the estimation of this potential difference on the basis of the other potential differences relating to the other components,

* for a component one terminal of which is connected to a circuit node to which there are also connected the respective terminals of other components for which the respective currents in these terminals are known, the estimation of the current at the terminal of said component.

The expert will therefore observe that after this automatic decision making mechanism 1 has been put into operation, the physical values that formed the object of an acquisition and/or estimation are assigned precision brackets and/or estimated uncertainty brackets. Thus it is a general principle of the device in accordance with the invention that when the values memory contains for at least some of the sampling instants a first and a second bracket of different origins for the same physical value, the comparison of these two brackets are compared to deduce therefrom first information on the functioning of the set of components that have contributed to the establishment of these two brackets. The set of these components will be referred to below under the designation of "primary set" EPRi.

The first bracket may be for example an uncertainty bracket obtained for example:

by means of a precision bracket relating to an acquired physical value associated with a first component, from a functional model of this first component, and from an estimated uncertainty bracket associated with an estimated physical value relating to a second component.

These first and second components then form a first group having contributed to establishing this first bracket.

The second bracket may also be an estimated uncertainty bracket for the same physical value as that relating to the first bracket but obtained in a different way from a second group of components.

The first set of components, having contributed to establishing these two brackets, is then formed by the combination of the first and second component groups.

Other cases may occur.

Thus, the two brackets of different origins may be a precision bracket and an estimated uncertainty bracket, or an estimated uncertainty bracket and a reference bracket contained in a functional model contained in a functional model of a component, or a precision bracket and a reference bracket.

When these first and second brackets are disjoint over at least a significant fraction of the time interval, then this first primary set of components EPRi is suspect in the sense that it contains at least one incorrectly functioning component. One may then refer to "conflict".

The immediate acquisition of a suspect primary set of components reduced to a single component, hence to the faulty component CD, is very unlikely. Thus, it is necessary to repeat the process so as to obtain at least one other different suspect primary set having led to the acquisition of two disjoint brackets, the observation being made that these two other disjoint brackets may, or may not relate to the same physical value as the two preceding disjoint brackets. Then, the component or components suspected of incorrect functioning belong to the intersection of two primary sets.

The process is therefore carried out until at least two primary sets are obtained whose intersection comprises a single component, and it will be stopped at this stage on the hypothesis of a single malfunction.

Figure 10:
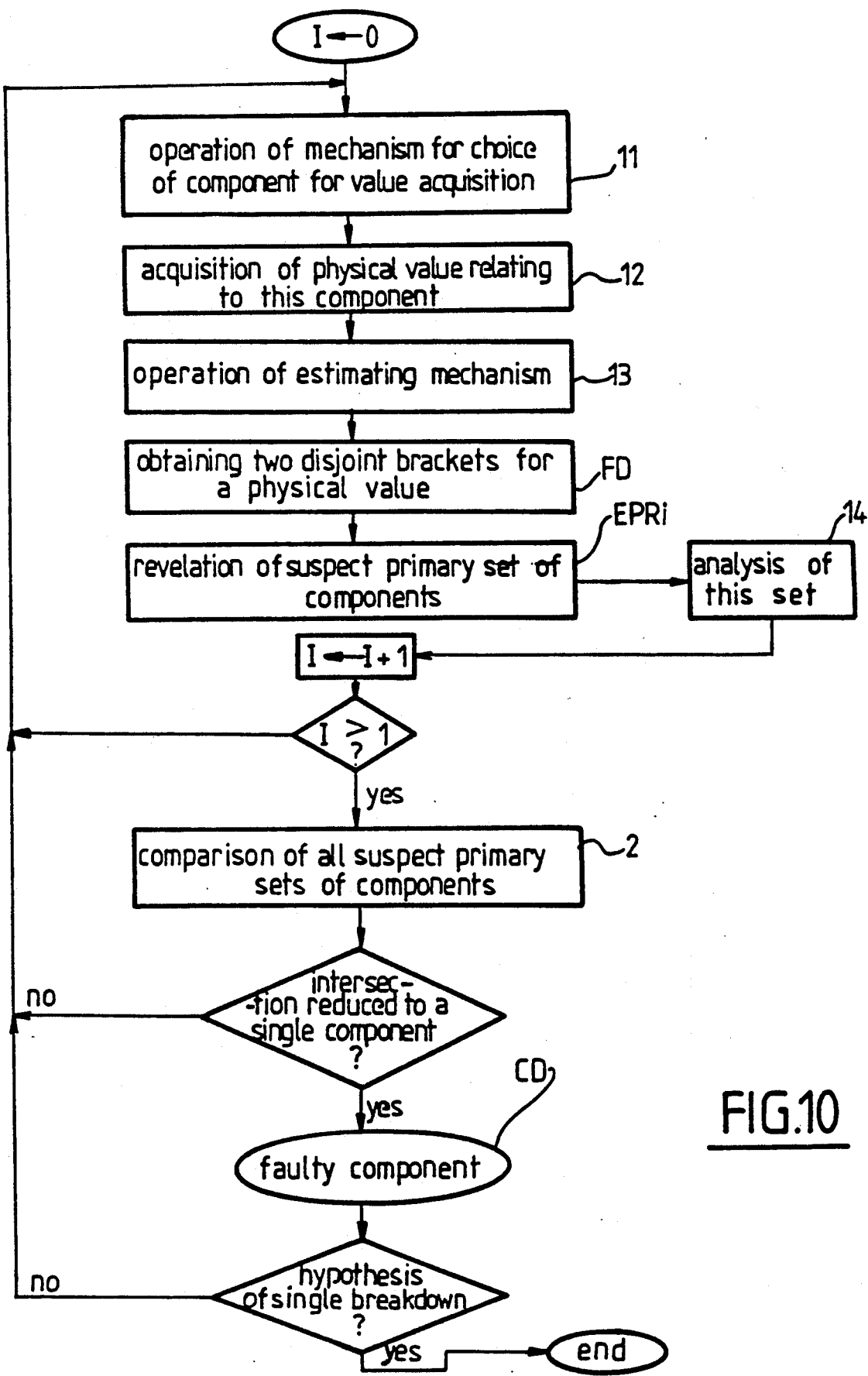
FIG. 10 illustrates the flowchart of FIG. 8 in greater detail.

This operating algorithm is summed up in greater detail in FIG. 10 and shows an additional analysis stage 14 of the suspect primary set of components, comprising, when this set of primary components fulfills a predetermined condition, a selective acquisition of physical values relating to some components of this primary set. This analysis will be discussed in greater detail below.

As set out above, the information deduced from the comparison of the two brackets represents an incorrect functioning of at least one component of the primary set when these two brackets are disjoint over a significant fraction of the time interval. A fraction is significant when it comprises a predetermined number of successive sampling instants, for example a number greater than or equal to two. Such a precaution aims to prevent the diagnosis of illicit conflicts, in particular, when the estimated uncertainty brackets are the results of time derivative calculations. Indeed, it should be observed that since the functions to be derived are not known beforehand —and this all the less since the considered network of components is subject to malfunction— there is a risk that the value of the derivative will be incorrectly estimated, and will therefore generate an illicit conflict. On the other hand, a real conflict will generally only become apparent during several successive sampling instants. Of course, if, for example in a first definition of the time interval, the significant fraction is reduced to a single sampling instant, then since the means for defining the time interval are controllable the user will still be able to modify the time definition of the interval into sampling instants that are closer to each other so as to possibly show the conflict over several successive sampling instants, then revealing a real significant fraction.

When the first and second brackets of different origins present for the same physical value an intersection bracket that is not empty, this intersection bracket is assigned on a priority basis to the said physical value. In other words, obtaining these two non-disjoint brackets does not reveal a suspect primary set of components and makes it possible at the very most to affirm that the hypotheses that have led to the establishment of these two brackets are consistent. The processing means, by assigning the intersection bracket to the physical value will possibly be able to compare subsequently this intersection bracket with another bracket of a different origin obtained for this physical value from another group of components to reveal possibly another conflict. Besides, if necessary, the estimation mechanism may continue on the basis of this intersection bracket.

Figure 11:
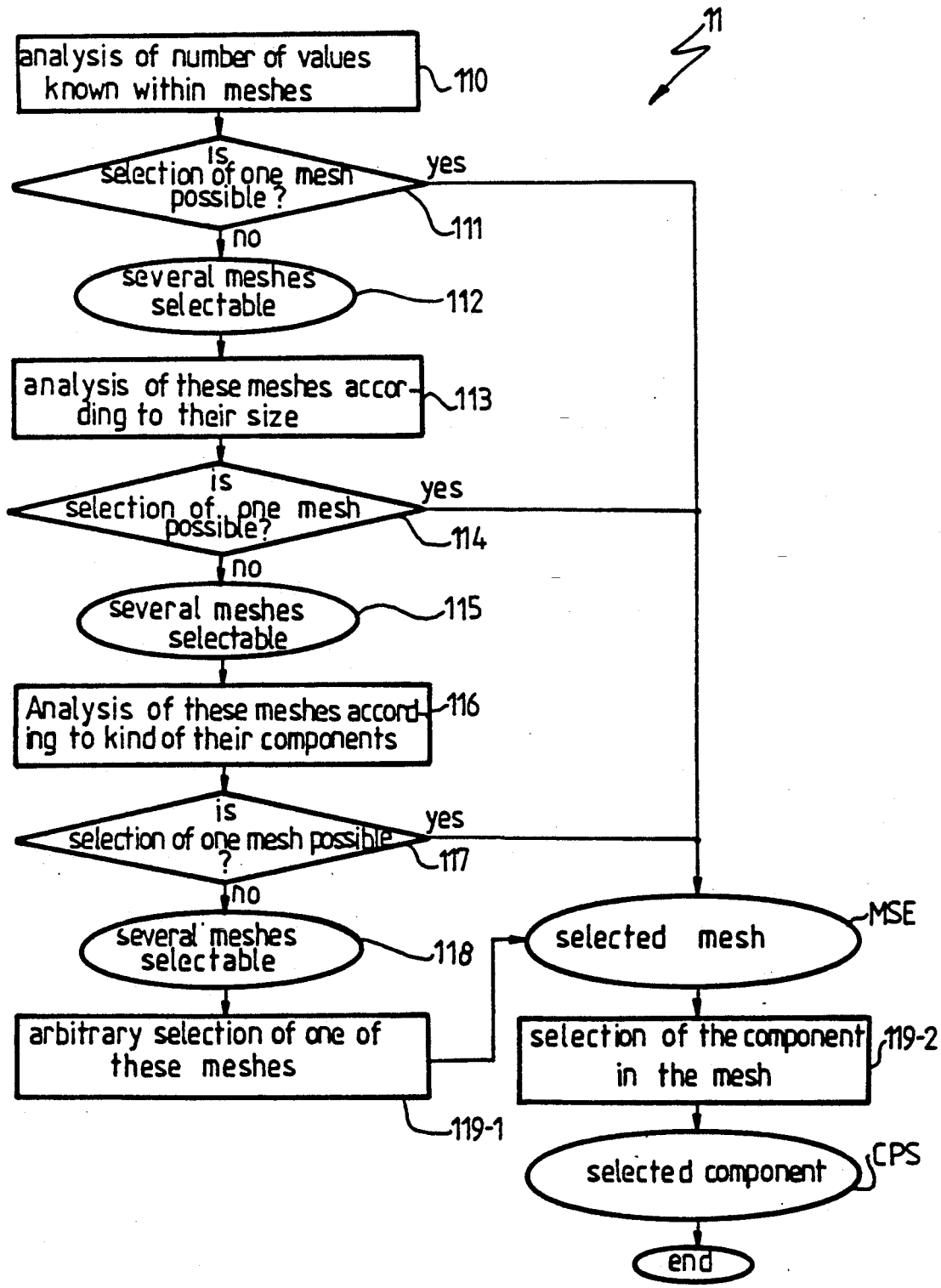
FIGS. 11 to 13 illustrate parts of the flowchart of FIG. 10 in greater detail.

FIG. 11 illustrates in greater detail the mechanism of the choice and order of the components in respect of which the physical values will be acquired. It is here assumed that the network of components comprises a plurality of grids.

This first mechanism comprises first of all a decision making criterion relating to the selection of a grid within which at least one physical value of a chosen kind will be acquired. This first criterion includes a first subcriterion 110 relating to the analysis of the number of physical values, for example potential differences that are already known (that is to say, acquired or estimated) within each grid.

In the case of a possible selection 111 of at least two grids according to the first subcriterion, provision is made for a second subcriterion 113 relating to the number of components of each selectable grid 112. According to this second subcriterion, the processing means will preferentially select a grid according to its number components taken in the order of 3, 4, 2.

In the case of a possible selection of at least two grids according to the second subcriterion (step 114) provision is made for a third subcriterion 116 relating to the kind of components of these selectable grids 115.

Thus, in the case of an electronic circuit, the grid selected according to the third subcriterion is the one having the greatest number of passive components (resistor, capacitor, inductor and other passive multipoles).

If several grids are still selectable by the third subcriterion (117, 118), an arbitrary selection of one of these grids is proceeded with (step 119-1) so as to obtain the grid selection MSE.

Once this selected grid MSE has been obtained, the first mechanism comprises a second decision making criterion 119-2 relating to the kind of component of this grid. Thus in the case of a electronic circuit, the acquisition of a potential difference will be preferentially effected at the terminals of a passive component and again preferentially at the terminals of a dipole.

Figure 12:
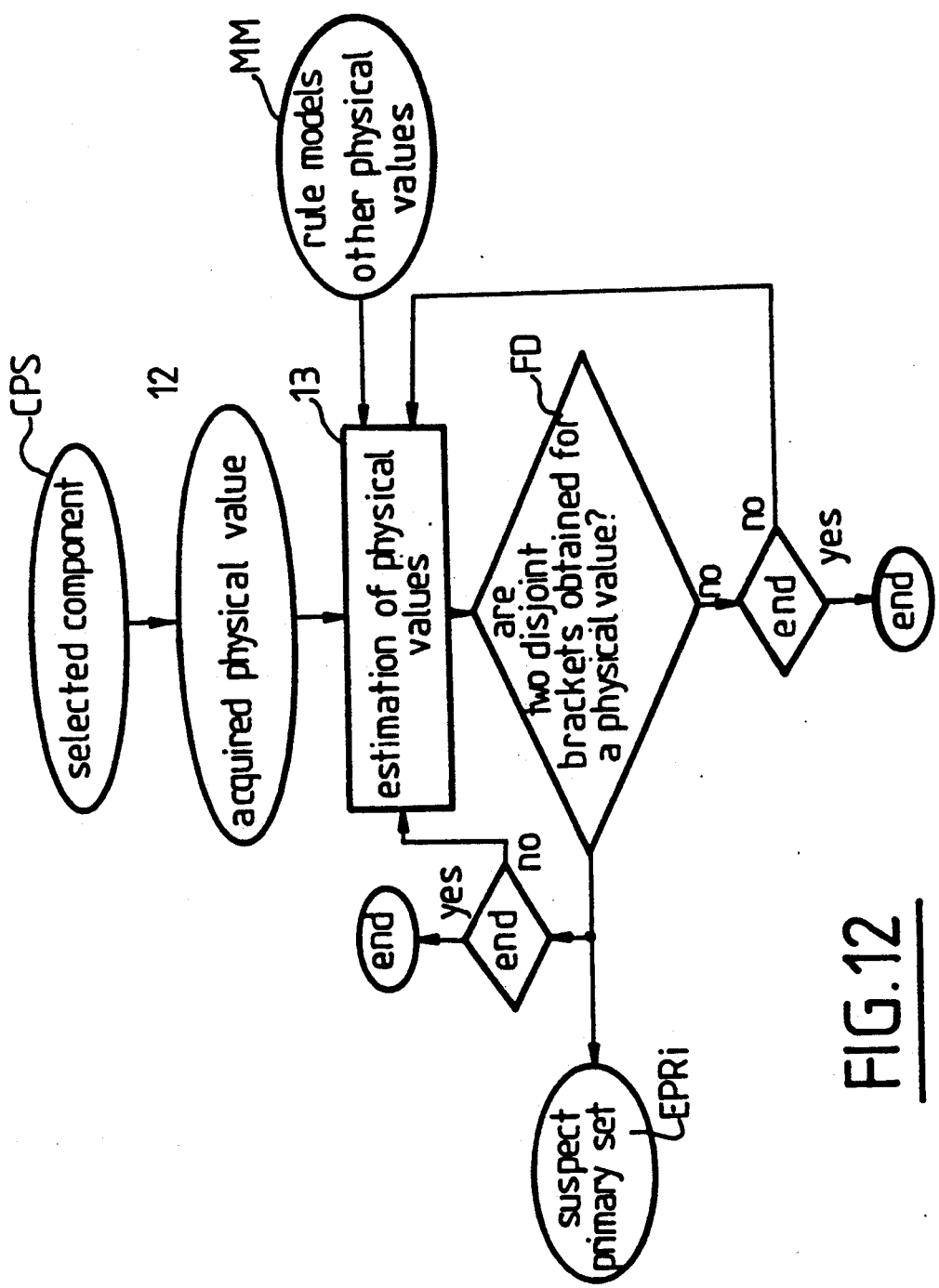

This decision making mechanism makes it possible to display on screen a selected component CPS in respect of which the user has to effect the acquisition 12 of the physical value (FIG. 12).

As from this point, the processing means proceed as illustrated in FIG. 12 to the selection 13 of the various physical values set out above on the basis of the models, rules and other physical values in the memory MM of the device, more particularly in the values memory and in the models memory.

This second estimation mechanism estimates all the possible physical values on the basis of the structure of the network and of the data contained in the values memory and during this selection the processing means can deduce therefrom a suspect primary set EPRi by obtaining two disjoint brackets FD. It should be observed that obtaining a suspect primary set does not necessarily interrupt the estimation processing if other physical values can still be estimated.

Thus just as it was possible to proceed to new estimations on the basis of an intersection bracket of two non-disjoint brackets, it is possible to pursue the estimation processing on the basis of at least one of two disjoint brackets with a view to possibly obtaining another conflict.

Figure 13:
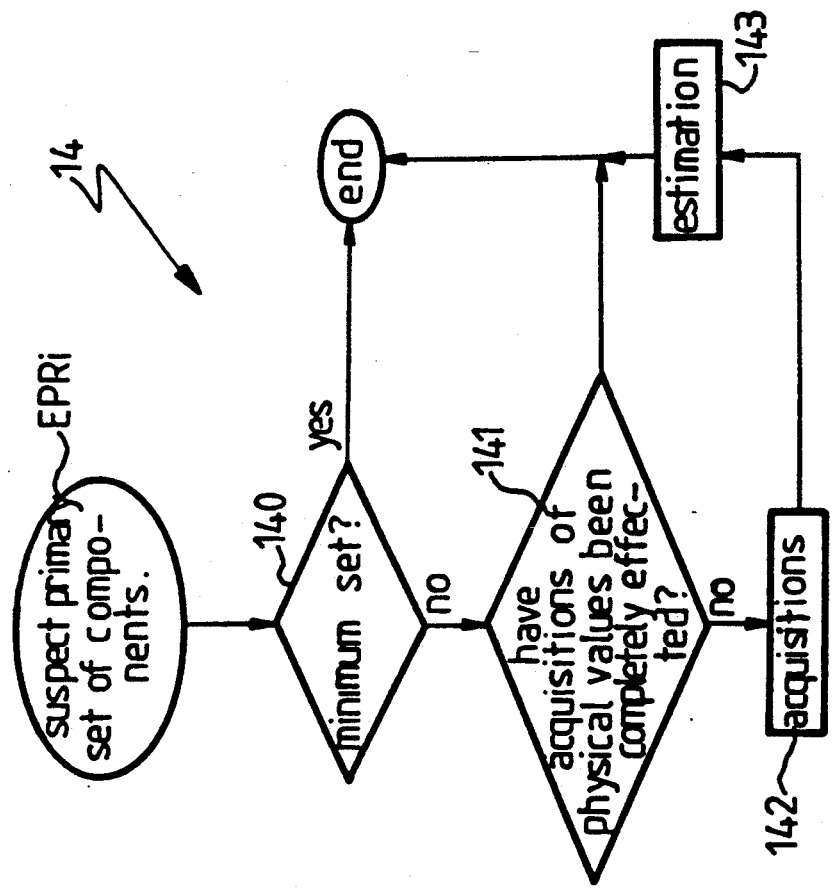

In the presence of such a suspect primary set, one proceeds as set out above to an analysis of the latter (FIG. 13). The processing means determine first of all whether the primary set of components meets the predetermined condition of a set termed a "minimum" (step 140). In concrete terms, in the case of a electronic circuit for example, a minimum set of components is characterized by components that are all connected to the same common terminal. If this condition is met, no supplementary processing is effected on this set.

In the opposite case, one proceeds with the acquisition of a potential difference at the terminals of the components of the suspect primary set EPRi in respect of which this acquisition has not as yet been effected (steps 141-142). On the basis of these possible acquisitions, new estimations are proceeded with (step 143) to lead possibly to another suspect primary set of components.

A precise example of the use of the device in accordance with the invention will now be illustrated in the particular case of an electronic circuit referring more particularly to FIGS. 14 to 17

Figure 14:
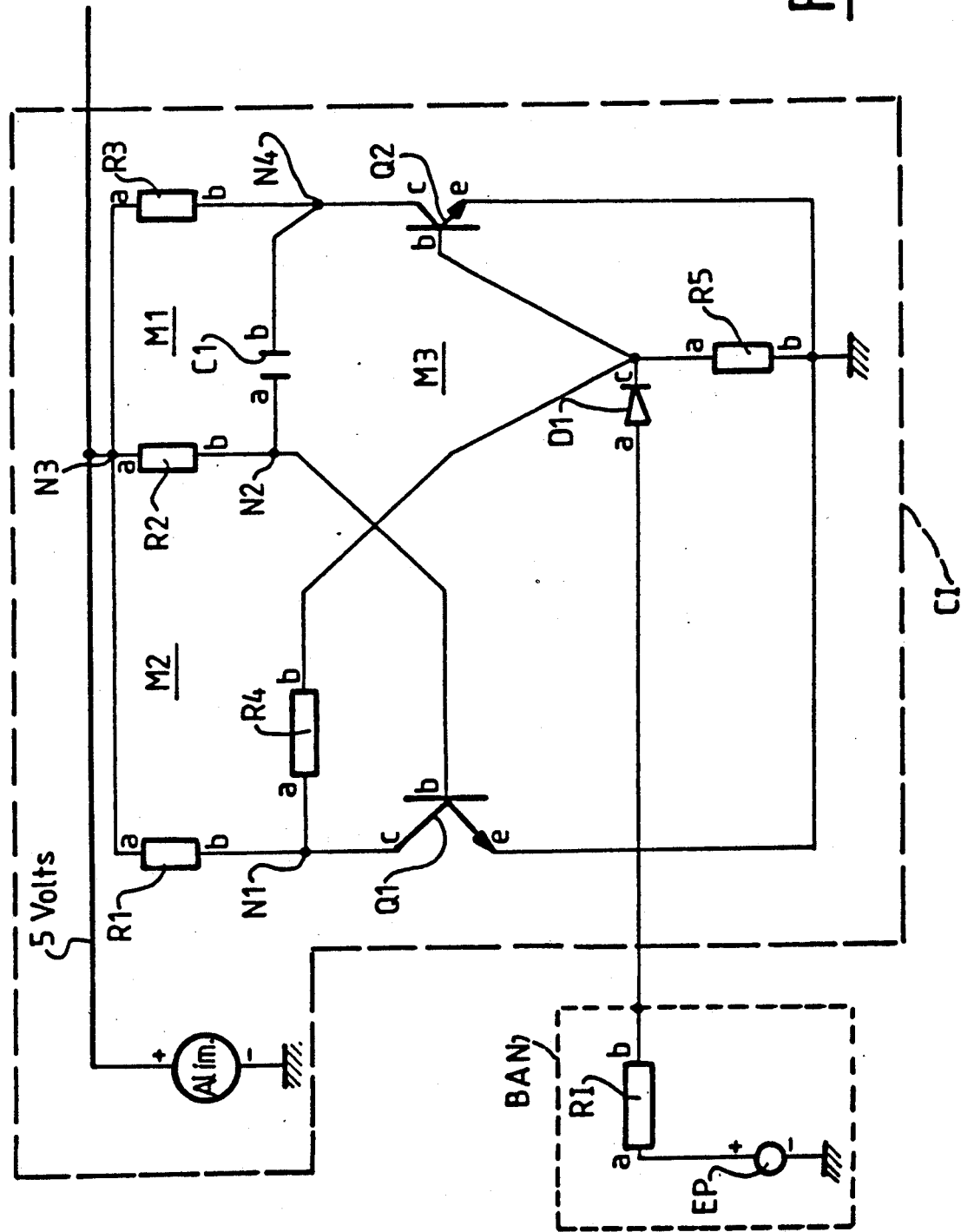
FIG. 14 illustrates an example of an electronic circuit to be tested.
Figure 15:
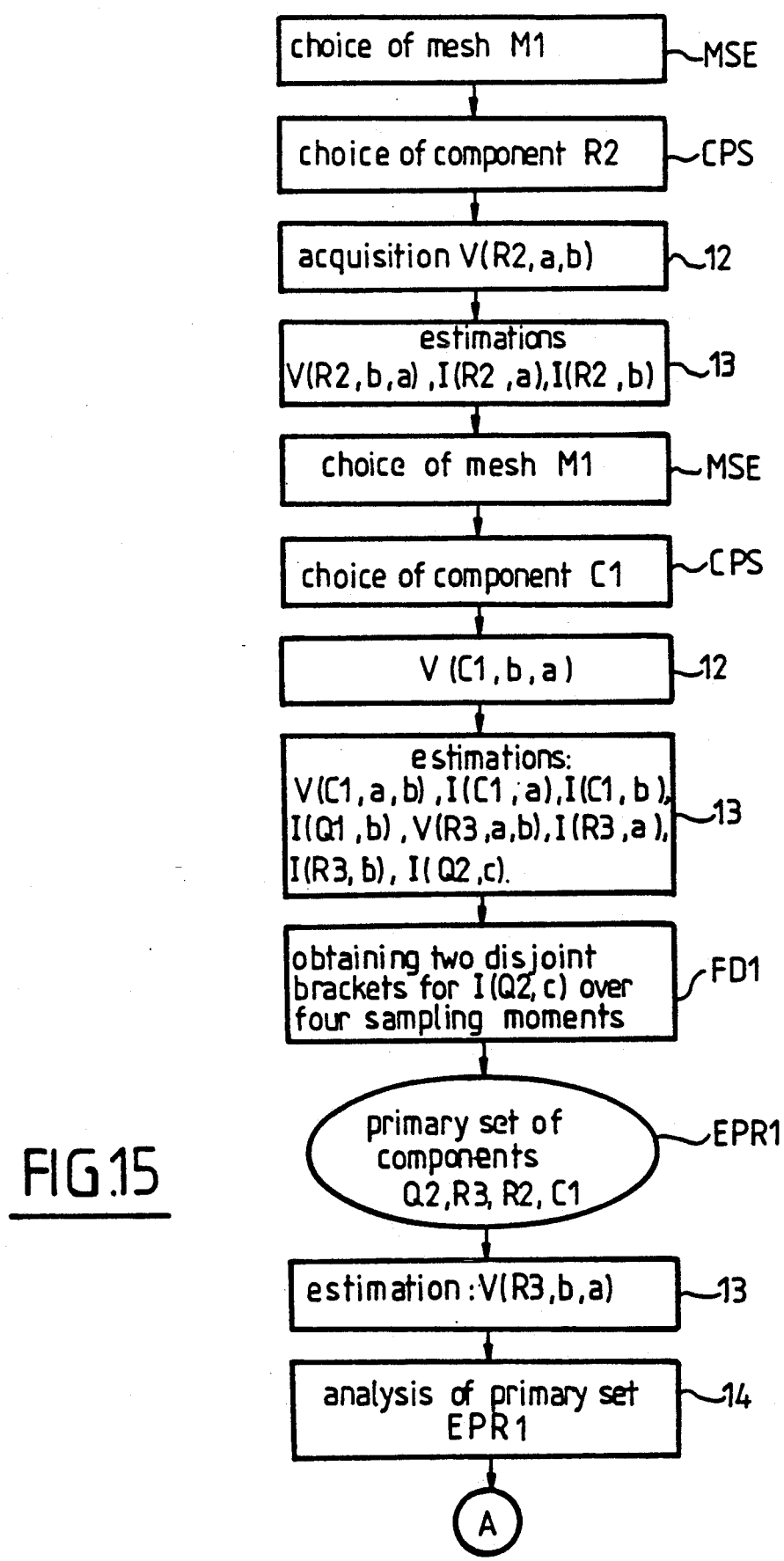
FIGS. 15 to 17 illustrate a working flowchart of the device in the particular case of the circuit of FIG. 14.
Figure 16:
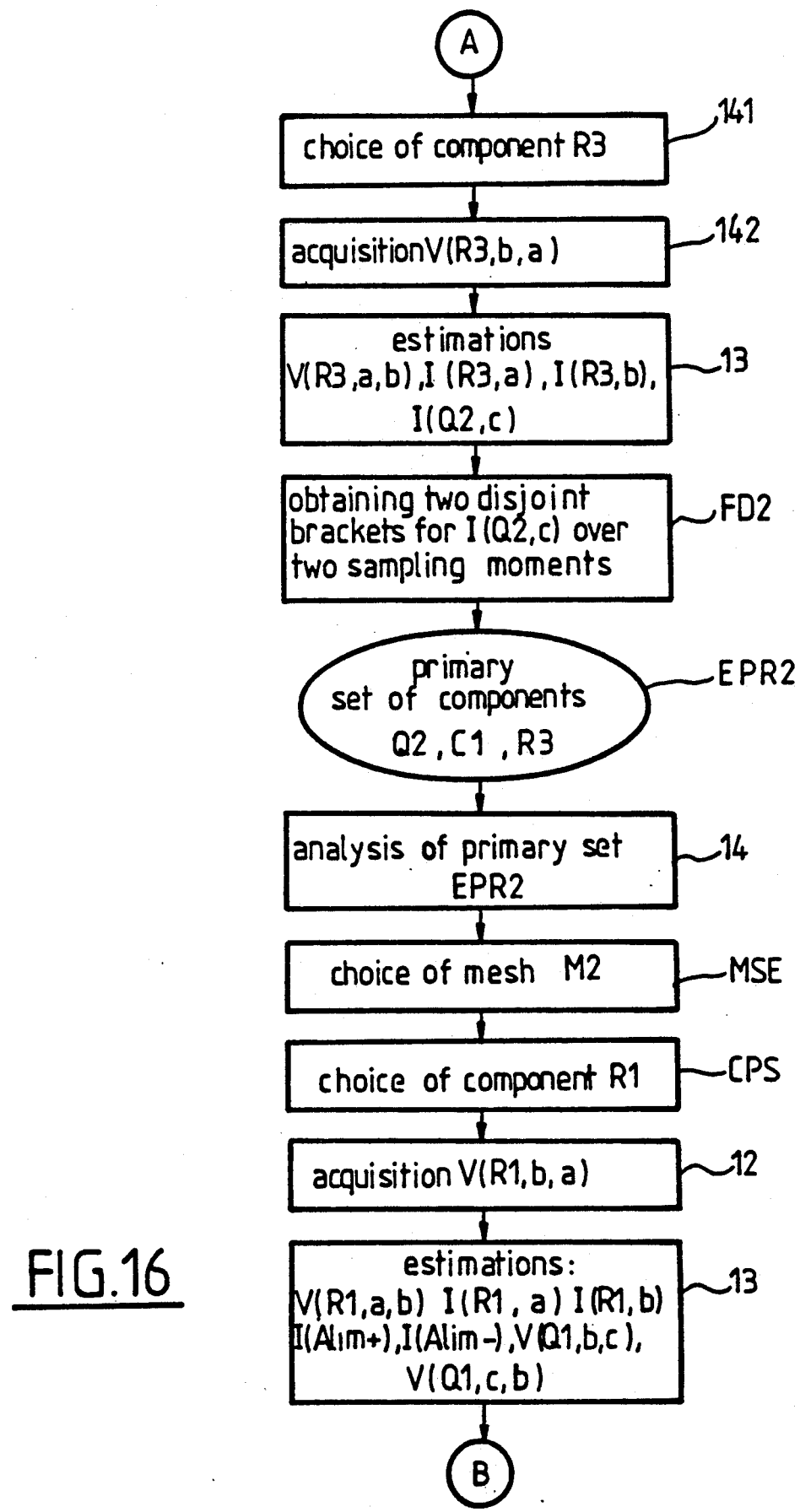
Figure 17:
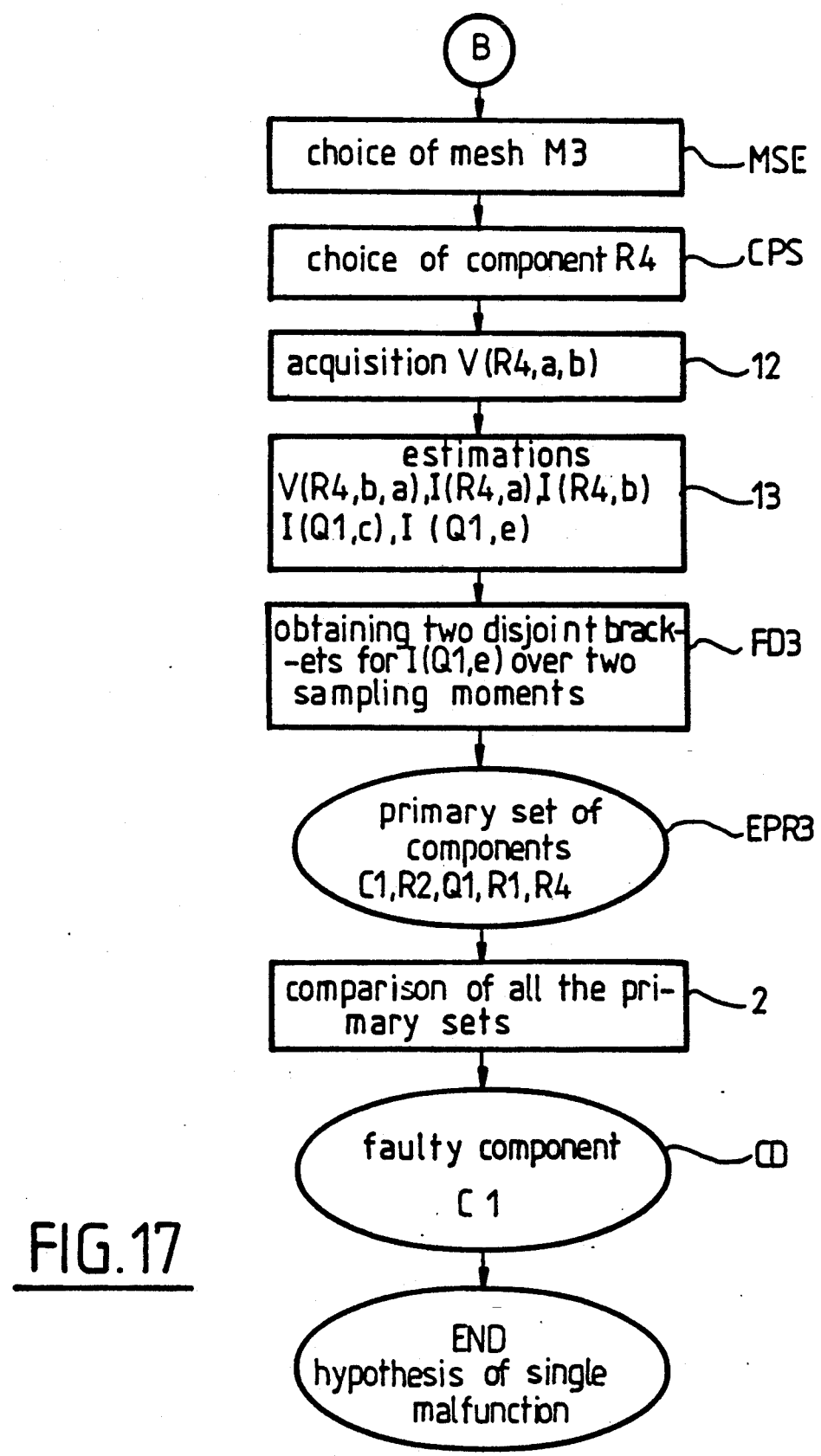

The electronic circuit CI to be repaired, illustrated in FIG. 14, comprises a plurality of components whose characteristics are defined in Annex 1. As regards the resistors and the capacitor, the numerical values of these components are provided. As regards the diodes and the transistors, a Company name is supplied as well as a reference under which the component is marketed by the named Company.

The time interval chosen for the potential differences acquired in the circuit C1 is comprised between 0 and 40 microseconds, sampled every 0.1 microsecond. The faulty component is the capacitor C1.

The test stand BAN allowing this circuit to be activated comprises a pulse generator EP associated with a 50 ohms resistor RI and supplies a square wave shape over the time interval.

For the sake of simplification, we will here mainly describe the progress of the operating algorithm and mention only some numerical values for the various precision brackets, the uncertainty brackets and the estimated uncertainty brackets.

The physical values acquired will here be potential differences subject to the comment that it would, of course, be possible to make provision for probes capable of picking up currents. The estimated values will therefore be currents and also potential differences.

At the start of the test, no potential difference is known since no potential difference has been acquired. Therefore the choice of the selected grid MSE is effected according to the second and third subcriteria to arrive at the selection of the grid M1 comprising three passive components R2, C1 and R3.

The selected component CPS is the resistor R2, between whose terminals a and b the potential difference V(R2,a,b) is acquired (step 12).

On the basis of this acquired potential difference, of the model of the resistor, and of the general rules contained in the models memory, the currents I (R2,a) and I(R2,b) are estimated at the two terminals of the resistor as well as the potential difference V(R2,b,a) between the terminals b and a of this same resistor.

Since at this stage of the processing, it is no longer possible to estimate a physical value with the data present in the values memory, it is necessary to choose another grid for the acquisition of a potential difference. The grid M1 is again chosen because it is the one having the greatest number of potential differences that are already known.

The selected component CPS is then the capacitor C1, between whose terminals b and a a potential difference is acquired. It is here recalled that the acquisition of this potential difference is effected in the same operating conditions of the circuit as those provided for the preceding acquisition, that is to say, between the instant of starting the circuit (0 microsecond) and an instant 40 microseconds later.

On the basis of this potential difference, there are successively estimated:
the potential difference V(C1,a,b) between the terminals a and b, then
the current I(C1,a) at the terminal a, then
the current I(C1,b) at the terminal b, then
by superposing a total zero current at the nodal point N2, the base current I(Q1,b) of the transistor Q1 on the basis of the estimated current at the terminal b of the resistor R2 and of the estimated current at the terminal a of the capacitor C1, then
the potential difference V(R3,a,b) between the terminals a and b of the resistor R3, on the basis of the two previously acquired potential differences, whose uncertainty bracket estimated at the instant 10.2 $\mu$s amounts to approximately (4.848; 4.969), then
the current I(R3,a) at the terminal a of the resistor R3, then
the current I(R3,b) at the terminal b of the resistor R3, and then,
on the hypothesis of a zero current at the nodal point Nr of the circuit, the current I(Q2,c) of the collector of the transistor Q2.

At this stage of the estimation, there appear two disjoint brackets for the current of the collector of the transistor Q2 (reference FD1) over the following four successive sampling instants: 16.4 $\mu$s; 16.5 $\mu$s; 16.6 $\mu$s; 16.7 $\mu$s.

The first of these disjoint brackets is an estimated uncertainty bracket and the group of components having contributed to its establishment comprises the transistor Q2, the resistor R3, the resistor R2 and the capacitor C1. By way of example, the uncertainty bracket estimated at the instant 16.4 $\mu$s has a value of approximately $(-0.03A; -0.006A)$.

The second of these brackets is a reference bracket contained in the model of the transistor Q2 and stating that this collector current must be positive, that is to say, the bracket $[-10^{-4}A, +\infty[$. Of course, it is only the transistor Q2 that is the originator of this reference bracket and then constitutes in some way the second group of components, having contributed to the establishment of this reference bracket.

Therefore, a suspect primary set of components EPR1, deriving from the combination of the above mentioned two groups of components comprises the transistor Q2, the resistor R3, the resistor R2 and the capacitor C1.

Although the processing means must now analyse this primary set of components EPR1 (step 14), the estimation mechanism also permits the estimation 13 of the potential difference V(R3,b,a) between the terminals b and a of the resistor R3.

The analysis of this primary set of components EPR1 reveals that one is here not concerned with a minimum conflict because the four components of this set are not all connected to the same terminal. Therefore, it is necessary to investigate at the terminal of which component of this set a potential difference has not already been acquired. The components concerned are the components R3 and Q2. Since the resistor R3 is a passive component, the potential difference will be preferentially acquired at its terminals, which is effected in step 142 between the terminals b and a.

As from this point, there are successively estimated:
the potential difference V(R3,a,b) between the terminals a and b of the resistor R3,
the current I(R3,a) at the terminal a of the resistor using the model of the latter, then
the current I(R3,b) at the terminal b, and finally
the collector current I(Q2,c) of the transistor Q2 again using the current at the terminal b of the capacitor C1, the current at the terminal b of the resistor R3 and the fact that the current is zero at the nodal point N4.

The expert will here observe that as regards the potential difference V(R3,a,b) at the terminals of the resistor R3, there is obtained a second estimated uncertainty bracket amounting to approximately (4.870; 4.962) at the instant 10.2 $\mu$s. In fact, this value has already been previously estimated on the basis of the acquisition of the potential difference at the terminals of the capacitor C1. However, since these two are not disjoint, the processing means do not conclude that there exists a suspect primary set of components. The intersection bracket (4.870; 4.962) at the instant 10.2 μs between these two brackets is then stored in the values memory to be assigned on a priority basis to this physical value during a possible subsequent comparison and to be used by the estimation mechanism for other estimations.

On the other hand, one obtains (reference FD2) another estimated uncertainty bracket as far as the collector current of the transistor Q2 is concerned, this being again compared with the reference bracket of the model to reveal an empty intersection over two sampling instants.

The processing means therefore conclude that there exists a second primary set of components EPR2 comprising the transistor Q2, the capacitor C1 and the resistor R3.

The intersection of the two primary sets EPR1 and EPR2 is reduced to the primary set EPR2. The processing must therefore be continued because at this stage, one cannot discern which of these three components Q2, C1, R3 is functioning incorrectly.

The step 14 of analysing the primary set EPR2 is effected and shows that this primary set reflects a minimum conflict since the three components are all connected to the nodal point N4. No additional potential difference is therefore acquired in this primary set.

The following grid selected according to the first mechanism is the grid M2 constituted by the components R1, Q1 and R2, since, apart from the grid M1, the grid concerned is the one having the greatest number of potential differences already known.

The component CPS selected is the resistor R1 between whose terminals b and a an acquisition 12 of a potential difference is effected.

On the basis of this acquired physical value, there are subsequently estimated:
the voltage V(R1,b,a) at the terminals of this resistor taken between the terminals b and a,
the current I(R1,a) at the terminal a and the current I(R1,b) at the terminal b using the resistor model,
the power supply current I(ALIM+) at the positive terminal of this power supply ALIM using the rule of the zero current at the nodal point N3 of the circuit and the estimated currents I(R1,a) I(R2,a), I(R3,a) at the terminals a of the resistors R1, R2 and R3.
the current I(ALIM−) at the negative terminal of the power supply, and
the base/collector voltage V(Q1,b,c) of the transistor Q1 knowing the potential differences acquired at the terminals of the resistors R1 and R2 and the rule regarding the zero value of the sums of the potential differences along the grid M2.

Since no other estimation is possible, it is necessary to select another component at whose terminals a potential difference will be acquired.

The selected grid is then the grid M3 constituted by the transistor Q1, the resistor R4, the transistor Q2 and the capacitor C1.

The selected component is the resistor R4 between whose terminals a and b the potential difference is acquired (step 12).

From this point, there are successively estimated:
the potential difference V(R4,b,a) between the terminals b and a of this resistor, then
the currents at the two terminals of this resistor,
the collector current (I(Q1,c) of the transistor Q1 by using the currents at the terminals a and b of the resistors R4 and R1 as well as the zero current rule at the nodal point N1,
the emitter current I(Q1,e) of the transistor Q1 on the basis of the collector current of this transistor, of the base current of this transistor, and of the rule specifying a zero current at the level of the junction of the three terminals of this transistor, subject to the observation that the base current of this transistor Q1 is estimated on the basis of the current at the terminal b of the resistor R2, of the current at the terminal a of the capacitor C1 and of the rule specifying a zero current at the nodal point N2.

There is then obtained, for this emitter current of the transistor Q1, a first estimated uncertainty bracket which, compared with the reference bracket of the model specifying that this current must be negative, shows an empty intersection and hence a third suspect primary set of components EPR3 comprising the transistor Q1, the resistor R1, the resistor R4, the resistor R2 and the capacitor C1.

As a guide, the conflict appears at the instants 10 μs and 10.1 μs and the first estimated uncertainty bracket amounts at this last instant to approximately (0.02A; 0.05A).

The comparison of the three primary sets obtained (step 2) shows an intersection reduced to a single component, that is to say, the faulty component (which is here the capacitor C1) which terminates the diagnostic program, on the hypothesis that there is only one malfunction.

The expert will thus observe that only two acquisitions of potential differences have been necessary to obtain the first suspect primary set of components and that five acquisitions of potential differences have been necessary in all for the setting up of the diagnostic showing the capacitor C1 to be the faulty component.

Although it is particularly advantageous to use the operation of the automated decision making mechanism, the test device here described also permits the user himself to choose the components in respect of which he will acquire the physical values, for example in simple cases or when he already has a preconceived idea regarding the malfunction he is looking for. In that case, the continuation of the processing remains similar to that described above, in particular as regards the estimation mechanism and the comparison of the brackets.

The user may also modify the automated decision making mechanism by adding particular criteria, for example those specifically relating to the network of components being tested or in order to replace the arbitrary selection of a grid.

It should then be noted that one of the physical values in respect of which it is possible to effect the comparison of two brackets, may be the current passing through a semiconductor junction such as a diode, or again the potential difference at the terminal such as a resistor.

Moreover, the device is not incompatible with using component-expressions relating to the incorrect functioning of components (fault models) which may be used for example to confirm and improve a diagnosis obtained on the basis of models relating to the correct functioning of the components.

There will now be described another embodiment of the device according to the invention using a working algorithm based on a test relating to the set of expressions for the current estimated by the device, of a condition taking into account the presumed zero value of the total current at a common terminal of the electronic circuit.

Although the use of precision brackets, estimated uncertainty brackets and of reference brackets is not incompatible with testing this condition, there will only be here described a simplified procedure not using these brackets. Thus, as will be seen below, the component-expressions of the models will be simplified.

In this embodiment, for an application of approximately 100 components, a mass memory with a capacity of 1.44 Megaoctets and a central working memory of approximately 1 Megaoctet are adequate.

Figure 18:
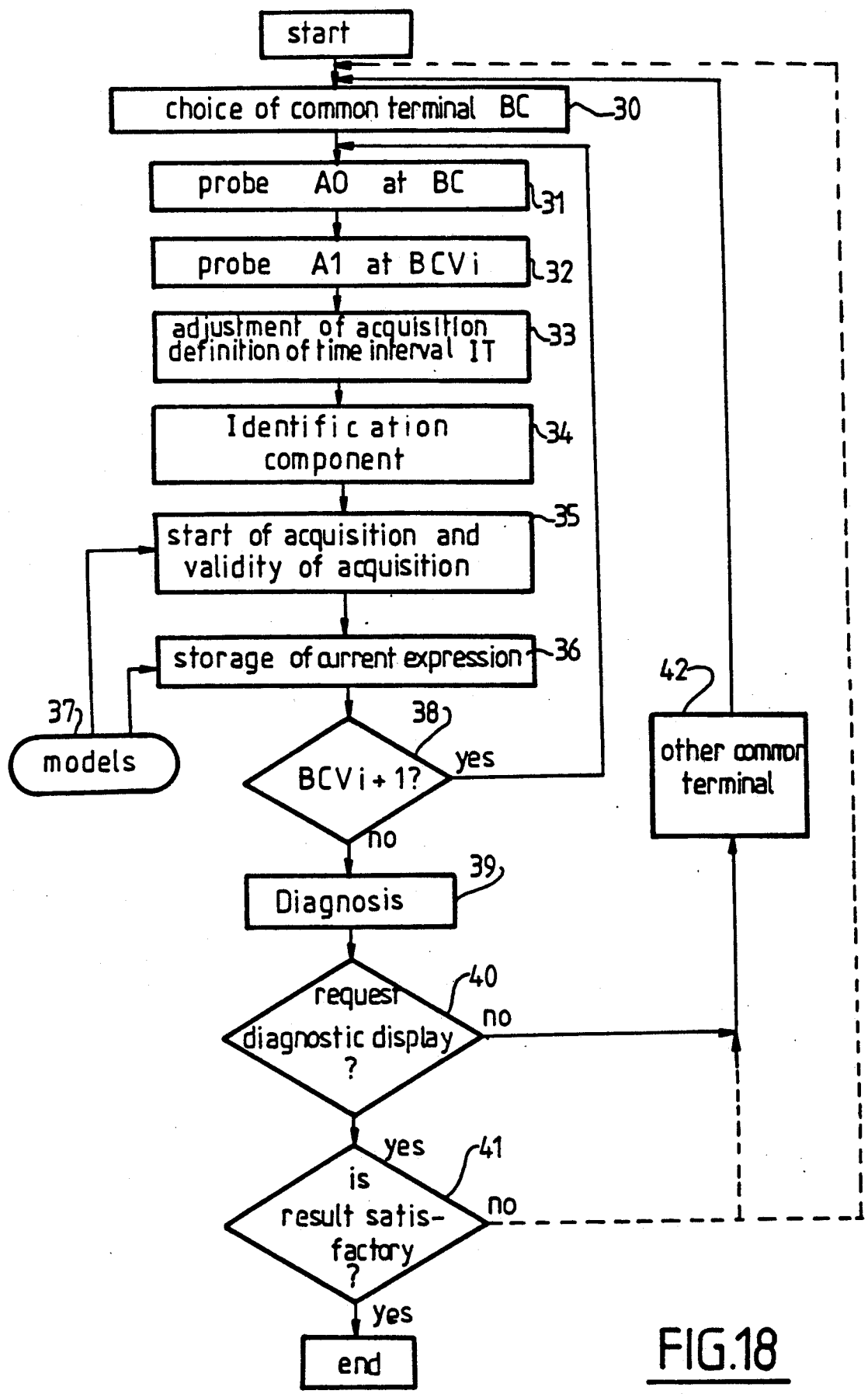
FIG. 18 is a general working flowchart of another embodiment of a device according to the invention.
Figure 19:
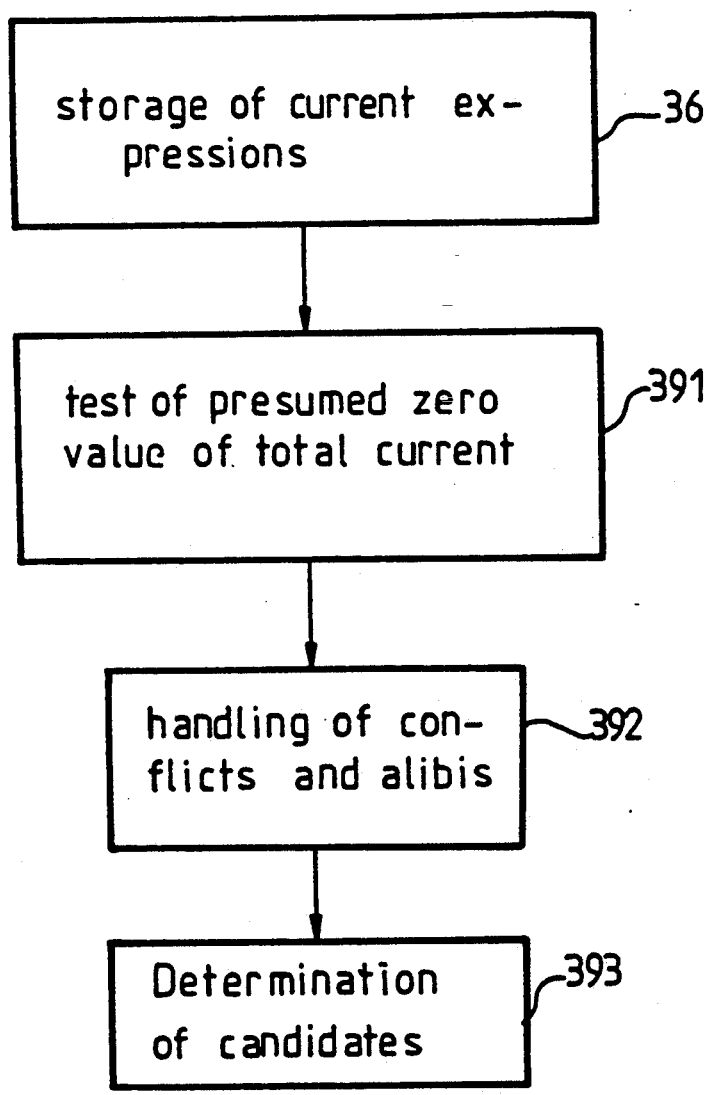
FIG. 19 is a more detailed part of the flowchart of FIG. 18.

The operation of this device will now be described in general, referring more particularly to FIGS. 18 and 19.

One of the fundamental principles used within this embodiment lies in determining the current expressions on the basis of the potential difference acquired between the terminals of each component of a set of components connected to a common observation node, and on the basis of functional models describing their respective behaviour subject to the comment that the models may represent an incorrect functioning or a proper functioning, as will be seen below.

In a step 30, the user chooses a common terminal BC of a set of components. The choice of this terminal is left to the user's discretion. If he or she is familiar with the circuit to be repaired, or knows its operating modes, he or she may choose in a judicious way a first common terminal to which the components considered to be suspect are connected. However, if he has no preconceived idea regarding the origin of the malfunction or if he does not know the operating modes of the circuit, he chooses a first common terminal at random and will then proceed step by step to establish his diagnosis, being guided by the device if required.

The first probe AO is placed in the region of the common terminal BC (step 31) whilst the second probe A1 is placed at a terminal BCVi adjoining this common terminal (step 32).

In step 33, the user sets his acquisition parameter defining for example the time base and the amplitude of the measurement. In other words, he defines the time interval IT for the acquisition of the potential difference between the terminal BC and the terminal BCVi. These various parameters may be set directly on the acquisition element such as the numerical oscilloscope or they may be entered into the system by means of the keyboard if the probe means and the digitalization means are for example integrated in the device.

In the following step 34, the user identifies the component connected between the terminal BC and the terminal BCVi by means of the keyboard. He may use dedicated keys of the keyboard for this purpose and marked (for example R for a resistor and Q for a transistor). He also uses the numerical keys to designate the reference of the component in the electrical circuit diagram.

The user then starts the acquisition proper of the potential difference in step 35 which marks the start of a series of operations effected by the processing means.

In a way similar to the embodiment already described, the analogue data corresponding to the potential differences are digitized in the actuable digitalization means MNC and are passed to the processing means. The latter are then capable of memorizing these informations in the memory MM1 and of characterizing them for their subsequent processing, taking into account the schematic representation of the circuit. For this purpose, one may for example, define a temporal window, a temporal rising front, a frequency and a mark allowing these characteristics to be attributed to the corresponding component of the circuit such as is marked in the electrical circuit diagram.

It is also advantageous for the processing means to be capable of establishing the validity of such an acquisition. For this purpose, they use in particular the functional model 37 of the identified component. Thus if the model of the component shows that it is necessary to take into account the time derivative of the potential difference in order to establish a current expression and that at the same time the sampling period chosen for the acquisition does not allow this derivative to be obtained with sufficient accuracy. The processing means will consider the acquisition as non-valid since it does not allow a precise current expression to be deduced therefrom. In this case then, instructions may be displayed on the screen MAF of the device for the user's attention so that he should modify the sampling rate since the digitalization means MNC are controllable.

It will now be assumed that the acquisition has been considered by the processing means be valid.

The processing means then determine in step 36 an expression for the current corresponding to the acquired potential difference, taken from the functional model of the component concerned over the said time interval IT. In general, this model may represent a correct functioning or an incorrect functioning of the component. Use of one or the other model is left to the user's appreciation to the extent that the models are available in the memory.

As far as dipole-type components are concerned, (for example resistors, capacitors) the correct functional models are a retranscription of the laws of physics governing the formation of the current-voltage parameters.

For the other component types, the models correspond rather to the sets of constraints to be met.

Detailed examples of the functional models will be described below. It may however be indicated here and now that here too it is possible to assign a plurality of functional models of varying complexities to a given electronic component. The device may then use, for example, at first a simple functional model and then if the diagnosis leads to a manifestly unexpected conclusion, or does not lead to any conclusion, models of a higher complexity may be used.

Once the current-expression has been estimated by the processing means, it is stored in the memory for diagnostic purposes.

In the following step 38, the user places the probe A1 successively on the other adjoining terminals connected to the common terminal BC, and the device successively reexecutes the steps 34 and 36.

It should here be observed that the processing means are advantageously capable of memorising the common terminal within the circuit to be checked, as well as identifying the components connected thereto. Thus this makes it possible to construct a representation of the circuit on an incremental basis in the course of the procedure. Moreover, this frees the user from having to reenter the same data from one session to another, as far the components or terminals that have already been observed are concerned.

When all the adjoining terminals have been processed, the device then passes to the diagnostic step 39 whose general principle lies in a test, effected by the processing means over the set of the expressions for the current and at each instant of the time interval IT, of a condition that takes into account the presumed zero value of the total current at the common terminal, this allowing a first indication to be obtained concerning the functioning of the components connected to this common terminal.

In general, the test of said condition comprises the comparison of an algebraic value with a reference value. More precisely, when at least some of the current-expressions are so called algebraic current values, the test of the set of the current-expressions comprises the algebraic sum of these current values which is then compared with a reference value. One may, for example, test whether this algebraic sum is positive or negative.

In the case where all the current-expressions are so called algebraic values, the test is made as to whether the algebraic sum of all the current values is equal to or different from 0, within an accuracy tolerance.

Several cases may occur.

If each current-expression relating to each component connected to the common terminal is taken from a functional model representing a correct functioning of the component, and if the condition taking into account the presumed zero value of the total current at the common terminal is met (for example, the algebraic sum of all the current values is zero), then the first indication may represent a respective individual incorrect functioning of a plurality of components connected to the common terminal, the set of all the components connected to this common terminal having an overall correct functioning mode.

If, on the other hand, the test of the condition taking into account the presumed zero value of the total current is negative (the algebraic sum of all the current values is for example different from 0). Then the said first indication may represent an incorrect functioning of at least one component connected to the common terminal, the set of these components also having an overall incorrect functioning mode.

It has been seen that one could, nevertheless, use functional models representing an incorrect functioning of the components. In this case, when a single current-expression is taken from a functional model representing an incorrect functioning of a component connected to the common terminal, whilst the other current-expressions relating to the other components are taken respectively from functional models representing correct functioning, and when the presumed zero value condition of the total current at the common terminal is met, then the said first indication signifies that the component in respect of which an incorrect functional model has been used, really is defective.

On the other hand, if the test of said condition is negative (the zero value condition not met), then the component in respect of which an incorrect functional model has been used is "declared not guilty" of this incorrect functioning (subject to the other components connected to this common terminal being assumed to be good) and the search has to be continued by successively calling up other incorrect functional models one by one for the other components.

It is here worthwhile to redefine and to introduce the notions of "conflict", "alibi", and "candidate". For defining these notions, there will adopted the hypothesis of using models of proper functioning for all the components connected to the common terminal.

If the presumed zero value condition of the total current at the common terminal is not met at the common terminal chosen, there then exists a conflict at this common terminal between the acquisitions on the one hand and the proper functioning hypotheses on the other hand. In other words, at least one of the models used is not verified.

In the case where the test of this condition is negative, it has been seen above that this implied that all the components were good or that at least two of them showed compensating incorrect functioning modes. In other words, for a chosen common terminal, a component can be "declared not guilty" if the group of all the others is assumed (or verified) to be good. Similarly, a component can only be considered to be faulty if at least one of the groups of other components connected to the common terminal is itself considered to be faulty. It will thus be readily seen that the said group of components forms an "alibi" for the component considered.

In other words, a "conflict" is here again constituted by a set of components of which at least one has an incorrect functioning mode.

A "candidate" is a set which is the intersection of all the conflicts. The alibis possibly allow the possible candidates to be restricted because a component having an alibi can only belong to a candidate set if at least one of the elements of its alibi is included therein.

Thus, once the test of the presumed zero value condition of the total current has been effected (step 391), the processing means handle the conflicts and alibis (step 392) and determine the candidates (step 393).

In the case of a circuit where all the terminals are observable (in accordance with the definition given above), a maximum of conflicts can be detected and the number of possible candidates will be at a minimum.

In the opposite case, the number of possible candidates can increase, thus reducing the diagnostic scope to only a part of the circuit to be repaired.

When the diagnosis has been carried out, the user can ask to have it displayed or not displayed (step 40). For example, he will be in the position of not asking for a display if he considers that, having placed the probe A0 at a common earth terminal, the diagnostic display will not be of any use to him. On the other hand, the data memorised during this first series of acquisitions will be useful to the device in the continuation of the search. The user then chooses another common terminal (step 42) and the sequence of the operations continues as indicated above.

If the display of the diagnosis is asked for and if the user judges it to be satisfactory (step 41), which may for example correspond to the effective display of a single candidate component, the search is terminated.

In the case where the displayed diagnosis reveals a set of candidates, the user may then choose another common terminal (step 42) and repeat the sequence of operations until the number of candidates is reduced. This other common terminal is then advantageously chosen from the terminals adjoining the first common terminal. This second set of acquisitions will then provide a second indication regarding the set of components connected to the second common terminal. The combination of the first and second indications will then allow a diagnosis to be displayed by providing for example, an indication regarding the functioning of a component connected between the first and second common terminals.

The result may also be considered to be unsatisfactory if the circuit is obviously malfunctioning and the diagnostic display does not reveal any candidate. This may then signify for example that the models used are not sufficiently precise. The user may then order a new search by insisting on the use of available models of a higher complexity.

If the result is still unsatisfactory, the user may then be led to question the circuit design or yet consider aspects other than purely electrical (for example of a thermal type, or stray connections) that are not modelled, and which are the prerogative of an expert.

The device in accordance with the invention offers the user another possibility in this connection. Indeed, the means for dialogue of the device allow the user to increase the library of models by himself creating models of a correct and incorrect functioning for a component.

The expert will thus note that the device also offers great flexibility in use. It does not require a prior description of the circuit to be repaired and the user may not know its details and may even be unaware of the symptoms of its malfunction. Moreover, the detected conflicts are not subject to discussion, that is to say, it is certain that at least one of the components of the conflict are faulty.

A precise example of the use of the device will now be illustrated with a particular case, referring more particularly to FIGS. 20 to 43.

Figure 20:
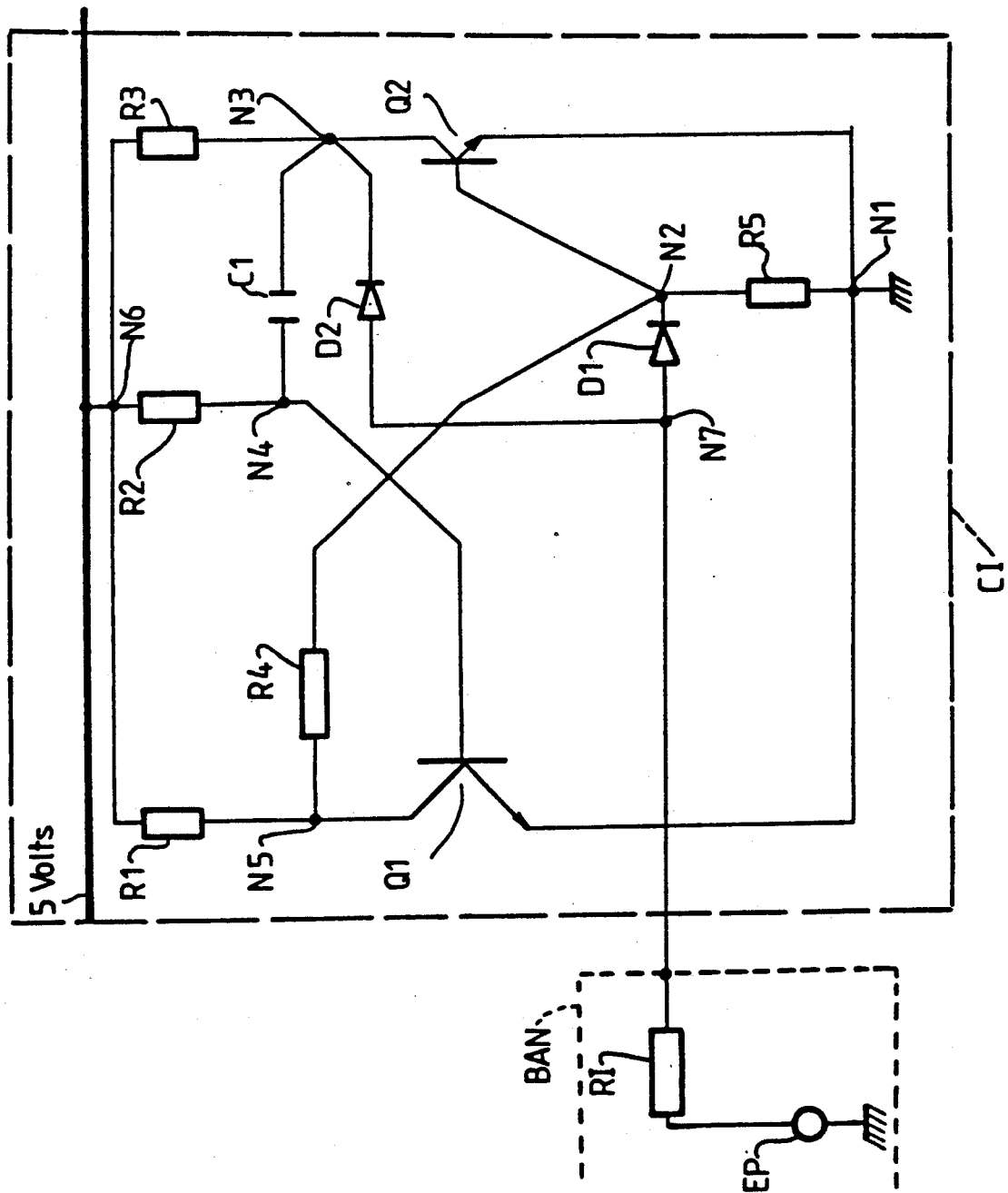
FIG. 20 illustrates an example of an electronic circuit to be repaired, according to the flowchart of FIG. 18.

The circuit CI of FIG. 20 is similar to that of FIG. 14. A diode D2, removed from the circuit of FIG. 14 for the sake of simplification, has been inserted between the anode of the diode D1 and the collector of the transistor Q2. This anode D2 is the same as the diode D1. On the other hand, the power supply ALIM has not been represented.

Figure 21:
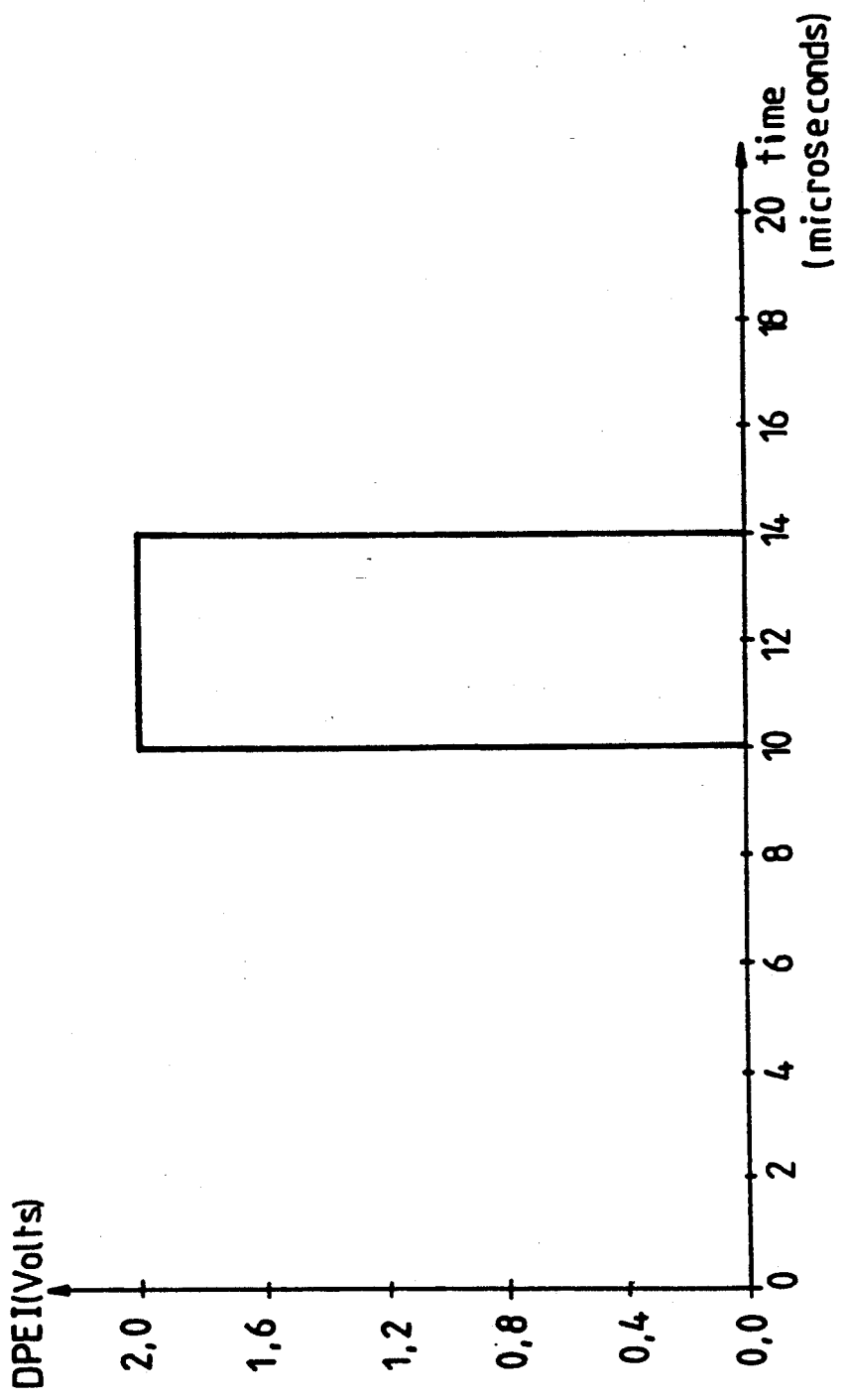
FIG. 21 shows a curve relating to the activation of the circuit of FIG. 20.
Figure 22:
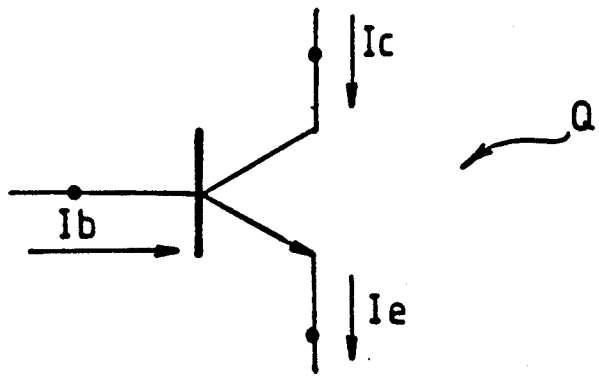
Figure 26A:
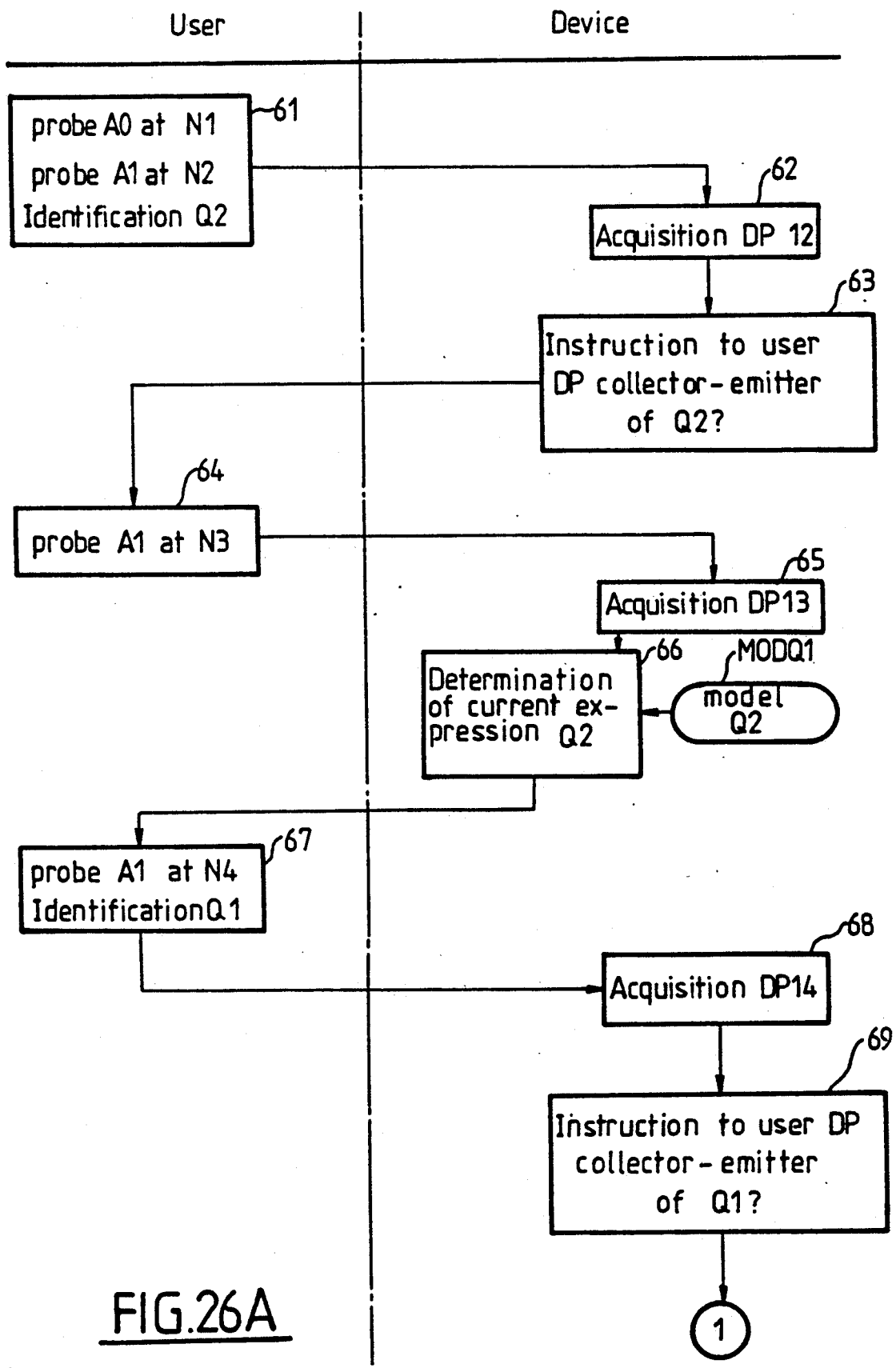
FIGS. 26A to 26E illustrate a use of the device in the particular case of the circuit of FIG. 20.
Figure 26B:
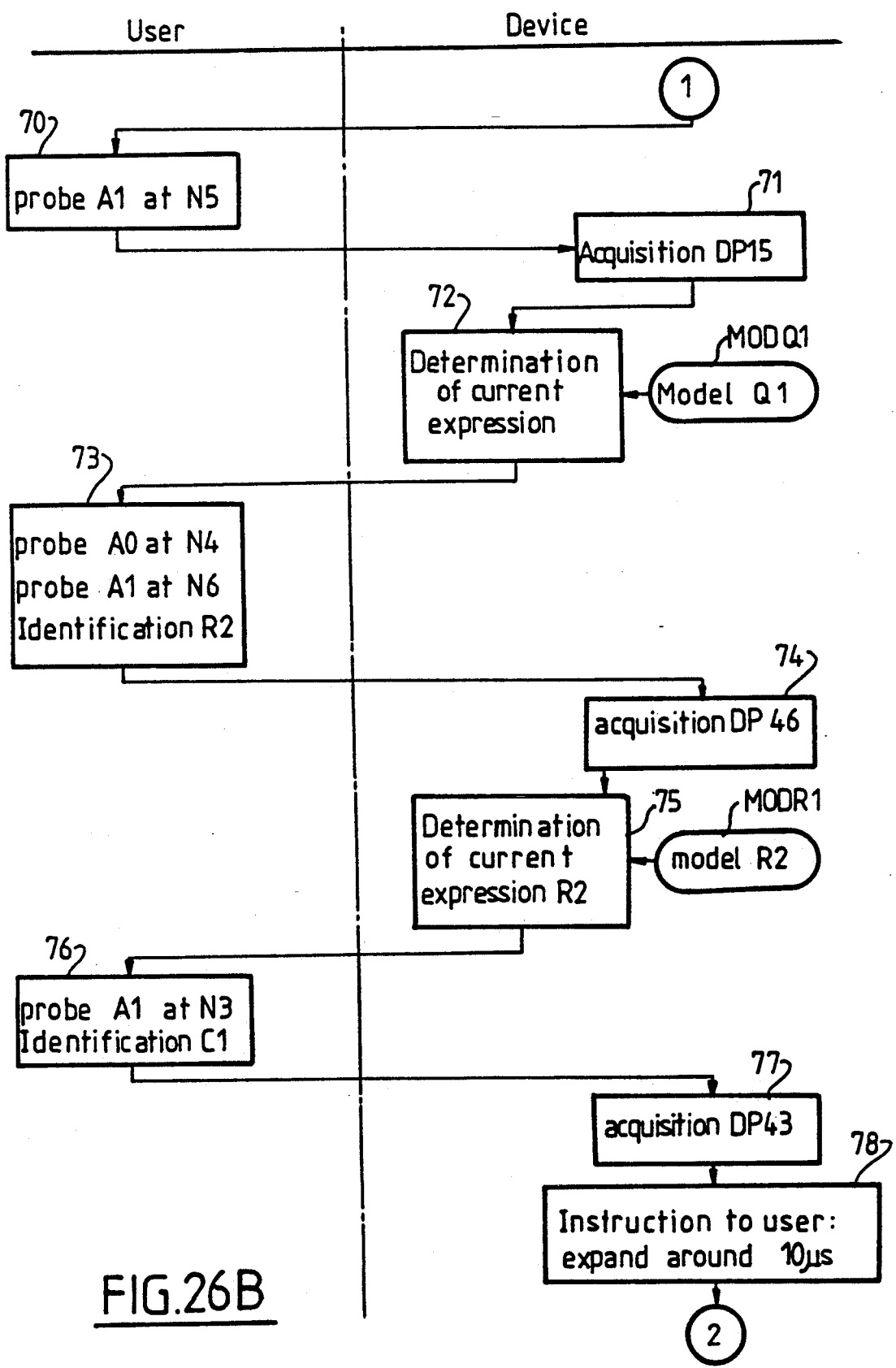
Figure 26C:
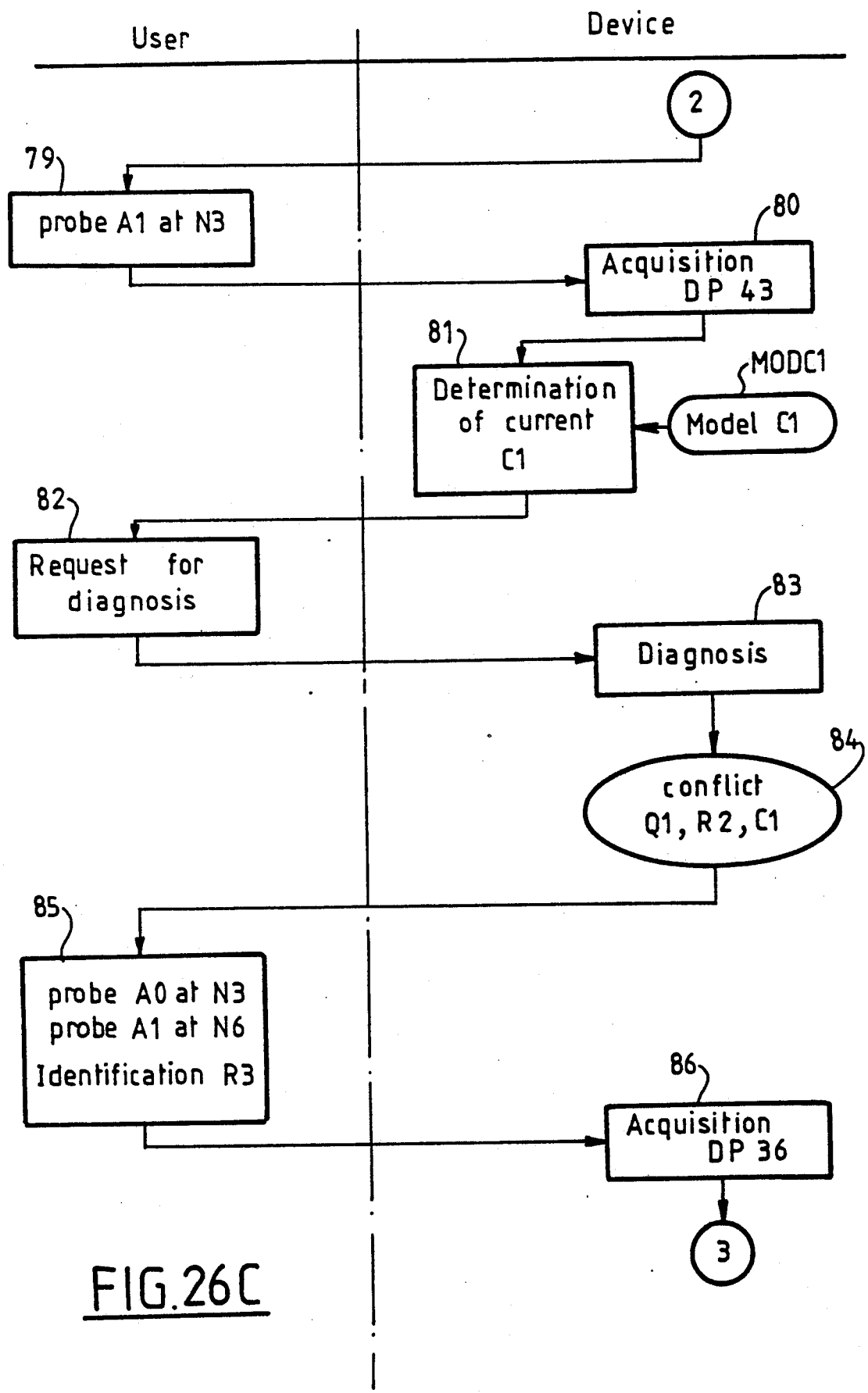
Figure 26D:
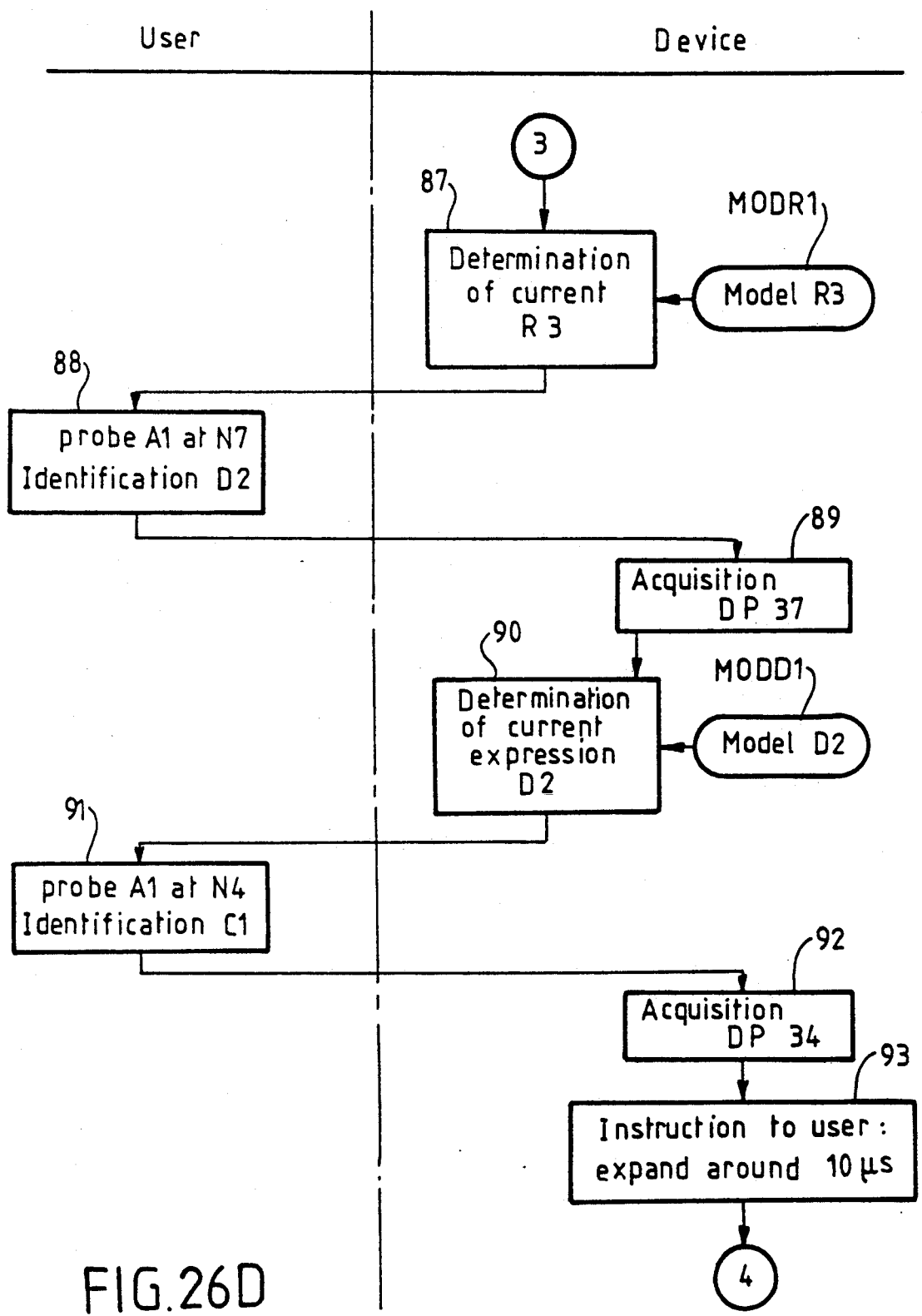
Figure 26E:
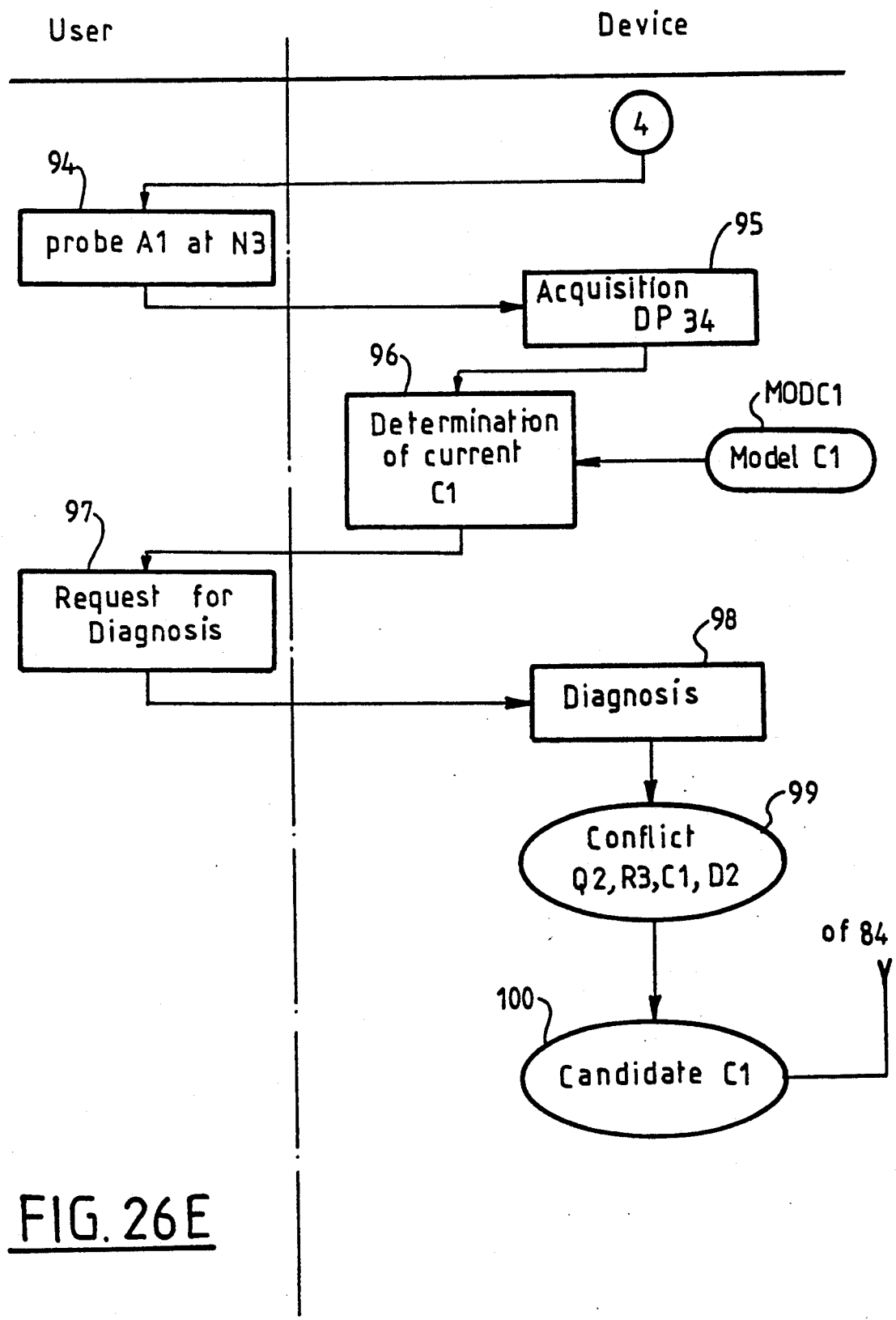
Figure 27:
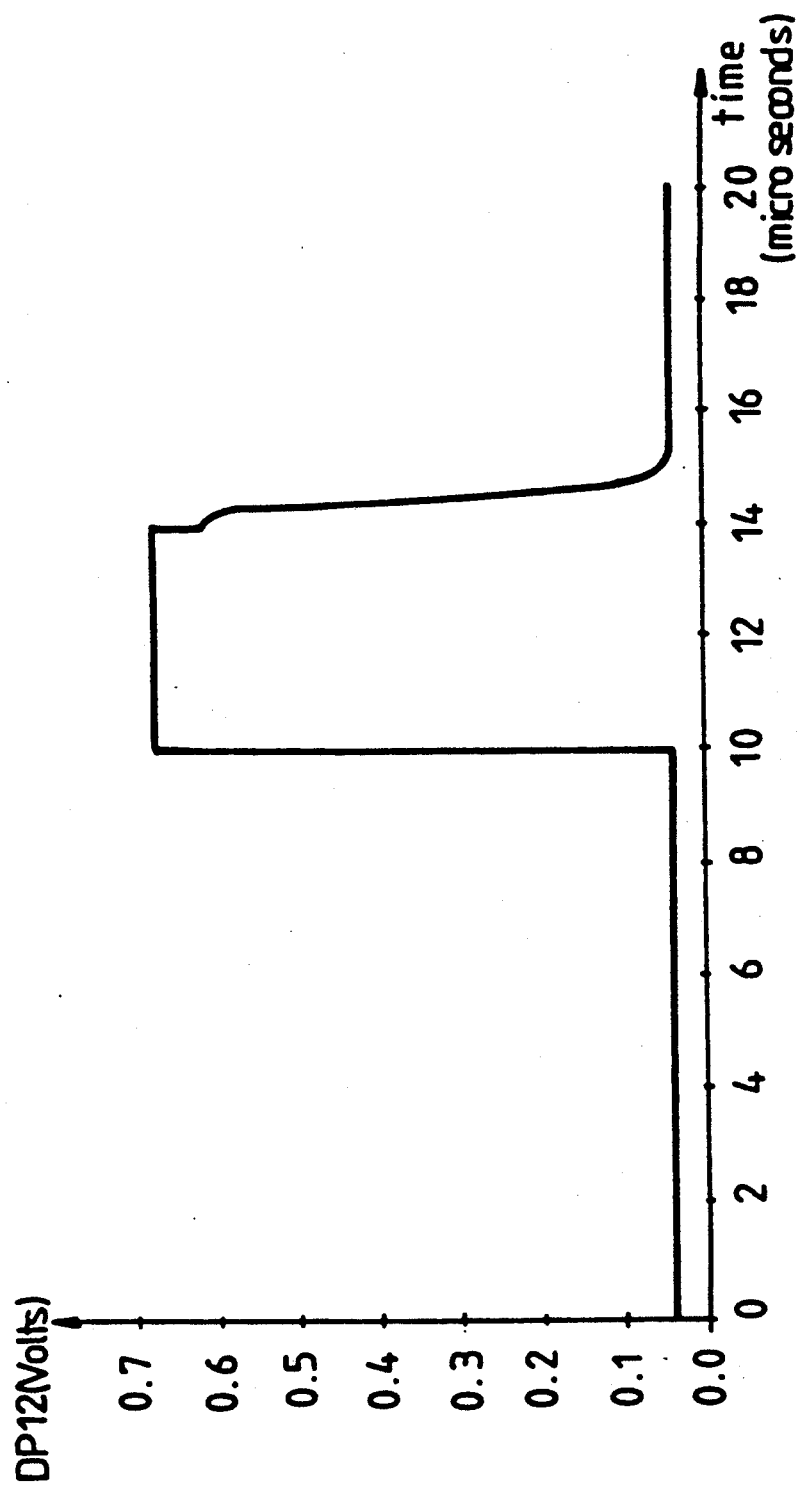
FIGS. 27 to 43 represent curves relating to the testing of the circuit of FIG. 20.
Figure 28:
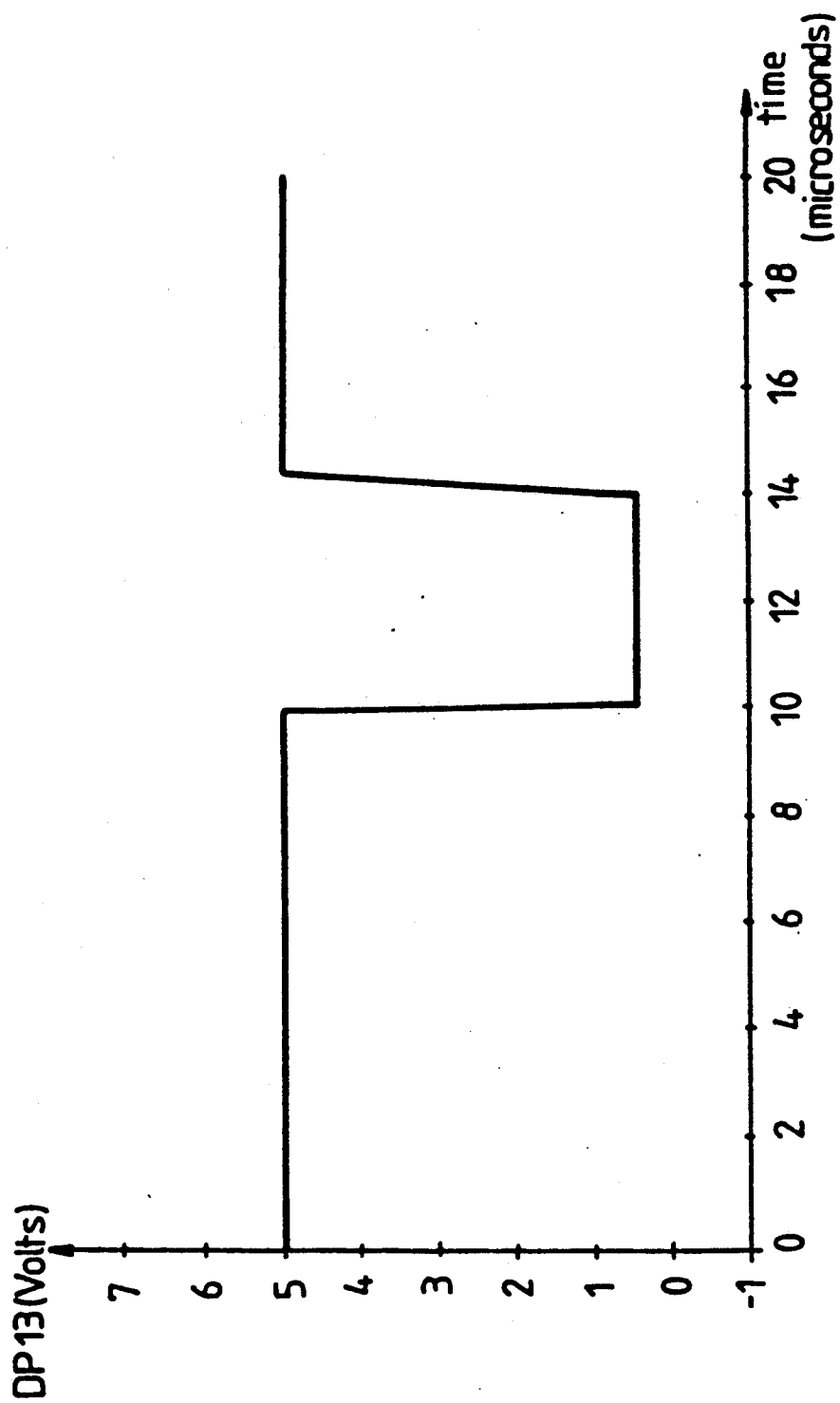

The circuit comprises seven terminals N1 to N7 which are all observable. The time interval chosen is comprised between 0 and 20 microseconds. The wave shape DPEI in the form of a crenelation generated by the test bank BAN is illustrated in FIG. 21. The faulty component is again the capacitor C1 which is cut.

The two transistors Q1 and Q2 of the circuit CI are NPN transistors provided with, viewed from the base (FIG. 22) an entering current Ib, viewed from the collector an entering current Ic, and viewed from the emitter an emerging current Ie. When the voltage $Vbe = Vb - Ve$ between the base and the emitter is greater than or equal to 0.6 volt, the collector current Ic is positive and equal to $\beta$(beta) times the base current Ib where $\beta$ designates the current gain. When the voltage Vbe is less than 0.6 volt, the transistor is blocked and the base current Ib is zero. It is therefore possible to define a first simple model which will be designated "rank 1 model" MODQI and defined by the relations $Ib > 0$; $Ic > 0$.

A model MODQ2 of higher complexity designated a "rank 2 model" may possibly be used if the rank 1 model does not give satisfaction. This rank 2 model defines the various $\beta$ values in the different states of the transistor. It should here be observed that within the meaning of the present description, the term "current expression" may also include a gain in current.

The rank 1 model MODD1, of the diodes D1 and D2 of the circuit is also a model having constraints that have to be met. In effect, if the potential difference VAnK between the anode An and the cathode K of the diode is greater than or equal to 0.6 volt, the current Id passing through this diode is strictly positive. In the opposite case, this current is zero.

The rank 1 models MODCI and MODRI for the capacitor and the resistors R of the circuit (FIGS. 24 and 25) respectively, simply retranscribe the laws of physics governing the formation of the current-voltage parameters.

Reference will now be made more particularly to FIGS. 26A to 26E for describing the various steps in the search for malfunction undertaken by the user. The various potential differences DPij between the terminal i and the terminal j are illustrated in FIGS. 27 to 43, as are the various determinations of the current expressions effected by the processing means.

In step 61, the user chooses the terminal N1 as the first common terminal and places the probe AQ at this terminal. The probe A1 is placed at the terminal N2 and identifies the transistor Q2 by means of the keyboard. The potential difference DP12 is then acquired (step 62, FIG. 27). Because the component is a transistor, the processing means of the device must, at a later time of the processing, necessarily be aware of the potential difference between the collector and the emitter of this transistor. An instruction is therefore displayed on the screen of the device (step 63) for the user to place the probe A1 at N2 (step 64).

In step 65, the potential difference is acquired between the collector and the emitter of Q2, DP13 (FIG. 28) and the processing means can then determine the current expression relating to Q2 (step 66) by taking into account the model MODQ2 as required. It will here be recalled that this current expression corresponds effectively to a constraint.

Figure 29:
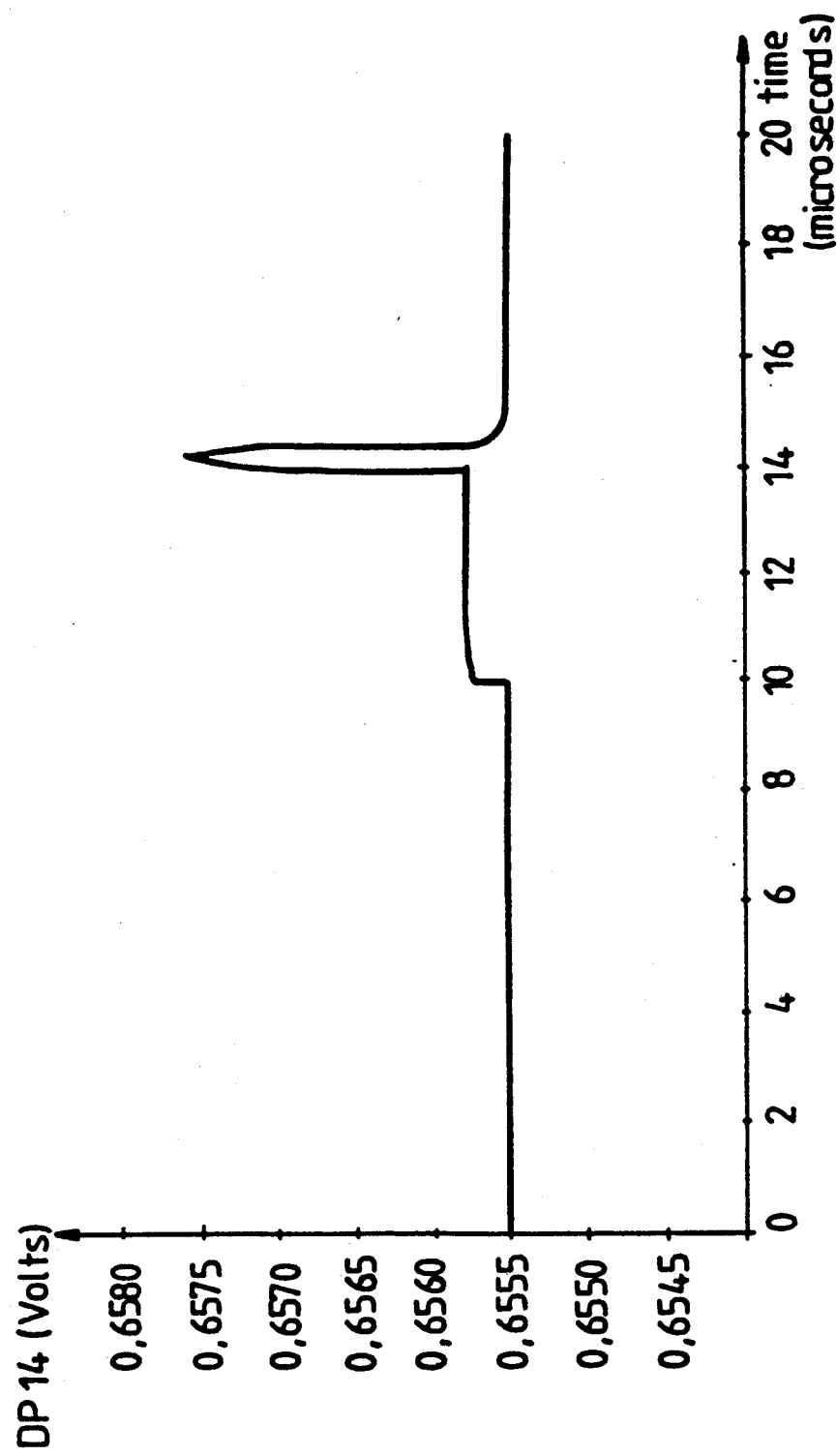

The user continues his operations by placing the probe A1 at another terminal adjoining the common terminal N1, for example at N4 (step 67) and then identifies the transistor Q1. The potential difference DP14 is acquired in step 68 and is illustrated in FIG. 29. An instruction to the user will then be again met with in step 69, similar to the preceding instruction, since one is also concerned with a transistor. In response to this instruction, the user places the probe A1 at the terminal N5 (step 70) and acquires the potential difference DP 15 (step 71, FIG. 30)) to allow the processing means to determine the current expression relating to Q2 (step 72) by still taking into account the model MODQ2.

The set of observations relating to the common terminal N1 is now carried out. However, the user does not ask for a diagnostic display since the terminal concerned is an earth terminal. However, the data obtained by means of these various acquisitions are memorized in the device.

Figure 32:
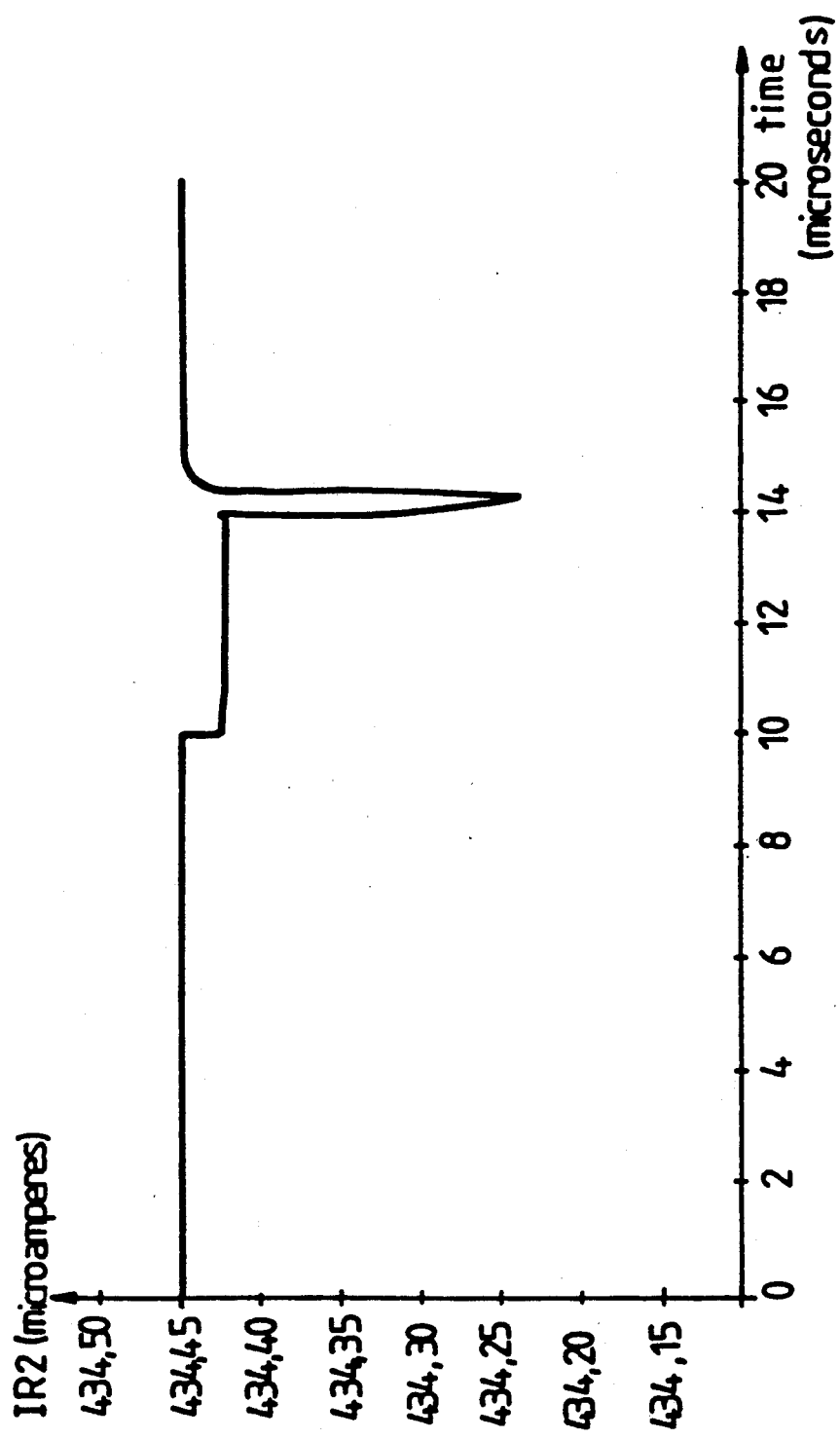

In step 73, the user then chooses a second common terminal N4 from the set of terminals adjoining the first common terminal N1. He places the second probe A1 at the terminal N6 and identifies the resistor R2. The potential difference DP46 is acquired in step 74 (FIG. 31) and the current passing through the resistor R2 is determined in step 75 by means of the model MODRI, and is illustrated in FIG. 32.

Figure 33:
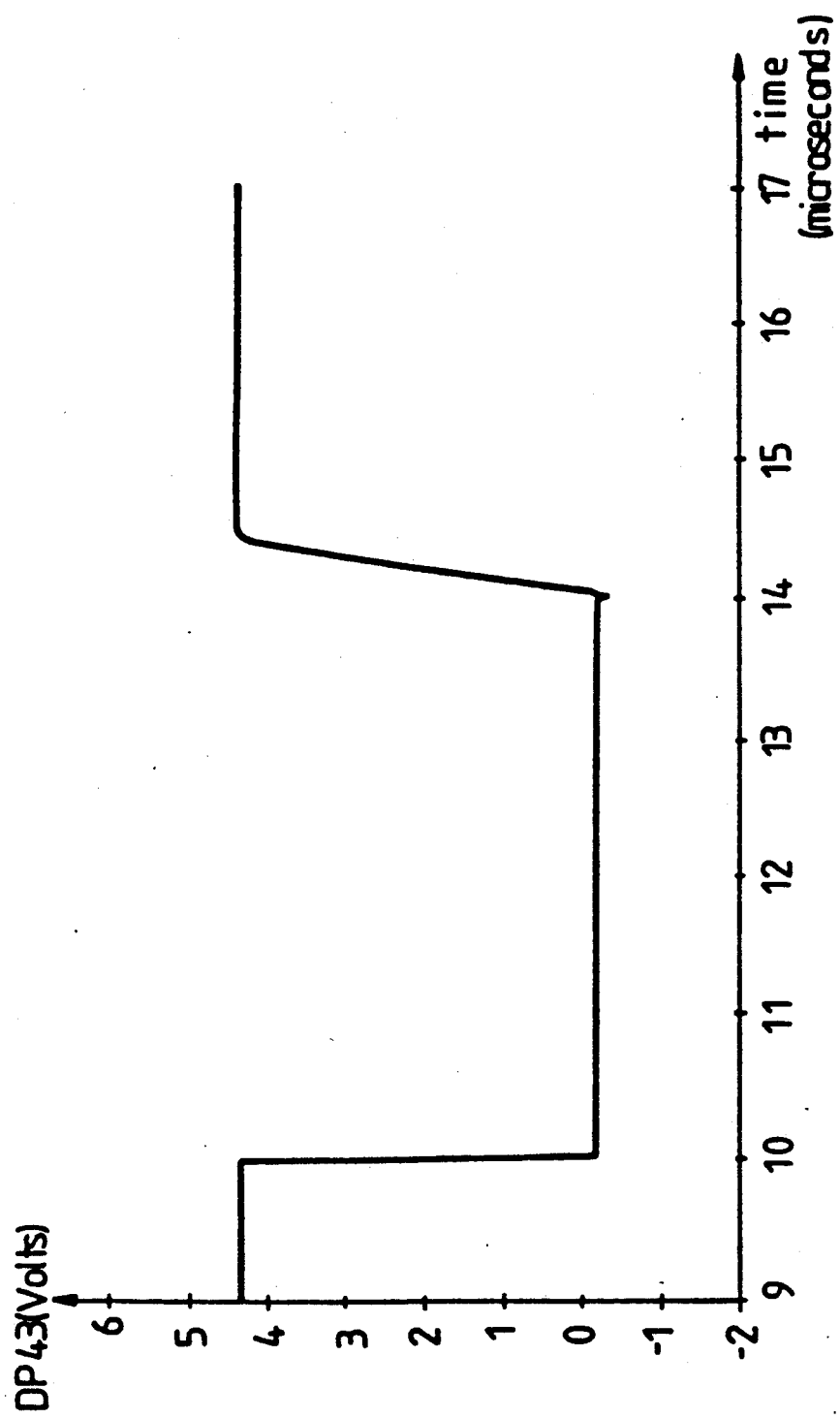
Figure 34:
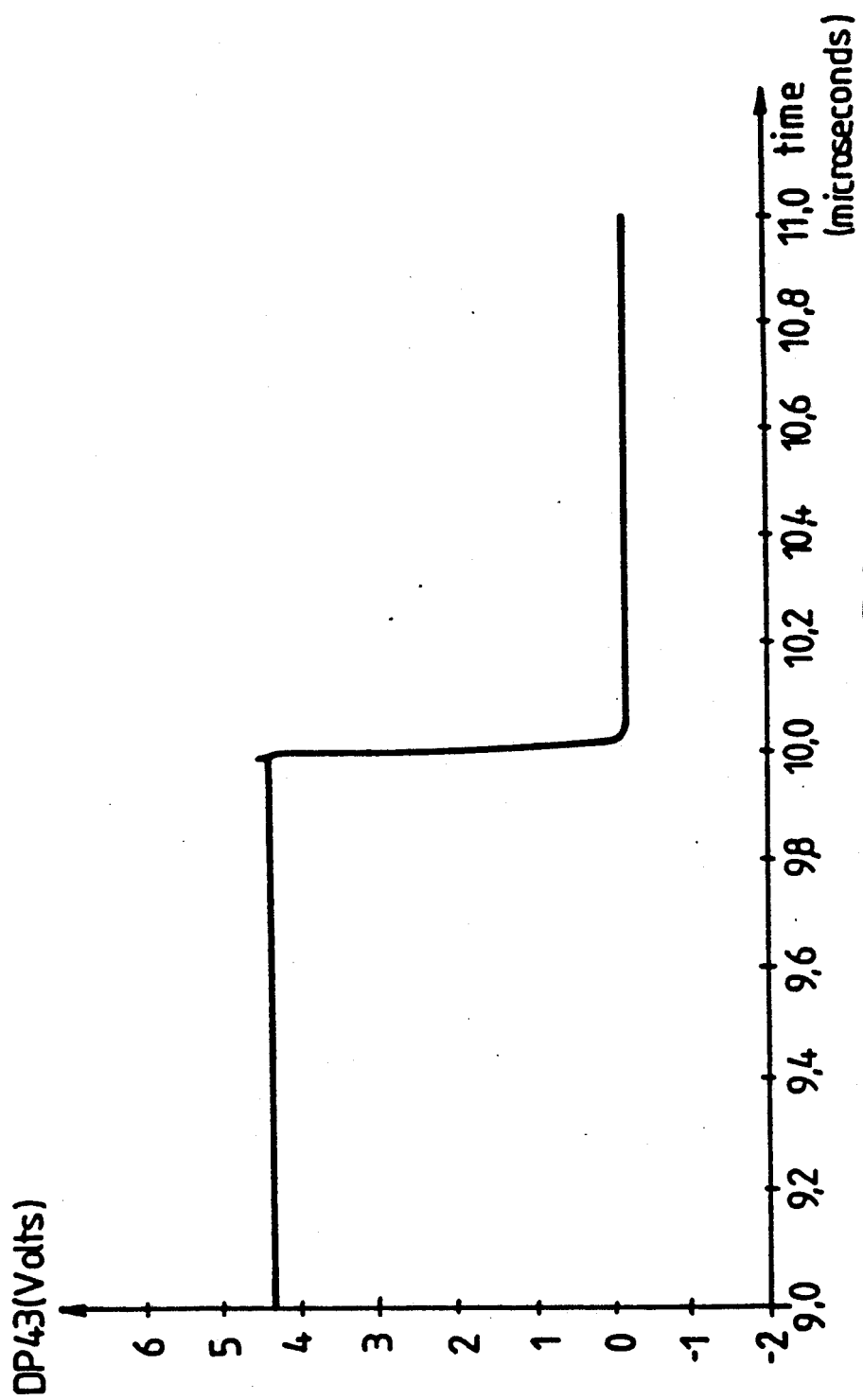
Figure 35:
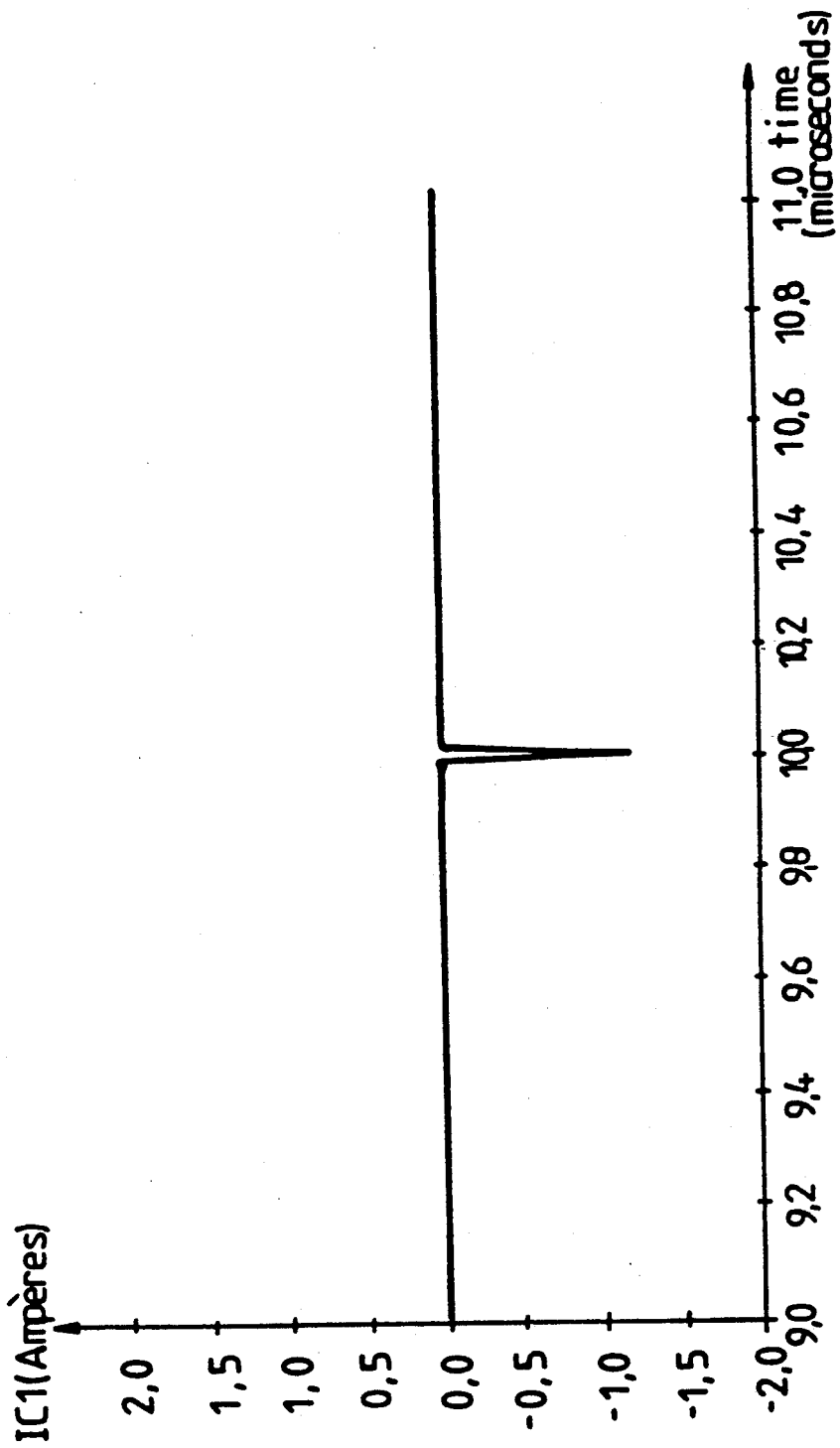
Figure 36:
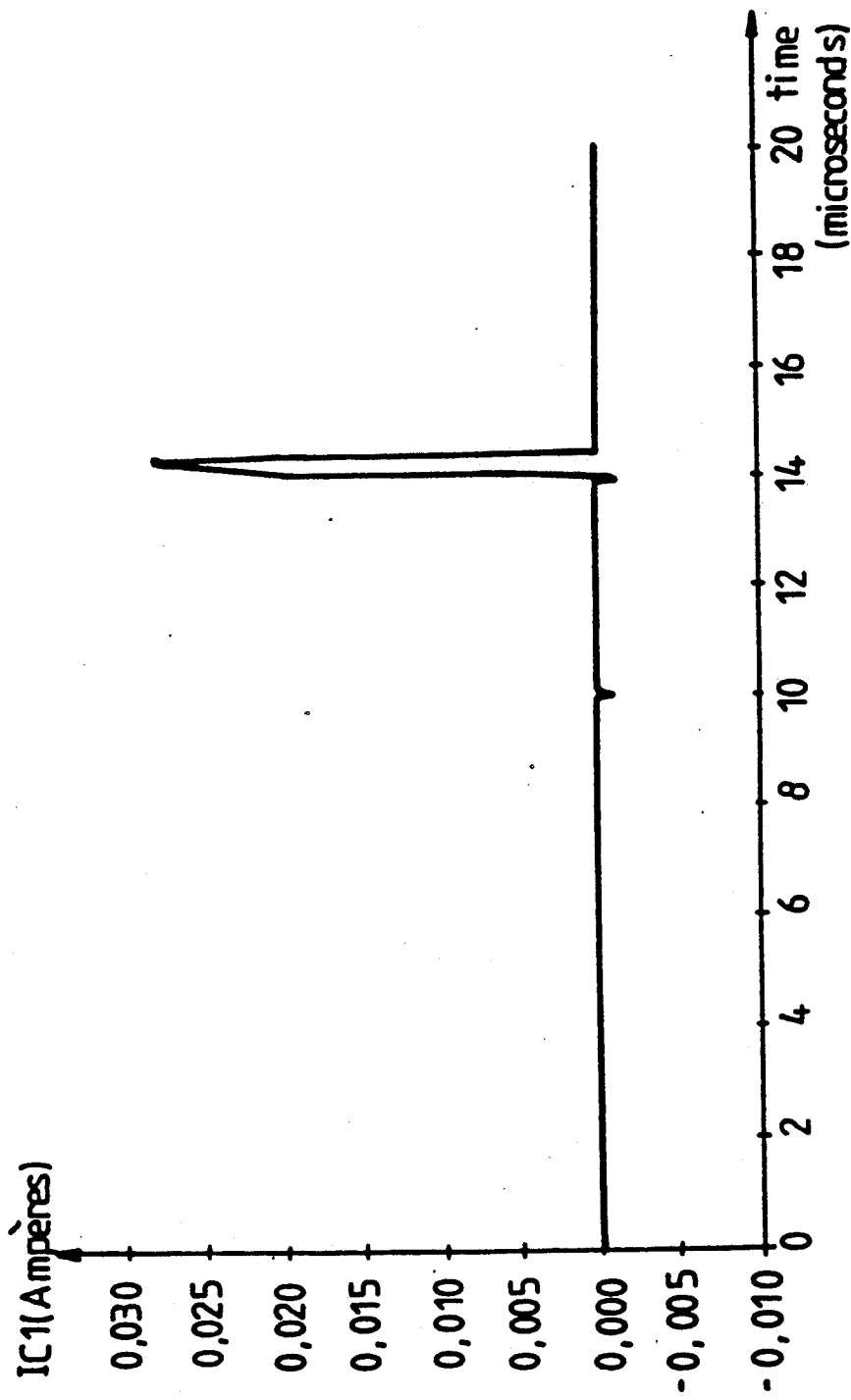
Figure 37:
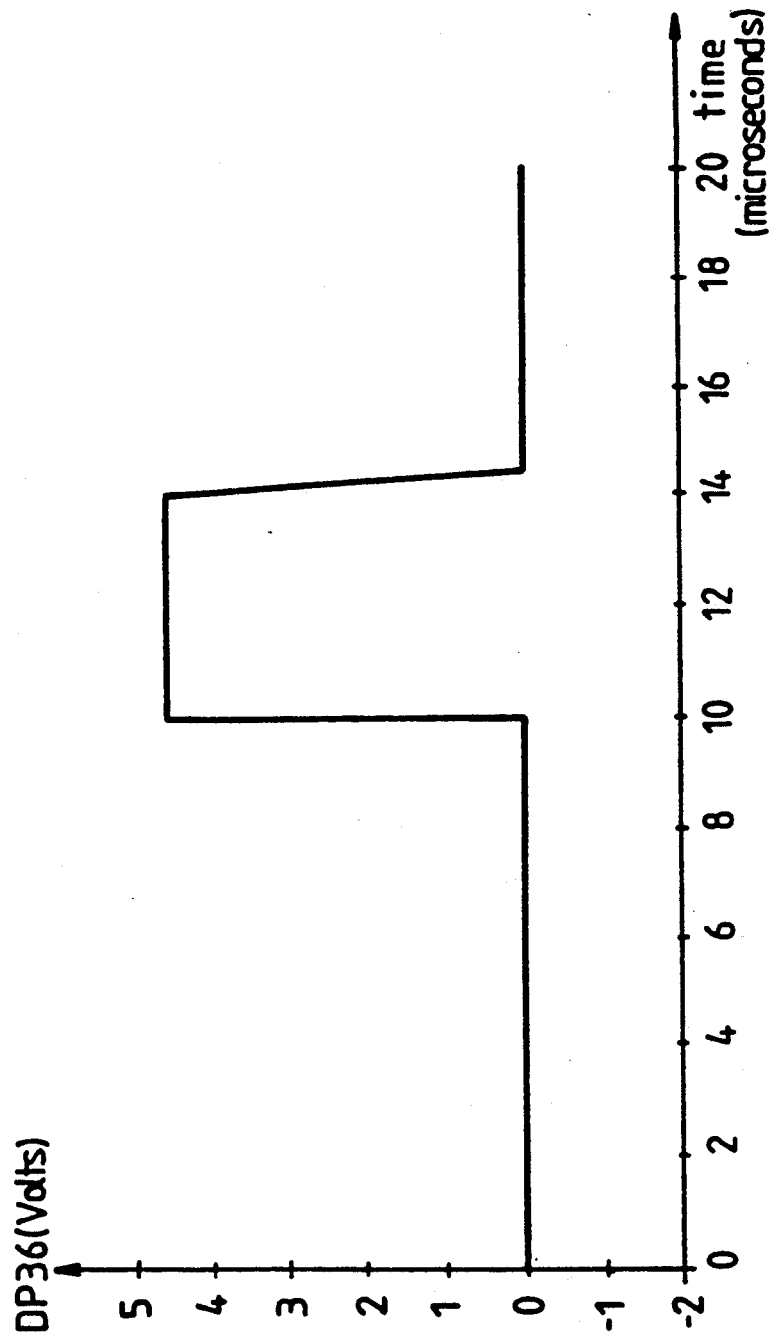
Figure 38:
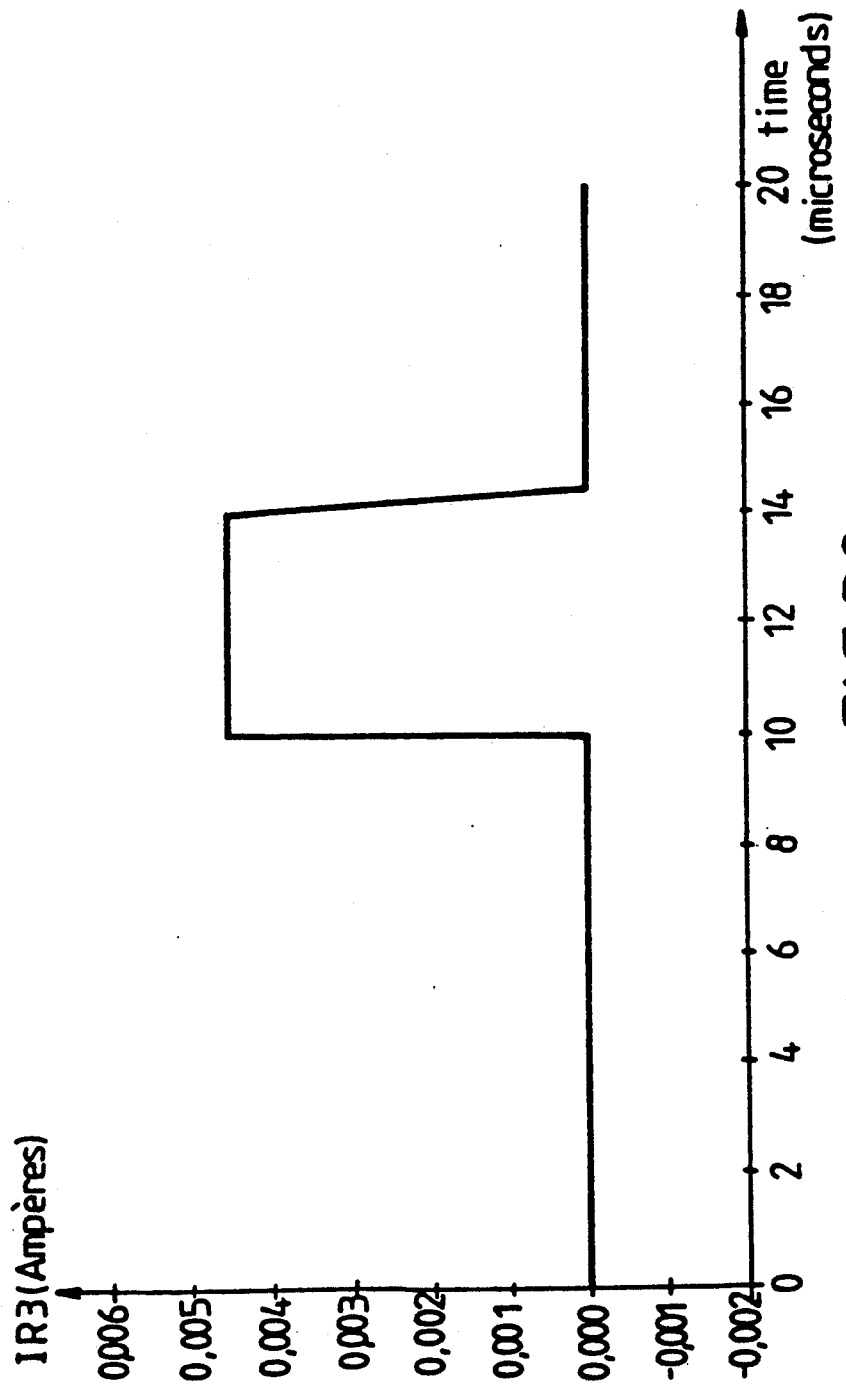
Figure 39:
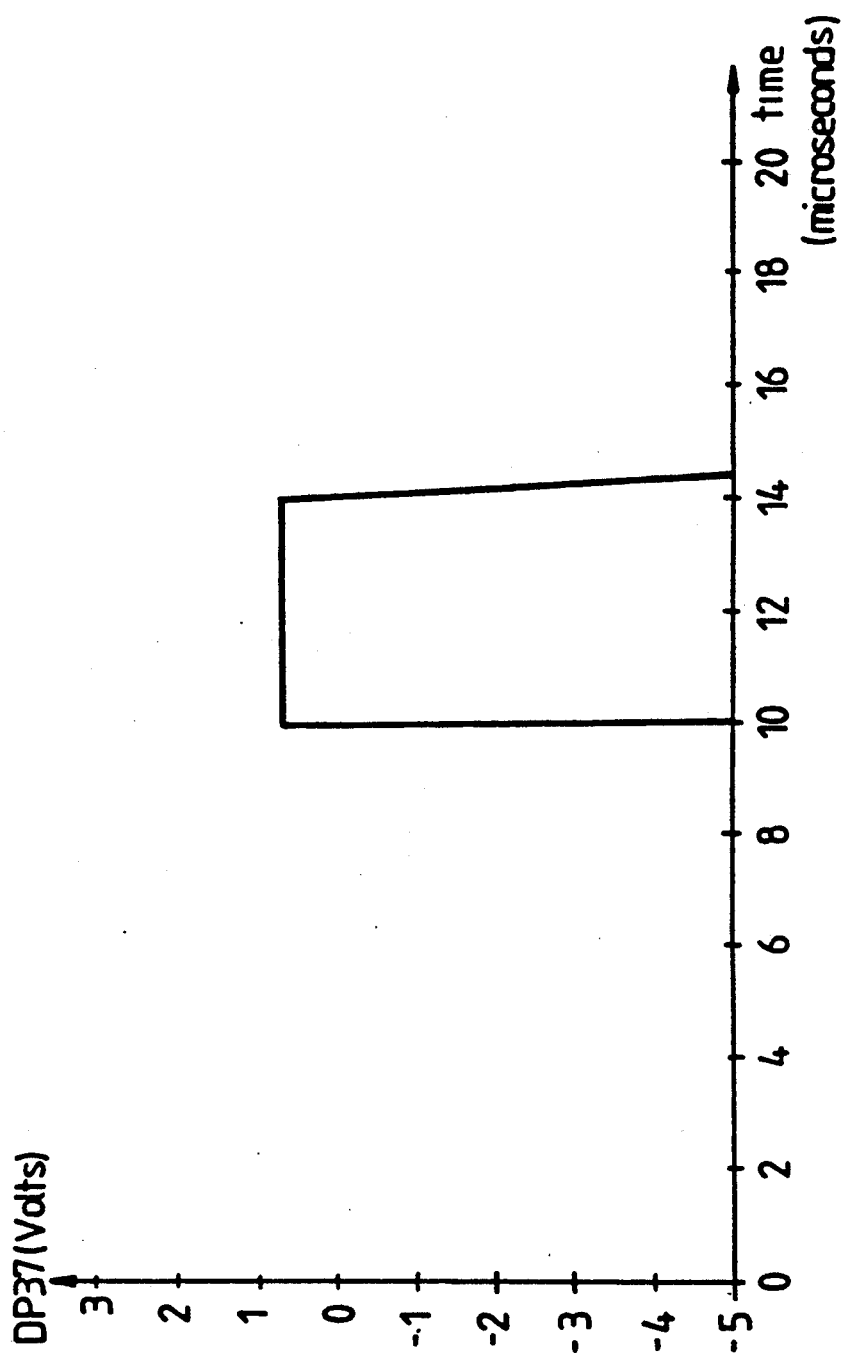
Figure 40:
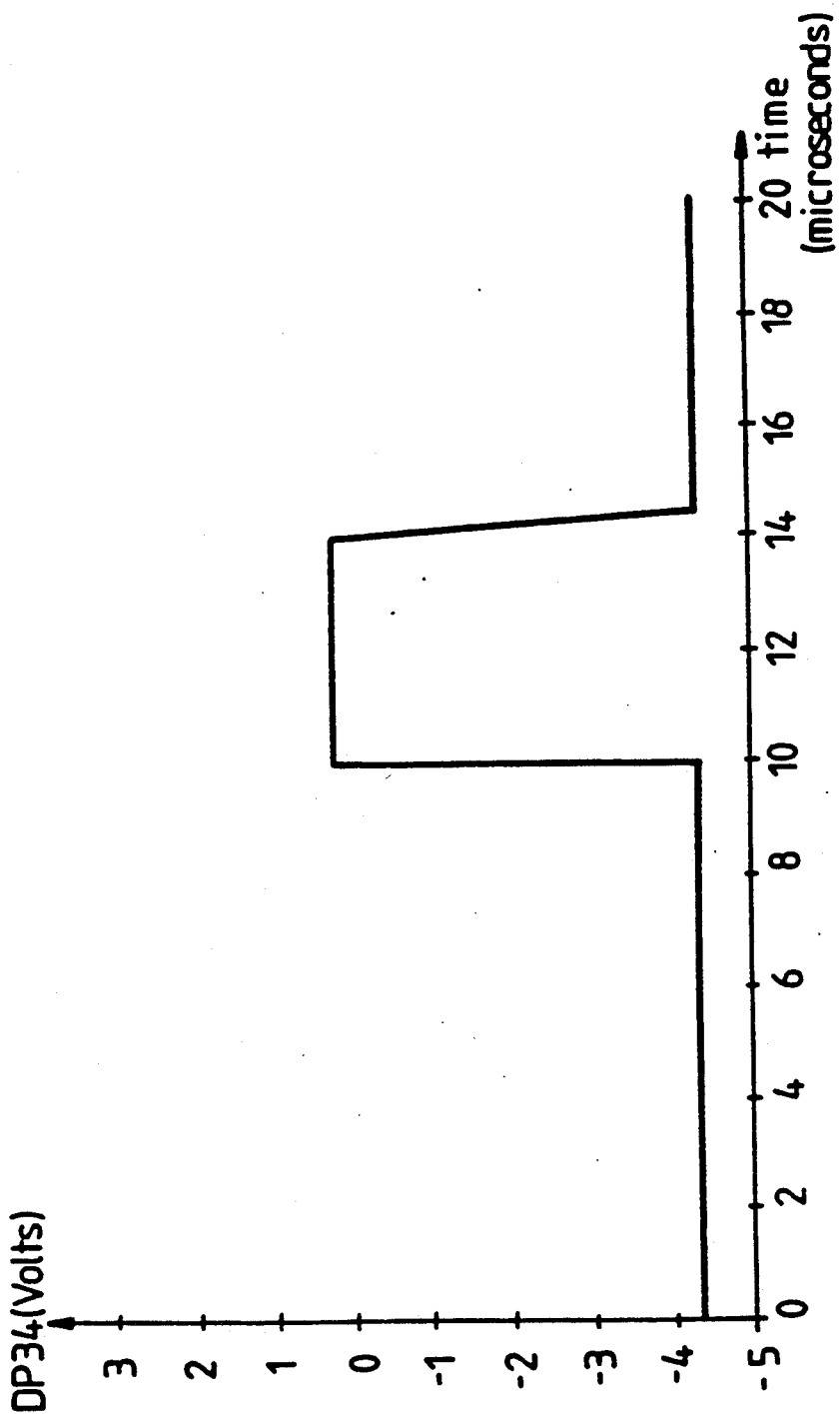
Figure 41:
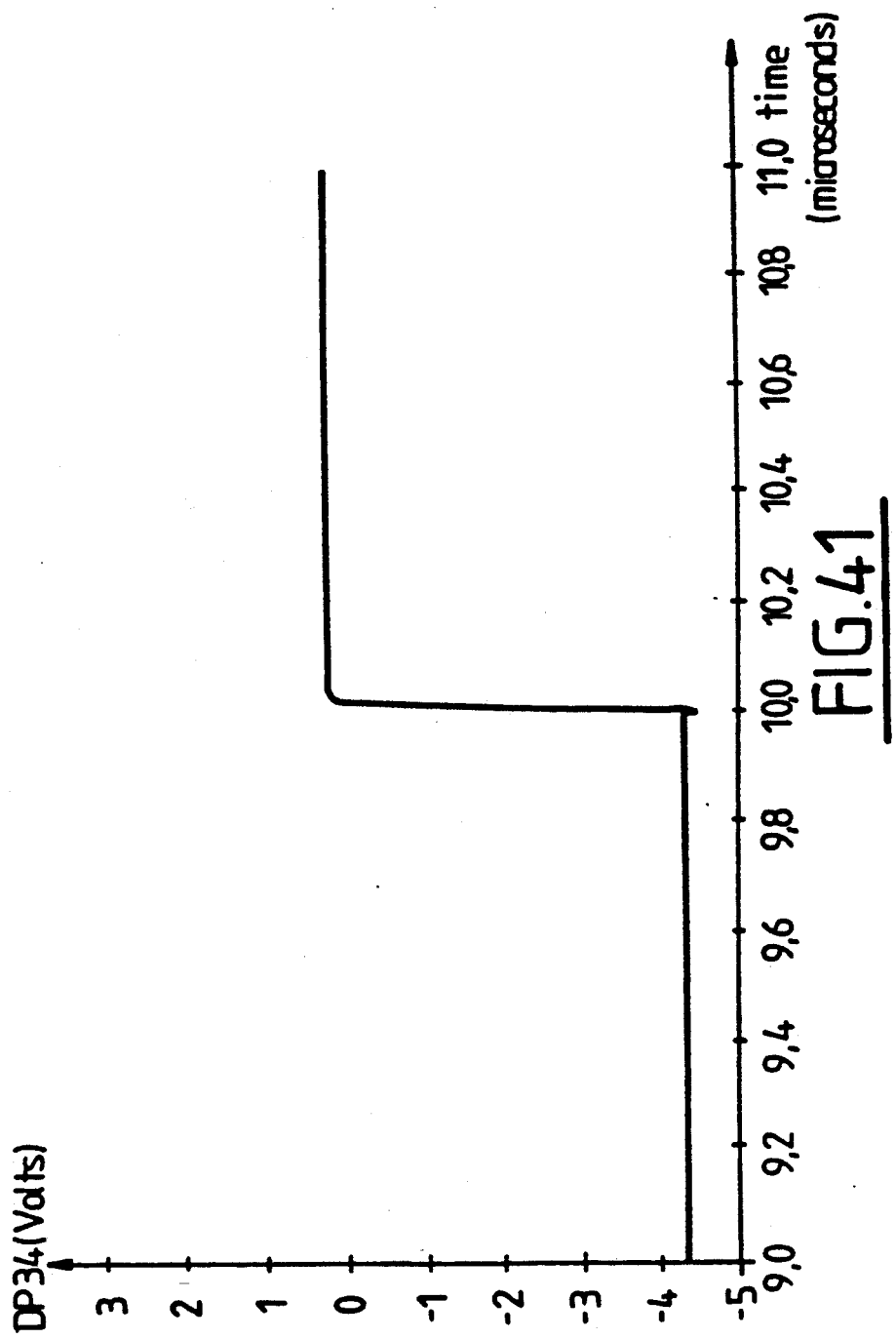
Figure 42:
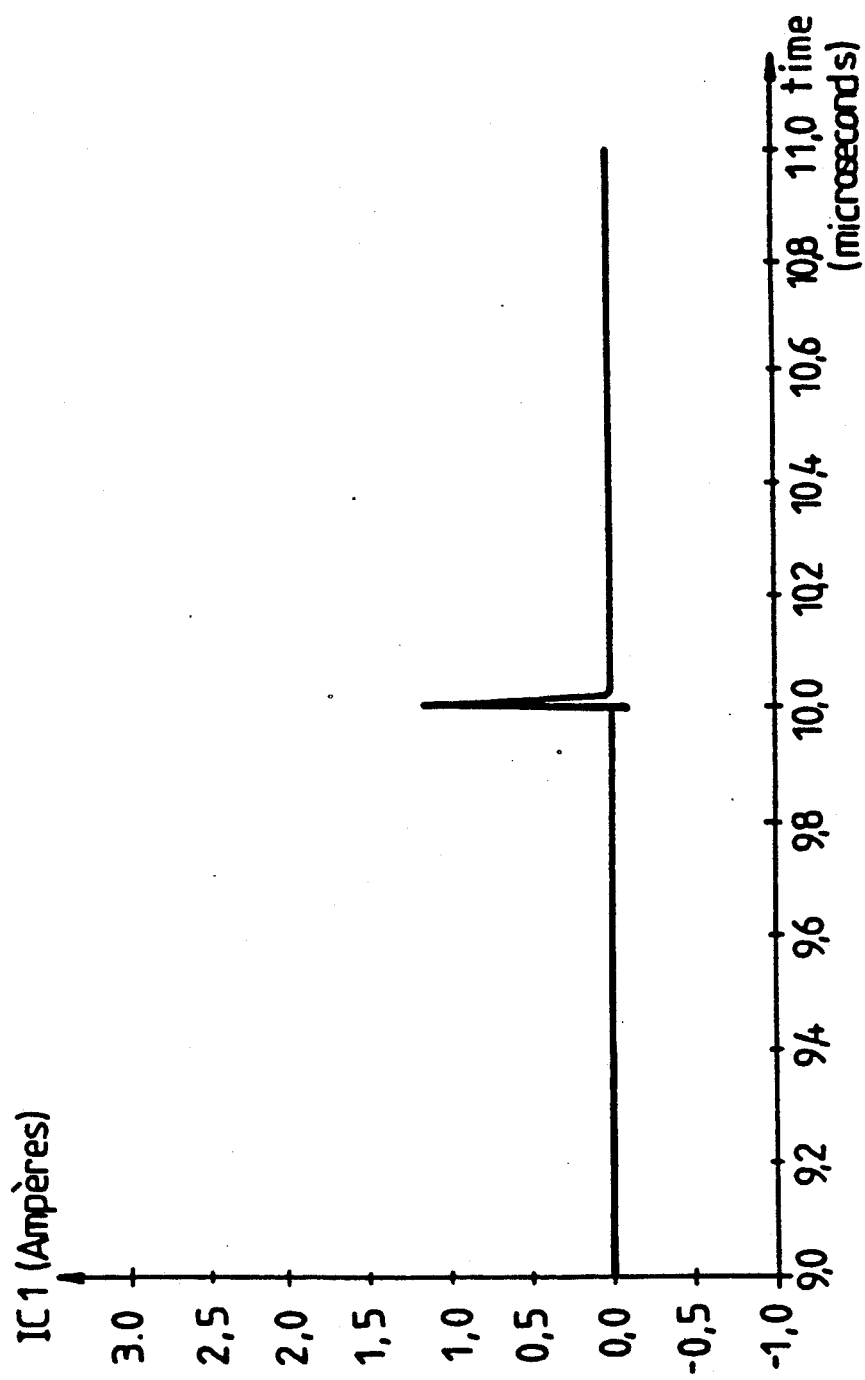
Figure 43:
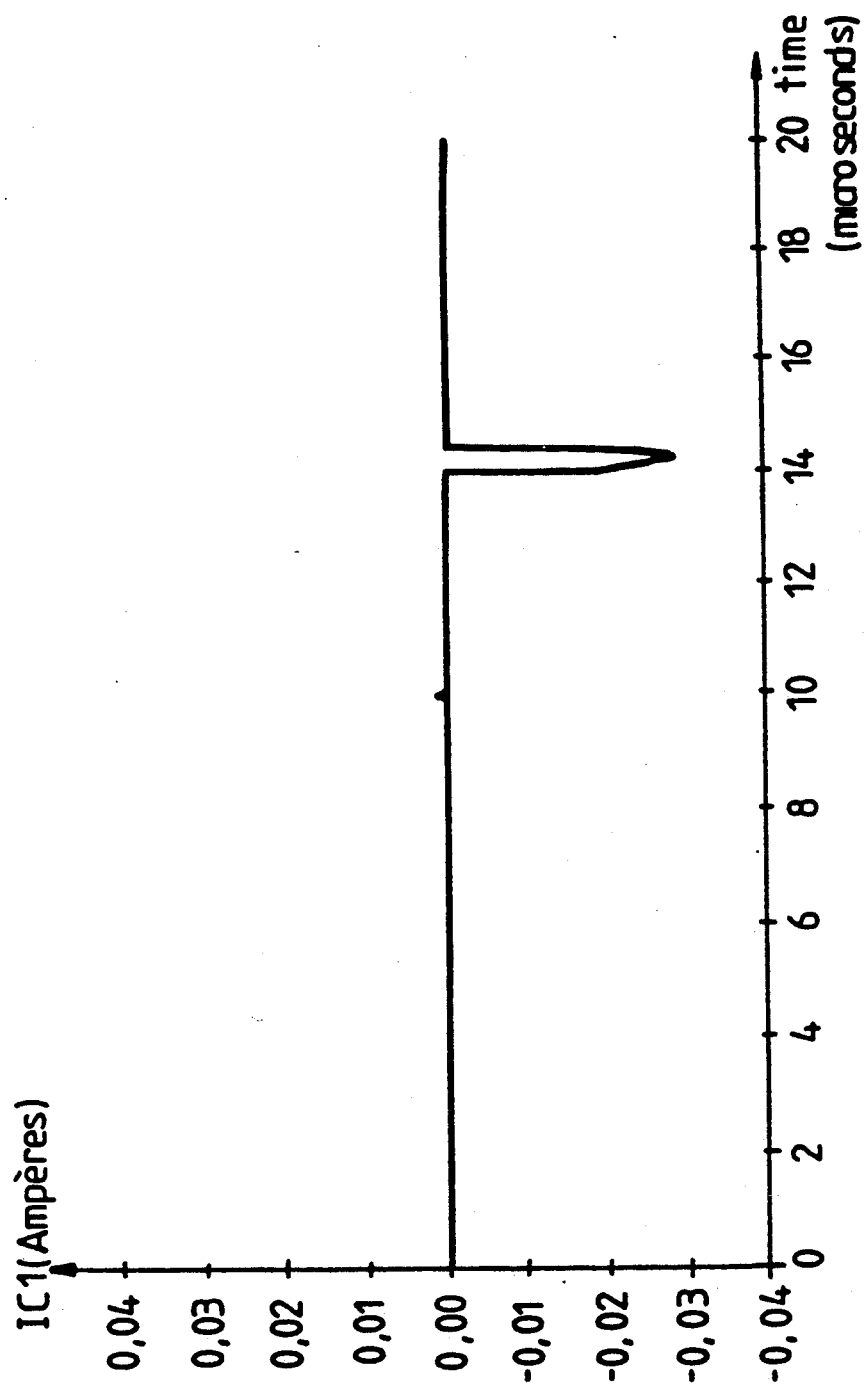

The probe A1 is then placed at the terminal N3 (step 76) and the capacitor C1 is identified. The potential difference DP43 is acquired in step 77 and is illustrated in FIG. 33. However, the capacitor model shows the calculation of a derivative. Now, the curve DP43 of FIG. 33 shows a pronounced drop at about 10 μs. The processing means then estimate that the acquisition pitch is insufficient to obtain the accuracy necessary in the processing. Thus an instruction is given to the user in step 72 to expand the acquisition round 10 μs. The user therefore leaves the probe A1 at the terminal N3 (step 79) and reacquires the potential difference DP43 with a reduced sampling pitch (step 80, FIG. 34). The processing means can then determine the current passing through the capacitor C1 (step 81, FIGS. 35 and 36) by means of the model MODC1.

When the set of measurements relating to the second common terminal N4 has been effected, the user asks for the display of the diagnosis in step 82. This is effected by the processing means (step 83) and is illustrated in greater detail in Annex 2.

In this Annex, the current expressions for the transistors Q1 and Q2 are recalled ((I) and (II)) which would be obtained by using the rank 2 model and which have been stored in the device for possible future use. The diagnosis at the common terminal N4 (III) is reflected by the zero algebraic sum (III.1) of the currents terminating in or emerging from this terminal.

In fact, the proper functional model used for the transistor is here the rank 1 model which is reflected by the expression (III.2). It will here be observed that in this expression, the base current of the transistor Q1 is negative or zero because the direction of this current is then viewed from the terminal N4 and not from the transistor Q1. The expression (III.1) is then reduced to the inequality expression (III.3).

The processing means then determine a sequence of values for the base current IbQI (III.4). It follows therefrom (III.5) that the base current of the transistor Q1 is strictly positive between 10 μs and 10.02 μs. There is therefore a conflict between the components Q1, R2 and C1, which is displayed by the device in step 84.

If a rank 2 model were to be used for the transistor Q1, it would be necessary to determine the collector current IcQ1 of this transistor by the formula:

$$IcQ1 = IR1 + IR4$$

and then the base current IbQ1 by using the the current gain by means of the formula:

$$IbQ1 = IcQ/\beta$$

The user continues his search for the malfunction by choosing the terminal N3 as the third common terminal which is one of the terminals adjoining the second common terminal N4. In steps 85 to 96, he explores the set of terminals adjoining this third common terminal. The various potential differences DP3j and the corresponding current expressions are illustrated in FIGS. 37 to 43. The current expression relating to the diode D2 is represented in the Annex 2 by the relations (IV).

The user then asks for the diagnostic display relating to this common terminal N3 in step 93. In this diagnosis (step 98 and the relations (V), Annex 3), the test of the presumed zero value condition of the total current at the terminal N3 is reflected in the zero algebraic sum of the currents terminating in and emerging from this terminal. However, this is reduced to the expression (V.3) since the collector current of the transistor Q2 must be negative, viewed from the terminal N3. From the set of the relations (V.4) over the time interval 0; 20 μs, it follows (V.5) that the collector current of the transistor Q2 is strictly positive between 14 μs and 14.3 μs. There is therefore a conflict between the components Q2, R3, C1 and D2, which is displayed on the screen in step 99. The processing means deduce therefrom, therefore, by intersecting the two conflicts 84 and 99, that the faulty candidate is the capacitor which is displayed in step 100.

The device has here allowed the malfunction to be located in a flexible and fast way, and this without the user having any knowledge of the functioning modes of the circuit.

The advantages of the device in accordance with the invention are as follows, apart from those already set out:

the diagnosis of the circuit is not limited to continuously observable malfunctions and makes it possible to show malfunctions appearing, for example during transient conditions, by using a diagnosis over a time interval whose duration can be modulated, the nominal behaviour of the network of components does not have to be described, neither do its mode of functioning, or even the symptoms of the malfunction, it is not necessary to make provision for a prior description of the probable malfunctions of the network, reliance on digital modelling improves the focusing range of detectable malfunctions and eliminates the hypothesis that a malfunction must entail a significant variation in the behaviour of the network, the malfunctions deriving from a change in structure such as a short circuit and manufacturing defects such as a component error, are treated like other malfunctions, the device does, of course, allow multiple malfunctions to be identified, the component models, as well as the general law-expressions may refer to non-measurable values that can be estimated.

In general, in an electronic circuit, it is only the potential difference measurements that are accessible. So far, this constraint has accentuated the difficulties of the analysis of the phenomena observed and of the synthesis of the reasoning hypotheses which allow either the malfunction to be located or the search to be continued for this purpose. Now, surprisingly, it has been observed that the sole measurement of the potential difference has, with suitable arrangements, contributed to the solution of the problem posed.

Finally, although it is advantageously used in the field of electronics, the device in accordance with the invention herein described may be used in other fields.

The invention is not limited to the embodiments described above, but includes all the variants defined within the scope of the claims set out below.

Thus here, the current values were estimated. It would also be possible to estimate current expressions such as a current gain for example, or other physical values on the basis of other appropriate models and law expressions.

Of course, some of the means described above can be omitted in the variants where they are not required.

| ANNEX 1 | |
| --- | --- |
| Resistor R1 | 1 kilohm |

-continued
ANNEX 1

| | | |
|---|---|---|
| Resistor R2 | 10 kilohm | |
| Resistor R3 | 1 kilohm | |
| Resistor R4 | 10 kilohm | |
| Resistor R5 | 10 kilohm | |
| Capacitor C1 | 2 nanofarads | |
| Diode D1 | Reference 1N4148 | Company Texas Instruments |
| Transistor Q1 | Reference 2N2222A | Company Texas Instruments |
| Transistor Q2 | Reference 2N2222A | Company Texas Instruments |

ANNEX 2
$\mu s$: microsecond   $\mu A$: microampere   A: ampere (I) Current expression of Q2
  $Ib = 0$   from 0 to 10 $\mu s$
  $30 < \beta < 300$   from 10 $\mu s$ to 14 $\mu s$
  $Ib = 0$   from 14 $\mu s$ to 20 $\mu s$
(II) Current expression of Q1
  $0 < \beta < 30$   from 0 to 20 $\mu s$
(III) Diagnosis at N4
(III.1) $IbQ1 + IR2 + IC1 = 0$
(III.2) $IbQ1 \leq 0$
(III.3) $- IR2 - IC1 \leq 0$
(III.4) $IbQ1 = -(434.45 \mu A + 0)$   from 0 to 10 $\mu s$
  $IbQ1 = -(434.43 \mu A - 1.2 A)$   from 10 $\mu s$ to 10.02 $\mu s$
  $IbQ1 = -(434.43 \mu A + 0)$   from 10.02 $\mu s$ to $(14 - \epsilon) \mu s$
  $IbQ1 = -(434.30 \mu A + 15\,000 \mu A)$   to $(14 + \epsilon) \mu s$
  $IbQ1 = -(434.24 \mu A + 27\,000 \mu A)$   to 14.03 $\mu s$
  $IbQ1 = -(434.43 \mu A + 0)$   from 16 $\mu s$ to 20 $\mu s$
(III.5) $IbQ1 > 0$ between 10 $\mu s$ and 10.02 $\mu s$

ANNEX 3
$\mu s$: microsecond   mA: milliampere (IV) Current expression of D2
  $ID2 = 0$   from 0 to 10 $\mu s$
  $ID2 > 0$   from 10 to 14 $\mu s$
  $ID2 = 0$   from 14 to 20 $\mu s$
(V) Diagnosis at N3
(V.1) $IcQ2 + IR3 + IC1 + ID2 = 0$
(V.2) $IcQ2 < 0$
(V.3) $- IR3 - IC1 - ID1 \leq 0$
(V.4)
  $IcQ2 = -(0 + 0 + 0)$   from 0 $\mu s$ to $(10 - \epsilon) \mu s$
  $IcQ2 = -(4.5 mA + 0 + ID2)$ and $ID2 > 0$   to 10 $\mu s$
  $IcQ2 = -(4.5 mA + 1.2 + ID2)$ and $ID2 > 0$   to 10.02 $\mu s$
  $IcQ2 = -(4.5 mA + 0 + ID2)$ and $ID2 > 0$   from 10.03 $\mu s$ to 14 $\mu s$
  $IcQ2 = -(0 - 27 mA + 0)$   to 14.3 $\mu s$
  $IcQ2 = -(0 + 0 + 0)$   from 14.5 $\mu s$ to 20 $\mu s$
(V.5) $IcQ2 > 0$   between 14 $\mu s$ and 14.3 $\mu s$ I/We claim:

1. An electronic device for testing a network of components, comprising
   (A) interface means comprising
      (Aa) means for defining sampling instants in a chosen time interval,
      (Ab) means for identifying at least one component of the network,
      (Ac) probe means for the acquisition of a physical value relating to the state of functioning of this component, and
      (Ad) means cooperating with the probe for providing a series of samples of this physical value within the chosen time interval;
   (B) a functional models memory contains component expressions relating to physical values concerning at least one particular kind of component;
   (C) a values memory for storing several sample series of physical values corresponding to the same time interval but relating to different components of said network; and
   (D) processing means connected to said values memory and to said functional models memory and to said interface means for effecting a processing procedure comprising an estimation of the physical values over said time interval, taking into account the expressions contained in said models memory and the acquired samples and their storage in the values memory, as well as tests on the values contained in the values memory,
      wherein said functional models memory further contains law-expressions representing general relationships between physical values;
      wherein at least some of said acquired samples are stored in said functional models memory with precision brackets;
      wherein the expressions for functional models stored in said functional models memory are at least in part provided with uncertainty brackets;
      wherein any estimation is stored in said functional models memory with its estimated uncertainty bracket deriving from at least some of said uncertainty brackets and said precision brackets; and
      wherein when said functional models memory contains, for at least some of the sampling instants, a first bracket and a second bracket of different origins for the same physical value established on the basis of the contribution of a primary set of components, these two brackets are compared, and the processor means is adapted for deducing therefrom first information regarding the functioning of the components of this primary set.

2. A device according to claim 1, wherein each of the first and second brackets belongs to a group of brackets comprising estimated precision brackets and estimated uncertainty brackets.

3. A device according to claim 2, wherein some at least of the component models comprise at least one reference bracket referring to the particular physical values relating to these components, and
   wherein said group of brackets further comprises the reference bracket or brackets.

4. A device according to claim 1, wherein said means for defining the sampling instants are controllable.

5. A device according to claim 1, wherein component-expressions contained in said functional models memory refer to a correct functioning of the components.

6. A device according to claim 1, wherein, when said first and second brackets are disjoint over at least a significant fraction of said time interval, said first information represents an incorrect functioning of at least one component of said primary set of components.

7. A device according to claim 6, wherein said processing means is such that, when a primary set of components has led to the obtaining of two disjoint brackets and to the satisfying of a predetermined condition, said processing means effects a selective acquisition of physical values relating to certain components of said primary set.

8. A device according to claim 6, wherein, when two different primary sets have led to the obtaining of two disjoint brackets, the component or components suspected of an incorrect functioning appertains to the intersection of said two primary sets.

9. A device according to claim 8 wherein said processing means is operative to effect the processing at least until two primary sets are obtained whose intersection comprises a single component.

10. A device according to claim 6, wherein said significant fraction of the time interval comprises a predetermined number of successive sampling instants.

11. A device according to claim 10, wherein said predetermined number is at least two.

12. A device according to claim 1, wherein, when said first and second brackets have an intersection bracket that is not empty, this intersection bracket is assigned to said physical value on a priority basis.

13. A device according to claim 1, wherein said processing means are capable of an estimation for at least some of the components of at least one physical value belonging to the group comprising :
the physical values of a kind different from those already respectively acquired for these components, and
the physical values already respectively acquired for these components;
and wherein said estimation is obtained on the basis of at least one of the values of said values memory.

14. A device according to claim 1, wherein, for an estimated physical value obtained on the basis of a formulation relying on the intervention of a plurality of different physical values, the said formulation is arranged so as to mention each different physical value only once.

15. A device according to claim 1, further comprising a memory capable of memorizing the network configuration.

16. A device according to claim 15, wherein said processing means includes a decision-making mechanism connected to the structure of said network, said decision making mechanism comprising a first mechanism referring to the determination of the choice and order of the components in respect of which the various physical values will be acquired, and a second mechanism referring to the estimations of the physical values.

17. A device according to claim 16, wherein said network of components comprises a plurality of grids and wherein said second mechanism comprises:
for a component of a grid that has given rise to an acquisition of a physical value of a chosen kind, an estimation of at least one physical value of a kind different from that of the chosen kind, taken from a functional model of said component and from samples of said acquired physical value,
for a component that has not given rise to an acquired physical value of a chosen kind and belonging to said grid or directly connected to a component of said grid, an estimation of at least one of the group comprising at least one physical value of the same kind as the kind chosen, and at least one physical value of a different kind, obtained on the basis of values already stored in the values memory and associated with at least one component of said grid.

18. A device according to claim 11, wherein said processing means includes a decision-making mechanism connected to the structure of said network, said decision making mechanism comprising a first mechanism referring to the determination of the choice and order of the components in respect of which the various physical values will be acquired, and a second mechanism referring to the estimations of the physical values; and wherein said second mechanism is capable of using said intersection bracket for other estimations of physical values.

19. A device according to claims 16, wherein said network of components comprises a plurality of grids, and wherein said first mechanism comprises a first decision making criterion relating to the selection of a grid within which at least one physical value will be acquired.

20. A device according to claim 19, wherein said first criterion comprises a first subcriterion relating to the number of physical values already known within each said grid.

21. A device according to claim 20, wherein in the case of a possible selection of at least two grids according to said first subcriterion, said first criterion comprises a second subcriterion relating to the number of the components of said at least two grids.

22. A device according to claim 21, wherein said second subcriterion comprises the preferential selection of a said grid according to its number of components taken in the order of 3, 4, 2.

23. A device according to claim 21, wherein in the case of a possible selection of at least two said grids according to said second subcriterion, said first criterion comprises a third subcriterion relating to the kind of components of these said at least two grids.

24. A device according to claim 17, wherein within a selected said grid, said first mechanism comprises a second decision making criterion relating to the kind of components of said selected grid.

25. A device according to claim 1, wherein said network of components is an electronic circuit.

26. A device according to claim 25, wherein the acquired physical values belong to the group comprising current expressions and potential differences.

27. A device according to claim 26, wherein the estimated physical values belong to the group comprising current expressions and potential differences.

28. A device according to claim 23, wherein said network of components is an electronic circuit, and wherein the grid selected according to the third subcriterion is the one having the greatest number of passive components.

29. A device according to claim 24, wherein said network of components is an electronic circuit and wherein said second decision-making criterion comprises the acquisition of a potential difference preferentially at the terminals of a passive said component.

30. A device according to claim 29, characterized in that where there are several said passive components, the potential difference is preferentially acquired at the terminals of a dipole.

31. A device according to claim 6, wherein said network of components comprises an electronic circuit, and wherein the acquisition of a potential difference is effected at the terminals of components of the primary set in respect of which this acquisition has not yet already been effected, unless said primary set only comprises components connected to a common terminal.

32. A device according to claim 25, wherein said processing means is operative to effect processing which comprises:

for at least some of the components of the circuit, on the basis of the acquisition of a potential difference between a first and a second terminal of one of these components, the estimation of the potential difference between the second and first terminals, and the estimations of the currents at each of these two terminals, for a component having one terminal connected to a nodal point of the network to which there are also connected the respective terminals of other components in respect of which the respective currents at said respective terminals are known, the estimation of the current at the terminal of the said component, for a component belonging to a grid whose potential differences at the terminals of the other components of said grid are known, the estimation of the potential differences at the terminals of this component.

33. A device according to claim 25, wherein said law-expressions take into account at least one rule based on:
the zero value of the total current at a nodal point of the circuit, and
the zero value of the sum of potential differences along one grid.

34. A device according to claim 25, wherein one of the physical values lending itself to a comparison of the two brackets belongs to the group comprising the emitter current of a transistor, its base current, its collector current, and the potential differences between two of its three terminals.

35. A device according to claim 25, wherein one of the physical values lending itself to a comparison of the two brackets is the current passing through a semiconductor junction.

36. A device according to claim 35, wherein said semiconductor junction is a diode.

37. A device according to claim 25, wherein one of the physical values lending itself to a comparison of the two brackets is the potential difference at the terminals of a passive component.

38. A device according to claim 37, wherein said passive component is a resistor.

39. A device according to claim 23, wherein:
(i) said probe means is capable of picking up a potential difference between two chosen terminals of the circuit, said identification means identifying at least one component connected between said two chosen terminals;
(ii) said values memory is capable of storing several potential differences corresponding to the same time interval, taken between a first common terminal and various terminals adjoining the latter;
(iii) said processing means is operative for effecting for each potential difference, an estimation of a current expression taken from the functional model of the component concerned over said time interval; and
(iv) said processing means is capable of testing, on the set current expressions at each moment of said time interval, a condition taking into account the presumed zero value of the total current in said first common terminal, this test giving a first indication regarding the functioning of the components connected to said first common terminal.

40. A device according to claim 39, wherein at least some of the current expressions are current values; and wherein the test of the set of current expressions comprises the algebraic sum of said current values.

41. A device according to claim 39, wherein said first indication represents an incorrect functioning of at least one component connected to said first common terminal, the set of these components having an incorrect functioning mode overall.

42. A device according to claim 39, wherein said first indication represents a respective individual incorrect functioning of a plurality of components connected to the said first common terminal, the set of the components connected to this common terminal having a correct functioning mode overall.

43. A device according to claim 39, wherein said functional models memory contains functional models representing a correct functioning for at least some of the components connected to said first common terminal.

44. A device according to claim 39, wherein said functional models memory contains functional models representing an incorrect functioning for at least some of the components connected to said first common terminal.

45. A device according to claim 42, wherein said functional models memory contains functional models representing a correct functioning for at least some of the components connected to said first common terminal; wherein each current expression relating to each component connected to the first common terminal is taken from a functional model representing a correct functioning; and wherein the condition taking into account the presumed zero value of the total current at said first common terminal is fulfilled.

46. A device according to claim 41 wherein said functional models memory contains functional models representing a correct functioning for at least some of the components connected to said first common terminal; wherein said functional models memory contains functional models representing an incorrect functioning for at least some of the components connected to said first common terminal; wherein a single current expression is taken from a functional model representing an incorrect functioning of the corresponding component connected to said common terminal, whilst the other current expressions relating to the other components are taken respectively from the functional model representing correct functioning modes; and wherein the presumed zero value of the total current at said first common terminal is fulfilled.

47. A device according to claim 41, wherein said functional models memory contains functional models representing a correct functioning for at least some of the components connected to said first common terminal; wherein each current expression relating to each component connected to said first common terminal is taken from a functional model representing correct functioning modes; and wherein the test of the condition taking the presumed zero value of the total current is negative.

48. A device according to claim 47, wherein said processing means is capable of testing a second condition taking into account the presumed zero value of the total current at a second common terminal chosen from the terminals adjoining the first common terminal, this test giving a second indication regarding the functioning of the components connected to said common terminal; and wherein the combination of the first and second indications is capable of giving a third indication regarding the functioning of a component connected between the first and second common terminals.

49. A device according to claim 39, wherein said functional models memory contains component-expressions of different complexities.

50. A device according to claim 39, wherein the test of said condition taking into account the presumed zero value of the total current at said common terminal comprises the comparison of an algebraic value with a reference value.

51. A device according to claim 39, wherein said probe means comprise two separate probes capable of being placed respectively at two terminals of the circuit.

52. A device according to claim 39, wherein said processing means is capable of memorizing the characteristics of the common terminal used for said acquisition as well as the characteristics of the components connected thereto, which allows a representation of the circuit to be built up on an incremental basis.

53. A device according to claim 1, wherein said interface means comprise dialogue means for dialogue with a potential user.

54. A device according to claim 53, wherein said processing means is capable of elaborating instructions for use and of communicating them by said dialogue means.

55. A device according to claim 53, wherein said functional models memory is capable of receiving particular functional models capable of being communicated to the processing means by said dialogue means.

56. A device according to claim 1, further comprising a separate acquisition device incorporating said probe means and including a digital link for connecting said acquisition means to said processing means.

57. A method of testing a network of components using an electronic device, comprising the steps of:
(Aa) defining sampling instants in a chosen time interval,
(Ab) identifying at least one component of the network,
(Ac) using probe means to acquire a physical value relating to the state of functioning of the one component, and
(Ad) providing a series of samples of this physical value within the chosen time interval;
(B) storing in a functional models memory component expressions relating to physical values concerning at least one particular kind of component;
(C) storing in a values memory several sample series of physical values corresponding to the same time interval but relating to different components of said network; and
(D) estimating the physical values over said time interval, taking into account the component expressions contained in said functional models memory and the acquired samples and their storage in the values memory, as well as tests on the values contained in the values memory,
wherein said functional models memory further contains law-expressions representing general relationships between physical values, and the method further comprises the steps of:
(E) storing at least some of said acquired samples in said functional models memory with precision brackets;
(F) providing the expression stored in said functional models memory, at least in part, with uncertainty brackets;
(G) storing any estimation in said functional models memory with its estimated uncertainty bracket deriving from at least some of said uncertainty brackets and said precision brackets; and
(H) when said functional models memory contains, for at least some of the sampling instants, a first bracket and a second bracket of different origins for the same physical value established on the basis of the contribution of a primary set of components, comparing these two brackets, and deducing therefrom first information regarding the functioning of the components of this primary set.

* * * * *

UNITED STATES PATENT AND TRADEMARK OFFICE
CERTIFICATE OF CORRECTION

PATENT NO. : 5,182,717

DATED : January 26, 1993

INVENTOR(S) : Pierre Luciani; Philippe Deves; Patrick Tallibert

It is certified that error appears in the above-identified patent and that said Letters Patent is hereby corrected as shown below:

Column 4, line 64, after "well" insert -- as --.

Column 7, line 5, after "symbol" insert -- $\infty$ --.
Column 7, line 32, change "volts" to -- volt --.
Column 7, line 34, change "$[-10^{-4}A, + \infty[$" to
    -- $[-10^{-4}A, + \infty]$ --.

Column 12, line 16, before "electronic" change "a" to
    -- an --.
Column 12, line 50, before "electronic" change "a" to
    -- an --.
Column 12, line 66, after "17" insert a period.

Column 13, lines 10-12, delete the space between lines 10 and 12.

Column 14, line 27, change "$[-10^{-4}A, + \infty[$" to
    -- $[-10^{-4}A, + \infty]$ --.

Column 16, line 4, after "current" delete the opening parentheses.

Column 18, line 29, after "means" insert -- to --.

Column 19, line 1, before "the components" insert -- as --.

Column 22, line 8, change "MODCI and MODRI" to -- MODC1 and MODR1 --.
Column 22, line 21, change "AQ" to -- AO --.

UNITED STATES PATENT AND TRADEMARK OFFICE
CERTIFICATE OF CORRECTION

Figure 30:
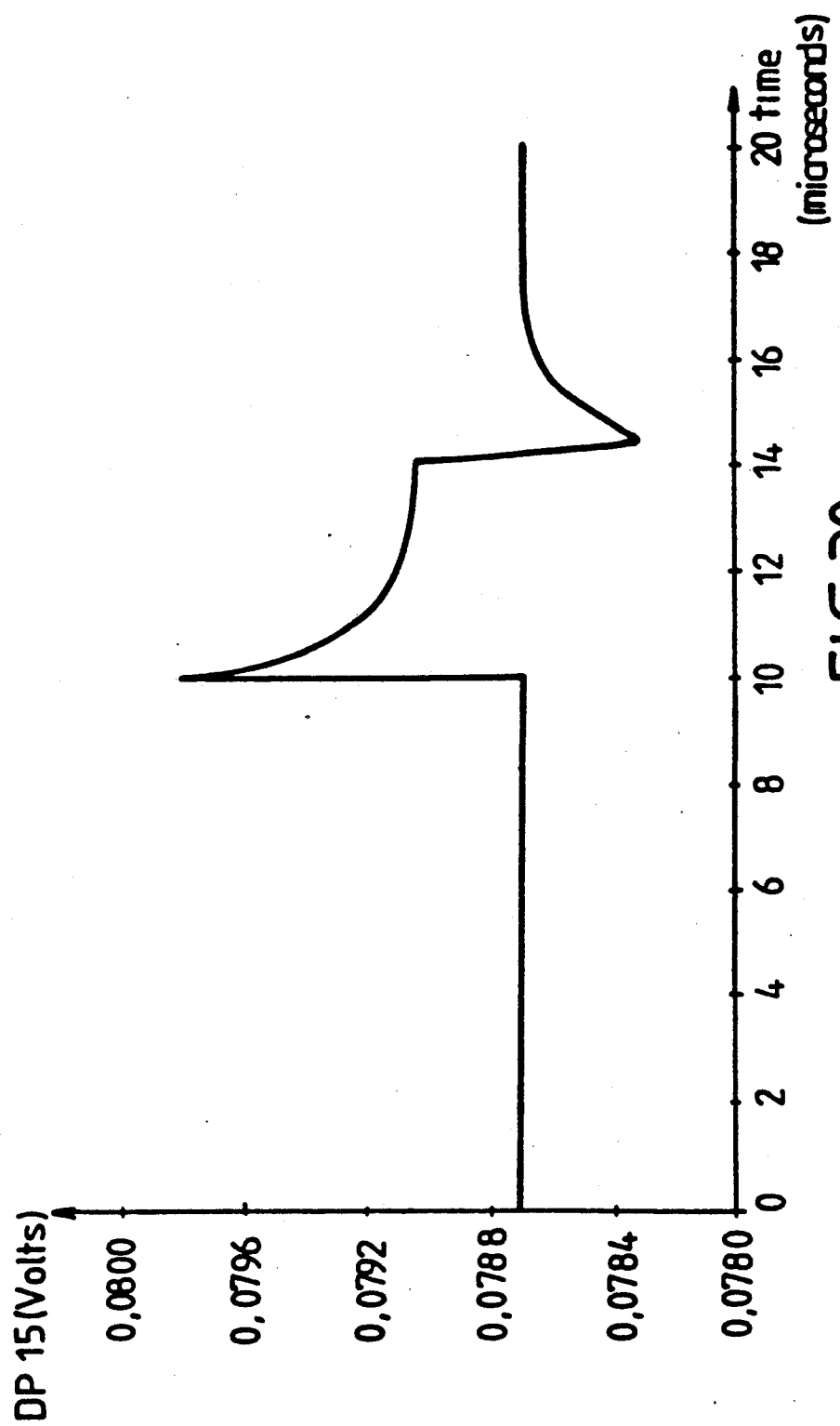
Figure 31:
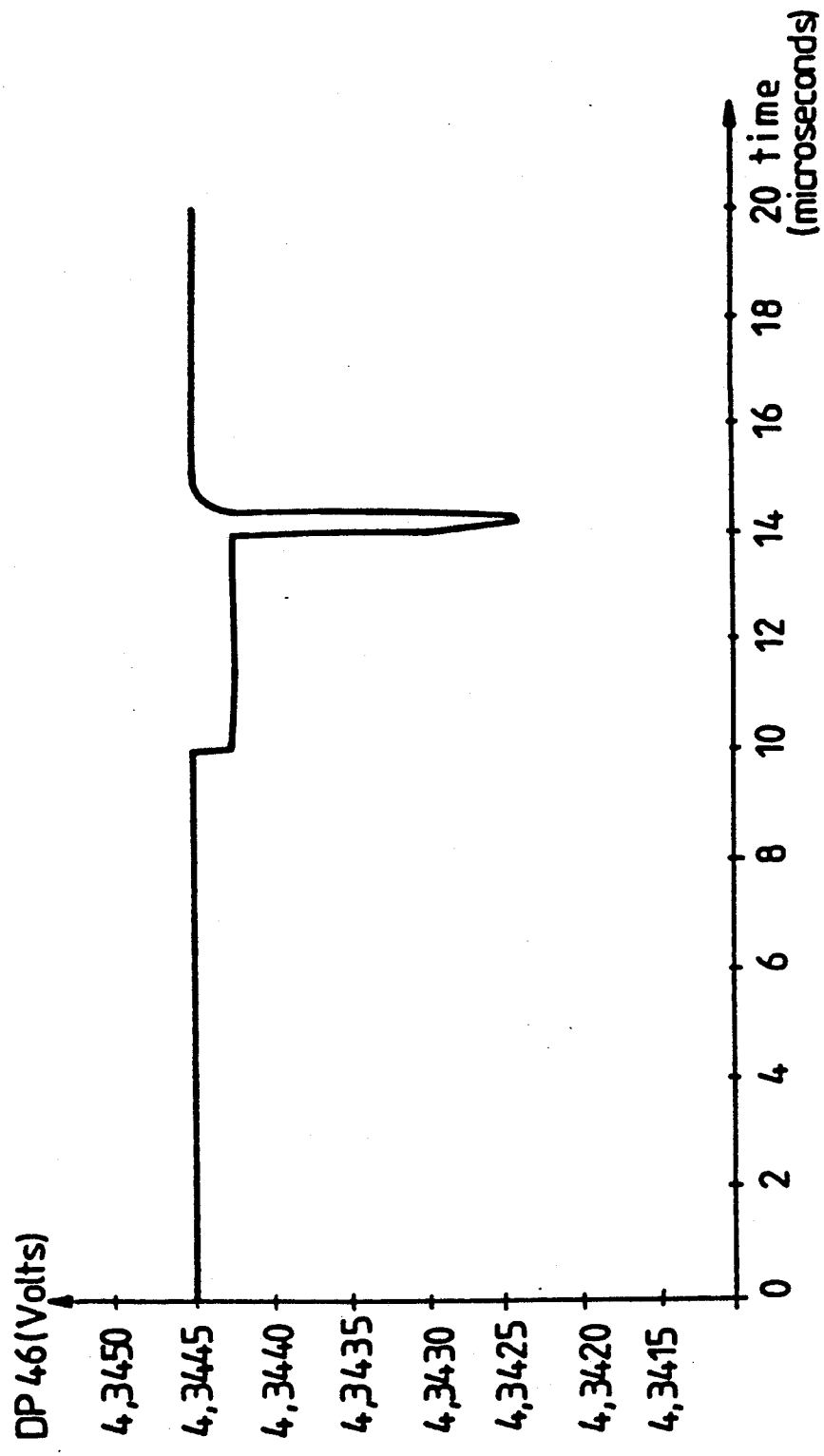

PATENT NO. : 5,182,717
DATED : January 26, 1993
INVENTOR(S) : Pierre Luciani; Philippe Deves; Patrick Tallibert It is certified that error appears in the above-identified patent and that said Letters Patent is hereby corrected as shown below:

```
Column 22, line 49, change "FIG. 30))" to -- FIG. 30) --.
Column 22, line 64, change "MODRI" to -- MODR1 --.

Column 23, line 7, change "round" to -- around --.
```

In the Claims

```
Column 28, line 8, change "claims" to -- claim --.

Column 29, line 45, change "claim 23" to -- claim 25 --.
Column 29, line 61, before "current" insert -- of --.
```

Signed and Sealed this

First Day of March, 1994

Attest:

BRUCE LEHMAN

Attesting Officer  Commissioner of Patents and Trademarks